United States Patent
Hirano et al.

(10) Patent No.: US 8,329,378 B2
(45) Date of Patent: *Dec. 11, 2012

(54) POSITIVE RESIST COMPOSITION, METHOD OF FORMING RESIST PATTERN, AND POLYMERIC COMPOUND

(75) Inventors: Tomoyuki Hirano, Kawasaki (JP); Tasuku Matsumiya, Kawasaki (JP); Daiju Shiono, Kawasaki (JP); Takahiro Dazai, Kawasaki (JP)

(73) Assignee: Tokyo Ohka Kogyo Co., Ltd., Kawasaki-shi (JP)

(*) Notice: Subject to any disclaimer, the term of this patent is extended or adjusted under 35 U.S.C. 154(b) by 291 days.

This patent is subject to a terminal disclaimer.

(21) Appl. No.: 12/721,240

(22) Filed: Mar. 10, 2010

(65) Prior Publication Data

US 2010/0233625 A1   Sep. 16, 2010

(30) Foreign Application Priority Data

Mar. 10, 2009  (JP) ................. 2009-056809

(51) Int. Cl.
  G03F 7/004  (2006.01)
  G03F 7/30  (2006.01)
(52) U.S. Cl. ............ 430/270.1; 430/326; 430/905; 430/910; 526/257
(58) Field of Classification Search .......... 430/270.1, 430/326, 905, 910; 526/257
See application file for complete search history.

(56) References Cited

U.S. PATENT DOCUMENTS

| | | | |
|---|---|---|---|
| 4,458,001 A | 7/1984 | Taylor | |
| 5,945,517 A | 8/1999 | Nitta et al. | |
| 6,153,733 A | 11/2000 | Yukawa et al. | |
| 6,753,125 B2 | 6/2004 | Choi et al. | |
| 7,074,543 B2 | 7/2006 | Iwai et al. | |
| 7,078,562 B2 | 7/2006 | Furukawa et al. | |
| 2002/0012874 A1 | 1/2002 | Namba | |
| 2003/0031950 A1 | 2/2003 | Uenishi et al. | |
| 2003/0203309 A1 | 10/2003 | Nishimura et al. | |
| 2007/0149702 A1 | 6/2007 | Ando et al. | |
| 2008/0096128 A1* | 4/2008 | Takeda et al. | 430/270.1 |
| 2008/0199806 A1* | 8/2008 | Hatakeyama et al. | 430/270.1 |
| 2009/0226842 A1 | 9/2009 | Shimizu et al. | |
| 2010/0062364 A1* | 3/2010 | Dazai et al. | 430/270.1 |
| 2010/0062369 A1* | 3/2010 | Dazai et al. | 430/285.1 |
| 2010/0086873 A1 | 4/2010 | Seshimo et al. | |
| 2010/0136480 A1 | 6/2010 | Motoike et al. | |
| 2010/0178609 A1 | 7/2010 | Dazai et al. | |
| 2010/0183981 A1 | 7/2010 | Matsumiya et al. | |
| 2010/0196821 A1 | 8/2010 | Dazai et al. | |
| 2010/0209848 A1 | 8/2010 | Dazai et al. | |
| 2010/0233623 A1 | 9/2010 | Kurosawa et al. | |
| 2010/0233626 A1 | 9/2010 | Shimizu et al. | |
| 2010/0323296 A1 | 12/2010 | Ichikawa et al. | |
| 2011/0236824 A1 | 9/2011 | Hirano et al. | |

FOREIGN PATENT DOCUMENTS

| | | |
|---|---|---|
| EP | 1331216 A1 | 10/2001 |
| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| JP | 2002-88124 | 3/2002 |
| JP | 2002-107933 | 4/2002 |
| JP | 2003-241385 | 8/2003 |
| JP | A-2003-337419 | 11/2003 |
| JP | 2005-037888 | 2/2005 |
| JP | A-2006-016379 | 1/2006 |
| JP | 2002-276458 | 10/2006 |
| JP | 2006-276458 | 10/2006 |
| JP | A-2007-031355 | 2/2007 |
| JP | 2007-146142 | 6/2007 |
| KR | 10-2002-0077275 A | 10/2002 |
| KR | 10-2007-0069068 | 7/2007 |
| WO | WO 2004/074242 | 9/2004 |

OTHER PUBLICATIONS

Office Action issued in U.S. Appl. No. 12/717,870 on Sep. 14, 2011.
Office Action issued in U.S. Appl. No. 12/717,870 on Jan. 26, 2012.
Notice of Allowance issued in Korean Patent Application No. 10-2009-0076759 on Mar. 29, 2011.
Office Action issued in U.S. Appl. No. 12/461,687 on Sep. 12, 2011.
Office Action issued in U.S. Appl. No. 12/461,688 on Sep. 12, 2011.
Notice of Allowance issued in U.S. Appl. No. 12/461,687 on Jan. 25, 2012.
Notice of Allowance issued in U.S. Appl. No. 12/461,688 on Jan. 25, 2012.
Notice of Allowance issued in Taiwanese Patent Application No. 098128212 mailed Sep. 11, 2012.

* cited by examiner

*Primary Examiner* — John Chu
(74) *Attorney, Agent, or Firm* — Knobbe Martens Olson & Bear LLP

(57) ABSTRACT

A positive resist composition including a base component (A) which exhibits increased solubility in an alkali developing solution under the action of acid, and an acid-generator component (B) which generates acid upon exposure, the base component (A) including a polymeric compound (A1) containing a structural unit (a0) having an aromatic group, a structural unit (a5) represented by general formula (a5-1) shown below, and a structural unit (a1) containing an acid-dissociable, dissolution-inhibiting group. In the formula (a5-1), $R^1$ represents a hydrogen atom, an alkyl group of 1 to 5 carbon atoms or a halogenated alkyl group of 1 to 5 carbon atoms, $R^2$ represents a divalent linking group, and $R^3$ represents a cyclic group containing —$SO_2$— within the ring skeleton thereof.

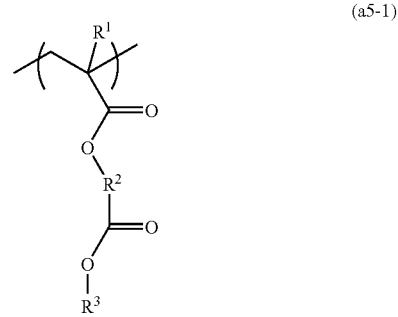

(a5-1)

12 Claims, No Drawings

POSITIVE RESIST COMPOSITION, METHOD OF FORMING RESIST PATTERN, AND POLYMERIC COMPOUND

TECHNICAL FIELD

The present invention relates to a novel polymeric compound which can be used as a base component for a positive resist composition, a positive resist composition containing the polymeric compound, and a method of forming a resist pattern using the positive resist composition.

Priority is claimed on Japanese Patent Application No. 2009-56809, filed Mar. 10, 2009, the content of which is incorporated herein by reference.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter than these excimer lasers, such as $F_2$ excimer lasers, electron beam, extreme ultraviolet radiation (EUV), and X-ray.

Resist materials for use with these types of exposure light sources require lithography properties such as a high resolution capable of reproducing patterns of minute dimensions, and a high level of sensitivity to these types of exposure light sources.

As a resist material that satisfies these conditions, a chemically amplified composition is used, which includes a base material component that exhibits a changed solubility in an alkali developing solution under the action of acid and an acid generator that generates acid upon exposure.

For example, a chemically amplified positive resist typically contains a resin component (base resin) which exhibits increased solubility in an alkali developing solution under the action of acid, and an acid generator. If the resist film formed using the resist composition is selectively exposed during formation of a resist pattern, then within the exposed portions, acid is generated from the acid generator, and the action of this acid causes an increase in the solubility of the resin component in an alkali developing solution, making the exposed portions soluble in the alkali developing solution.

Currently, resins that contain structural units derived from (meth)acrylate esters within the main chain (acrylic resins) are widely used as the base resins for resists that use ArF excimer laser lithography, as they exhibit excellent transparency in the vicinity of 193 nm (for example, see Patent Document 1). Here, the term "(meth)acrylic acid" is a generic term that includes either or both of acrylic acid having a hydrogen atom bonded to the α-position and methacrylic acid having a methyl group bonded to the α-position. The term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

Further, resins containing introduced aromatic groups have also been proposed as the base resins for resists (for example, see Patent Documents 2 to 5).

Furthermore, in order to improve various lithography properties, base resins having a plurality of structural units are currently widely used for chemically amplified resists. For example, in the case of a positive resist, a base resin containing a structural unit having an acid-dissociable, dissolution-inhibiting group that is dissociated by the action of acid generated from the acid generator, a structural unit having a polar group such as a hydroxyl group, and a structural unit having a lactone structure and the like is typically used. Among these structural units, a structural unit having a lactone structure is generally considered as being effective in improving the adhesion between the resist film and the substrate, and increasing the compatibility with an alkali developing solution, thereby contributing to improvements in various lithography properties.

[Patent Document 1] Japanese Unexamined Patent Application, First Publication No. 2003-241385
[Patent Document 2] Japanese Unexamined Patent Application, First Publication No. 2002-088124
[Patent Document 3] Japanese Unexamined Patent Application, First Publication No. 2002-107933
[Patent Document 4] Japanese Unexamined Patent Application, First Publication No. 2006-276458
[Patent Document 5] Japanese Unexamined Patent Application, First Publication No. 2007-146142

SUMMARY OF THE INVENTION

Problems to be Solved by the Invention

As further progress is made in lithography techniques and the application field for lithography techniques expands, the development of novel materials for use in lithography will be desirable. For example, as miniaturization of resist patterns progresses, improvement will be demanded for resist materials with respect to various lithography properties such as resolution, sensitivity and pattern shape and the like.

The present invention has been developed in light of the above circumstances, and has an object of providing a positive resist composition that exhibits excellent lithography properties and a method of forming a resist pattern that uses the positive resist composition.

Means to Solve the Problems

In order to achieve the above-mentioned object, the present invention employs the following aspects.

Specifically, a first aspect of the present invention is a positive resist composition including a base component (A) which exhibits increased solubility in an alkali developing solution under the action of acid, and an acid-generator component (B) which generates acid upon exposure, the base component (A) including a polymeric compound (A1) containing a structural unit (a0) having an aromatic group, a structural unit (a5) represented by general formula (a5-1) shown below, and a structural unit (a1) containing an acid-dissociable, dissolution-inhibiting group.

[Chemical Formula 1]

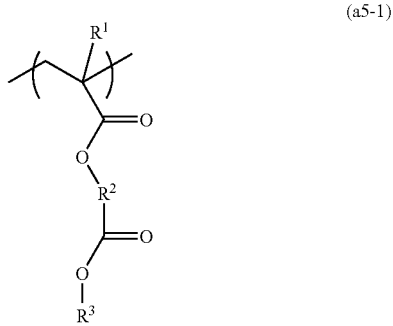

(a5-1)

In the formula, $R^1$ represents a hydrogen atom, an alkyl group of 1 to 5 carbon atoms or a halogenated alkyl group of 1 to 5 carbon atoms, $R^2$ represents a divalent linking group, and $R^3$ represents a cyclic group containing —$SO_2$— within the ring skeleton thereof.

A second aspect of the present invention is a positive resist composition according to the first aspect, wherein the structural unit (a0) having an aromatic group is a structural unit represented by general formula (a0-1) shown below.

[Chemical Formula 2]

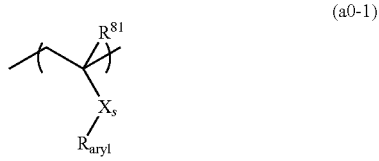

(a0-1)

In the formula, $R^{81}$ represents a hydrogen atom, an alkyl group of 1 to 5 carbon atoms or a halogenated alkyl group of 1 to 5 carbon atoms, $X_S$ represents a single bond or a divalent linking group, and $R_{aryl}$ represents an aromatic group which may have a substituent.

A third aspect of the present invention is a method of forming a resist pattern, including applying a positive resist composition according to the first aspect or the second aspect onto a substrate to form a resist film, subjecting the resist film to exposure, and subjecting the resist film to alkali developing to form a resist pattern.

A fourth aspect of the present invention is a polymeric compound including a structural unit (a0) having an aromatic group, a structural unit represented by general formula (a5-1) shown above, and a structural unit (a1) containing an acid-dissociable, dissolution-inhibiting group.

A fifth aspect of the present invention is a polymeric compound according to the fourth aspect, wherein the structural unit (a0) having an aromatic group is a structural unit represented by general formula (a0-1) shown above.

In the present description and claims, the term "aliphatic" is a relative concept used in relation to the term "aromatic", and defines a group or compound or the like that has no aromaticity.

The term "alkyl group" includes linear, branched and cyclic monovalent saturated hydrocarbon groups, unless otherwise specified. This definition also applies to the alkyl groups within an alkoxy group.

The term "alkylene group" includes linear, branched and cyclic divalent saturated hydrocarbon groups, unless otherwise specified.

A "halogenated alkyl group" is a group in which part or all of the hydrogen atoms of an alkyl group have been substituted with halogen atoms. Examples of the halogen atoms include fluorine atoms, chlorine atoms, bromine atoms and iodine atoms.

A "fluorinated alkyl group" or a "fluorinated alkylene group" is a group in which part or all of the hydrogen atoms of an alkyl group or an alkylene group have been substituted with fluorine atoms.

The term "structural unit" refers to a monomer unit that contributes to the formation of a polymeric compound (resin, polymer, copolymer).

A "structural unit derived from an acrylate ester" refers to a structural unit that is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. Examples of the substituent bonded to the carbon atom on the α-position include an alkyl group of 1 to 5 carbon atoms, a halogenated alkyl group of 1 to 5 carbon atoms and a hydroxyalkyl group. The carbon atom on the α-position of an acrylate ester refers to the carbon atom bonded to the carbonyl group, unless specified otherwise.

The term "exposure" is used as a general concept that includes irradiation with any form of radiation.

Effect of the Invention

According to the present invention, there are provided a positive resist composition that exhibits excellent lithography properties, a polymeric compound that can be used as the base component for the positive resist composition, and a method of forming a resist pattern.

EMBODIMENTS OF THE INVENTION

<<Positive Resist Composition>>

The positive resist composition of the present invention (hereafter, frequently referred to simply as "the resist composition") includes a base component (A) (hereafter, referred to as "component (A)") which exhibits increased solubility in an alkali developing solution under the action of acid, and an acid-generator component (B) (hereafter, referred to as "component (B)") which generates acid upon exposure.

In the positive resist composition, when radial rays are irradiated (when exposure is conducted), acid is generated from the component (B), and the solubility of the component (A) in an alkali developing solution is increased by the action of the generated acid. Therefore, in the formation of a resist pattern, by conducting selective exposure of a resist film formed by using the positive resist composition of the present invention, the solubility of the exposed portions of the resist film in an alkali developing solution increases, whereas the solubility of the unexposed portions in an alkali developing solution is unchanged, and hence, a resist pattern can be formed by alkali developing.

Here, the term "base component" refers to an organic compound capable of forming a film. As the base component, an organic compound having a molecular weight of 500 or more is preferably used. When the organic compound has a molecular weight of 500 or more, the film-forming ability is improved, and a nano level resist pattern can be easily formed.

The "organic compound having a molecular weight of 500 or more" which can be used as the base component is broadly classified into non-polymers and polymers.

In general, as a non-polymer, any of those compounds which have a molecular weight in the range of 500 to less than 4,000 may be used. Hereafter, a non-polymer having a molecular weight in the range of 500 to less than 4,000 is referred to as a "low molecular weight compound".

As a polymer, any of those compounds which have a molecular weight of 2,000 or more may be used. Hereafter, a polymer having a molecular weight of 2,000 or more is referred to as a "polymeric compound". In the case of a polymeric compound, the "molecular weight" is the weight average molecular weight in terms of the polystyrene equivalent value determined by gel permeation chromatography (GPC). Hereafter, a polymeric compound is frequently referred to as simply a "resin".

<Component (A)>
[Polymeric Compound (A1)]

In the present invention, the polymeric compound (A1) (hereafter, referred to as "component (A1)") includes a structural unit (a0) having an aromatic group, a structural unit represented by general formula (a5-1) shown above, and a structural unit (a1) containing an acid-dissociable, dissolution-inhibiting group. There are no particular limitations on the main chain of the structural unit (a1) containing an acid-dissociable, dissolution-inhibiting group, although structural units derived from acrylate esters containing an acid-dissociable, dissolution-inhibiting group, and structural units derived from vinyl monomers containing an acid-dissociable, dissolution-inhibiting group (but excluding the structural units derived from the above acrylate esters) are preferred.

Moreover, in the present invention, the component (A1) preferably also includes a structural unit (a2) derived from an acrylate ester containing a lactone-containing cyclic group, in addition to the structural unit (a0), the structural unit (a5) and the structural unit (a1).

Furthermore, in the present invention, the component (A1) preferably also includes a structural unit (a3) derived from an acrylate ester containing a polar group-containing aliphatic hydrocarbon group, either in addition to the structural units (a0), (a5) and (a1), or in addition to the structural units (a0), (a5), (a1) and (a2).

<Structural Unit (a5)>

In general formula (a5-1), $R^1$ represents a hydrogen atom, an alkyl group of 1 to 5 carbon atoms, or a halogenated alkyl group of 1 to 5 carbon atoms.

The alkyl group of 1 to 5 carbon atoms for $R^1$ is preferably a linear or branched alkyl group, and specific examples include a methyl group, ethyl group, propyl group, isopropyl group, n-butyl group, isobutyl group, tert-butyl group, pentyl group, isopentyl group or neopentyl group.

The halogenated lower alkyl group of 1 to 5 carbon atoms for $R^1$ is a group in which part or all of the hydrogen atoms of an aforementioned alkyl group have been substituted with halogen atoms. Examples of the halogen atoms include fluorine atoms, chlorine atoms, bromine atoms and iodine atoms, and fluorine atoms are particularly desirable.

As $R^1$, a hydrogen atom, an alkyl group of 1 to 5 carbon atoms, or a fluorinated alkyl group of 1 to 5 carbon atoms is preferable, and a hydrogen atom or a methyl group is particularly desirable in terms of industrial availability.

In general formula (a5-1), $R^2$ represents a divalent linking group.

Preferable examples of $R^2$ include a divalent hydrocarbon group which may have a substituent, and a divalent linking group containing a hetero atom.

The expression that a hydrocarbon "may have a substituent" means that part or all of the hydrogen atoms within the hydrocarbon group may be substituted with groups or atoms other than hydrogen atoms.

The hydrocarbon group may be either an aliphatic hydrocarbon group or an aromatic hydrocarbon group. An "aliphatic hydrocarbon group" refers to a hydrocarbon group that has no aromaticity.

The aliphatic hydrocarbon group may be saturated or unsaturated. In general, the aliphatic hydrocarbon group is preferably saturated.

Specific examples of the aliphatic hydrocarbon group include linear and branched aliphatic hydrocarbon groups, and aliphatic hydrocarbon groups containing a ring in the structure thereof.

The linear and branched aliphatic hydrocarbon groups preferably contain 1 to 10 carbon atoms, and more preferably 1 to 8, still more preferably 1 to 5, and most preferably 1 or 2 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, a branched alkylene group is preferable, and specific examples include alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—, alkylethylene groups such as —$CH(CH_3)CH_2$—, —$CH(CH_3)CH(CH_3)$—, —$C(CH_3)_2CH_2$—, —$CH(CH_2CH_3)CH_2$— and —$C(CH_2CH_3)_2$—$CH_2$—, alkyltrimethylene groups such as —$CH(CH_3)CH_2CH_2$— and —$CH_2CH(CH_3)CH_2$—, and alkyltetramethylene groups such as —$CH(CH_3)CH_2CH_2CH_2$— and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of the substituent include a fluorine atom, a fluorinated alkyl group of 1 to 5 carbon atoms, and an oxygen atom (=O).

Examples of the aliphatic hydrocarbon group containing a ring in the structure thereof include cyclic aliphatic hydrocarbon groups (groups in which two hydrogen atoms have been removed from an aliphatic hydrocarbon ring), and groups in which the cyclic aliphatic hydrocarbon group is bonded to the terminal of an aforementioned chain-like aliphatic hydrocarbon group or interposed within an aforementioned chain-like aliphatic hydrocarbon group.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane. As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

In the "divalent linking group containing a hetero atom", the hetero atom is an atom other than carbon and hydrogen, and examples thereof include an oxygen atom, a nitrogen atom, a sulfur atom and a halogen atom.

Specific examples of the divalent linking group containing a hetero atom include —O—, —C(=O)—, —C(=O)—O—, a carbonate bond (—O—C(=O)—O—), —NH—, —NR$^{04}$—, —NH—C(=O)—, and =N—. The above R$^{04}$ represents an alkyl group. Further, combinations of any of these "divalent linking groups containing a hetero atom" with a divalent hydrocarbon group can also be used. Examples of the divalent hydrocarbon group include the same groups as those described above for the hydrocarbon group which may have a substituent, and a linear or branched aliphatic hydrocarbon group is preferable.

R$^2$ may or may not have an acid-dissociable portion in the structure thereof. An "acid-dissociable portion" refers to a portion within the organic group that is dissociated from the organic group by the action of the acid generated upon exposure. When the R$^2$ group has an acid-dissociable portion, it preferably has an acid-dissociable portion having a tertiary carbon atom.

In the present invention, as the divalent linking group for R$^2$, an alkylene group, a divalent aliphatic cyclic group, a divalent aromatic hydrocarbon group, or a divalent linking group containing a hetero atom is preferable. Among these, an alkylene group is particularly desirable.

When R$^2$ represents an alkylene group, the alkylene group preferably has 1 to 10 carbon atoms, more preferably 1 to 6, still more preferably 1 to 4, and most preferably 1 to 3 carbon atoms. Specific examples of the alkylene group include the aforementioned linear alkylene groups and branched alkylene groups.

When R$^2$ represents a divalent aliphatic cyclic group, examples of the aliphatic cyclic group include the same groups as the cyclic aliphatic hydrocarbon groups described above for the "aliphatic hydrocarbon group containing a ring in the structure thereof".

As this aliphatic cyclic group, a group in which two or more hydrogen atoms have been removed from cyclopentane, cyclohexane, norbornane, isobornane, adamantane, tricyclodecane or tetracyclododecane is particularly desirable.

When R$^2$ represents a divalent aromatic hydrocarbon group, a group in which two or more hydrogen atoms have been removed from benzene, naphthalene or anthracene is preferable.

When R$^2$ represents a divalent linking group containing a hetero atom, preferred examples of the linking group include —O—, —C(=O)—O—, —C(=O)—, —O—C(=O)—O—, —C(=O)—NH—, —NH— (wherein H may be replaced with a substituent such as an alkyl group or acyl group or the like), —S—, —S(=O)$_2$—, —S(=O)$_2$—O—, groups represented by the formula -A-O—B—, and groups represented by the formula -[A-C(=O)—O]$_m$—B—. In these formulas, each of A and B represents a divalent hydrocarbon group which may have a substituent, and m represents an integer of 1 to 3.

When R$^2$ represents —NH—, the H may be replaced with a substituent such as an alkyl group or acyl group or the like. This substituent (the alkyl group or acyl group or the like) preferably has 1 to 10 carbon atoms, more preferably 1 to 8 carbon atoms, and most preferably 1 to 5 carbon atoms.

In a group represented by the formula -A-O—B— or the formula -[A-C(=O)—O]$_m$—B—, each of A and B represents a divalent hydrocarbon group which may have a substituent.

Examples of the divalent hydrocarbon groups for A and B which may have a substituent include the same groups as those described above for the "divalent hydrocarbon group which may have a substituent" for R$^2$.

As the group A, a linear aliphatic hydrocarbon group is preferable, a linear alkylene group is more preferable, a linear alkylene group of 1 to 5 carbon atoms is still more preferable, and a methylene group or an ethylene group is particularly desirable.

As the group B, a linear or branched aliphatic hydrocarbon group is preferable, and a methylene group, an ethylene group or an alkylmethylene group is more preferable. The alkyl group within this alkylmethylene group is preferably a linear alkyl group of 1 to 5 carbon atoms, more preferably a linear alkyl group of 1 to 3 carbon atoms, and most preferably a methyl group.

Further, in the group represented by the formula -[A-C(=O)—O]$_m$—B—, m represents an integer of 1 to 3, preferably an integer of 1 to 2, and most preferably 1.

In general formula (a5-1), R$^3$ represents a cyclic group containing —SO$_2$— within the ring skeleton thereof. Specifically, R$^3$ is a cyclic group in which the sulfur atom (S) in the —SO$_2$— group forms a part of the ring skeleton of the cyclic group.

The cyclic group for R$^3$ refers to a cyclic group including a ring that contains —SO$_2$— within the ring skeleton thereof, and this ring is counted as the first ring. A cyclic group in which this ring that contains —SO$_2$— is the only ring structure is referred to as a monocyclic group, and a group containing other ring structures is described as a polycyclic group regardless of the structure of the other rings. The cyclic group for R$^3$ may be either a monocyclic group or a polycyclic group.

From the viewpoint of enhancing the adhesion to a substrate of a resist film containing the component (A1), it is particularly desirable that R$^3$ is a cyclic group containing —O—SO$_2$— within the ring skeleton thereof, namely, a cyclic group having a sultone ring in which the —O—S— within the —O—SO$_2$— forms a part of the ring skeleton of the cyclic group.

The cyclic group for R$^3$ preferably has 3 to 30 carbon atoms, more preferably 4 to 20, still more preferably 4 to 15, and most preferably 4 to 12 carbon atoms. Here, the number of carbon atoms refers to the number of carbon atoms that constitute the ring skeleton, and excludes the number of carbon atoms within substituents.

The cyclic group for R$^3$ may be either an aliphatic cyclic group or an aromatic cyclic group. An aliphatic cyclic group is preferable.

Examples of the aliphatic cyclic group for R$^3$ include the aforementioned cyclic aliphatic hydrocarbon groups in which a portion of the carbon atoms constituting the ring skeleton thereof have been substituted with —SO$_2$— or —O—SO$_2$—.

More specifically, examples of the monocyclic groups include groups in which one hydrogen atom has been removed from a monocycloalkane in which a —CH$_2$— group constituting the ring skeleton of the monocycloalkane has been substituted with —SO$_2$—, and groups in which one hydrogen atom has been removed from a monocycloalkane in which a —CH$_2$—CH$_2$— group constituting the ring skeleton thereof has been substituted with —O—SO$_2$—. Examples of the polycyclic groups include groups in which one hydrogen atom has been removed from a polycycloalkane (such as a bicycloalkane, a tricycloalkane or a tetracycloalkane or the like) in which a —CH$_2$— group constituting the ring skeleton of the polycycloalkane has been substituted with —SO$_2$—, and groups in which one hydrogen atom has been removed from a polycycloalkane in which a —CH$_2$—CH$_2$— group constituting the ring skeleton thereof has been substituted with —O—SO$_2$—.

The cyclic group for R$^3$ may have a substituent. Examples of this substituent include an alkyl group, an alkoxy group, a halogen atom, a halogenated alkyl group, a hydroxyl group, an oxygen atom (=O), —COOR", —OC(=O)R", a hydroxyalkyl group, and a cyano group.

The alkyl group for this substituent is preferably an alkyl group of 1 to 6 carbon atoms. Further, this alkyl group is preferably a linear or branched alkyl group. Specific examples include a methyl group, ethyl group, propyl group, isopropyl group, n-butyl group, isobutyl group, tert-butyl group, pentyl group, isopentyl group, neopentyl group and hexyl group. Among these, a methyl group or ethyl group is preferable, and a methyl group is particularly desirable.

As the alkoxy group for this substituent, an alkoxy group of 1 to 6 carbon atoms is preferable. Further, the alkoxy group is preferably a linear or branched alkyl group. Specific examples of the alkoxy group include groups in which an aforementioned alkyl group substituent has an oxygen atom (—O—) bonded thereto.

Examples of the halogen atom for this substituent include a fluorine atom, chlorine atom, bromine atom and iodine atom, and a fluorine atom is preferable.

Examples of the halogenated alkyl group for this substituent include groups in which part or all of the hydrogen atoms within an aforementioned alkyl group have been substituted with the aforementioned halogen atoms.

Examples of the halogenated alkyl group for this substituent include groups in which part or all of the hydrogen atoms within an aforementioned alkyl group for this substituent have been substituted with the aforementioned halogen atoms. As this halogenated alkyl group, a fluorinated alkyl group is preferable, and a perfluoroalkyl group is particularly desirable.

In the —COOR" group and the —OC(=O)R" group, R" represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group, it preferably contains 3 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

The hydroxyalkyl group for this substituent preferably has 1 to 6 carbon atoms, and specific examples thereof include the aforementioned alkyl group substituents in which at least one hydrogen atom of the alkyl group has been substituted with a hydroxyl group.

More specific examples of R$^3$ include groups represented by general formulas (5-1) to (5-4) shown below.

[Chemical Formula 3]

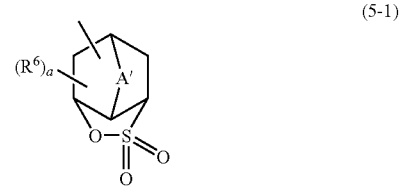

(5-1)

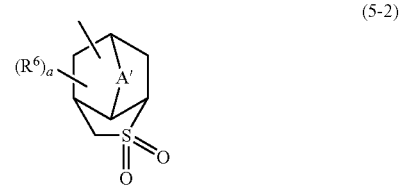

(5-2)

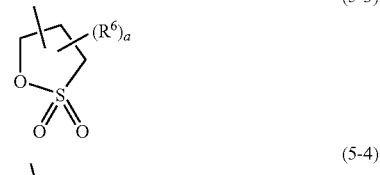

(5-3)

(5-4)

In the formulas, A' represents an oxygen atom, a sulfur atom, or an alkylene group of 1 to 5 carbon atoms which may contain an oxygen atom or a sulfur atom, a represents an integer of 0 to 2, and R$^6$ represents an alkyl group, an alkoxy group, a halogenated alkyl group, a hydroxyl group, —COOR", —OC(=O)R", a hydroxyalkyl group or a cyano group, wherein R" represents a hydrogen atom or an alkyl group.

In the above general formulas (5-1) to (5-4), A' represents an oxygen atom, a sulfur atom, or an alkylene group of 1 to 5 carbon atoms which may contain an oxygen atom (—O—) or a sulfur atom (—S—).

As the alkylene group of 1 to 5 carbon atoms for A', a linear or branched alkylene group is preferable, and examples thereof include a methylene group, ethylene group, n-propylene group and isopropylene group.

Examples of alkylene groups that contain an oxygen atom or a sulfur atom include the aforementioned alkylene groups in which —O— or —S— is bonded to the terminal of the alkylene group or interposed between carbon atoms within the alkylene group. Specific examples of such alkylene groups include —O—CH$_2$—, —CH$_2$—O—CH$_2$—, —S—CH$_2$—, and —CH$_2$—S—CH$_2$—.

As A', an alkylene group of 1 to 5 carbon atoms or —O— is preferable, an alkylene group of 1 to 5 carbon atoms is more preferable, and a methylene group is the most desirable.

a represents an integer of 0 to 2, and is most preferably 0. When a is 2, the plurality of R$^6$ groups may be the same or different from each other.

As the alkyl group, alkoxy group, halogenated alkyl group, —COOR" group, —OC(=O)R" group, or hydroxyalkyl group for R$^6$, the same alkyl groups, alkoxy groups, halogenated alkyl groups, —COOR" groups, —OC(=O)R" groups and hydroxyalkyl groups as those described above for the substituent with which the cyclic group for R³ may be substituted can be used.
Specific examples of the cyclic groups represented by general formulas (5-1) to (5-4) are shown below. In the formulas shown below, "Ac" represents an acetyl group.
[Chemical Formula 4]
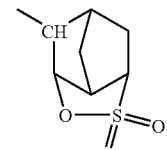
(5-1-1)
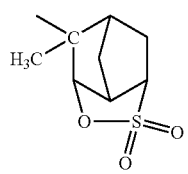
(5-1-2)
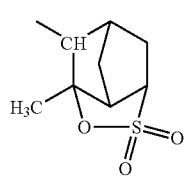
(5-1-3)
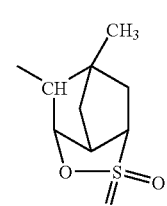
(5-1-4)
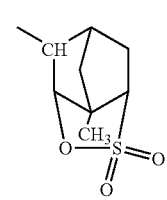
(5-1-5)
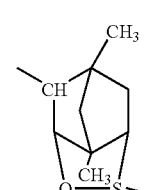
(5-1-6)
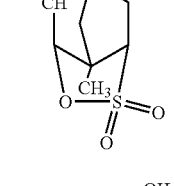
(5-1-7)
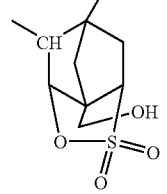
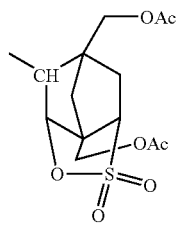
(5-1-8)
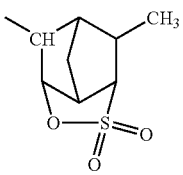
(5-1-9)
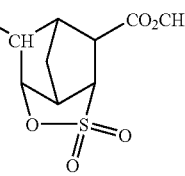
(5-1-10)
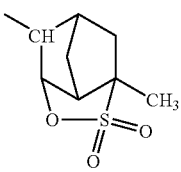
(5-1-11)
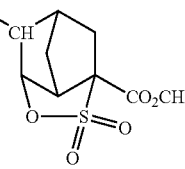
(5-1-12)
[Chemical Formula 5]
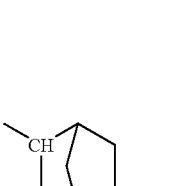
(5-1-13)
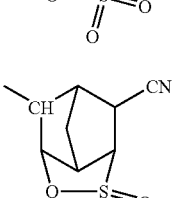
(5-1-14)
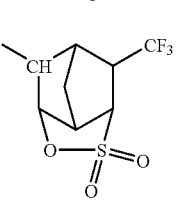
(5-1-15)

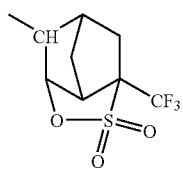
(5-1-16)
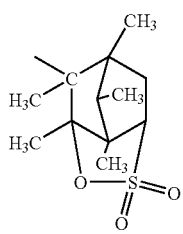
(5-1-17)
[Chemical Formula 6]
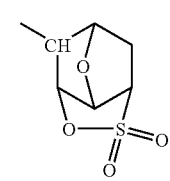
(5-1-18)
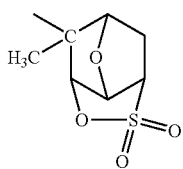
(5-1-19)
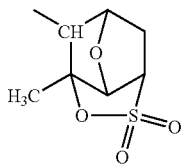
(5-1-20)
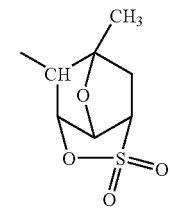
(5-1-21)
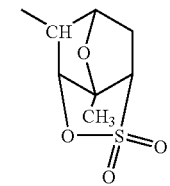
(5-1-22)
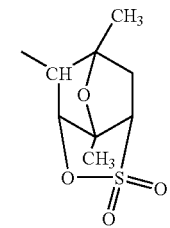
(5-1-23)
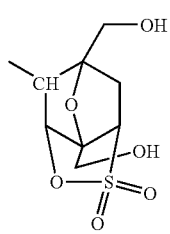
(5-1-24)
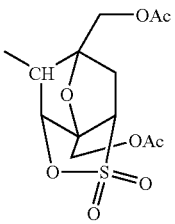
(5-1-25)
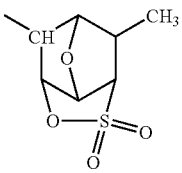
(5-1-26)
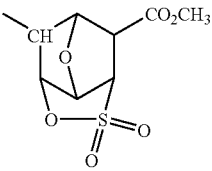
(5-1-27)
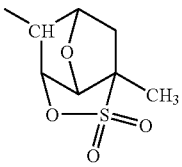
(5-1-28)
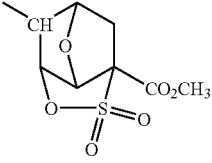
(5-1-29)
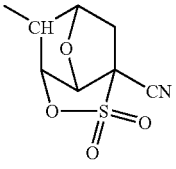
(5-1-30)
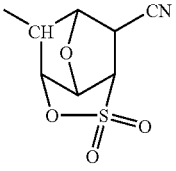
(5-1-31)

(5-1-32)

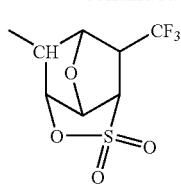

(5-1-33)

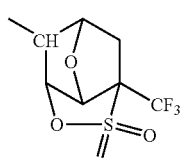

[Chemical Formula 7]

(5-2-1)

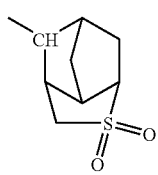

(5-2-2)

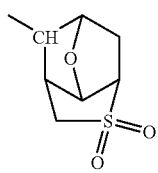

(5-3-1)

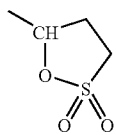

(5-4-1)

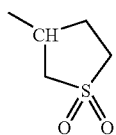

As $R^3$, of the groups shown above, a group represented by general formula (5-1) is preferable, at least one member selected from the group consisting of groups represented by chemical formulas (5-1-1), (5-1-18), (5-3-1) and (5-4-1) is more preferable, and a group represented by chemical formula (5-1-1) is the most desirable.

In the present invention, as the structural unit (a5), a structural unit represented by general formula (a5-1-01) shown below is particularly desirable.

[Chemical Formula 8]

(a5-1-01)

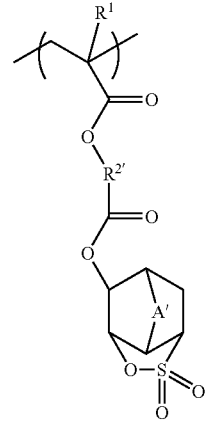

In this formula, $R^1$ is the same as defined above, $R^{2\prime}$ represents a linear or branched alkylene group, and A' is the same as defined above.

The linear or branched alkylene group for $R^{2\prime}$ preferably has 1 to 10 carbon atoms, more preferably 1 to 8, still more preferably 1 to 5, still more preferably 1 to 3, and most preferably 1 or 2 carbon atoms.

A' is preferably a methylene group, an oxygen atom (—O—) or a sulfur atom (—S—).

As the structural unit (a5), one type of structural unit may be used alone, or two or more types of structural units may be used in combination.

In terms of achieving excellent properties in terms of the shape of the formed resist pattern, the line width roughness (LWR), the adhesion to the substrate, the etching resistance, and the resolution and the like upon formation of a resist pattern using a positive resist composition containing the component (A1), the amount of the structural unit (a5) within the component (A1), based on the combined total of all the structural units that constitute the component (A1), is preferably at least 3 mol %, more preferably within a range from 3 to 50 mol %, still more preferably from 5 to 45 mol %, and most preferably from 10 to 40 mol %.

<Structural Unit (a0)>

There are no particular limitations on the structural unit (a0), provided that it contains an aromatic group within the structural unit. The aromatic group may exist within the main chain or within a side chain.

The structural unit (a0) may have either a single aromatic group or two or more aromatic groups within the structural unit.

The aromatic group within the structural unit (a0) is a hydrocarbon group having an aromatic ring. The aromatic group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Here, the number of carbon atoms within a substituent(s) is not included in the number of carbon atoms of the aromatic group.

Specific examples of the aromatic group include a phenyl group, biphenyl group, fluorenyl group, naphthyl group, anthryl group or phenanthryl group.

The aromatic group may have a substituent. For example, a portion of the carbon atoms constituting the aromatic ring within the aromatic group may be substituted with a hetero atom, or a hydrogen atom bonded to the aromatic ring within the aromatic group may be substituted with a substituent.

Examples of the former include heteroaryl groups in which a portion of the carbon atoms constituting the ring within an aforementioned aryl group have been substituted with a hetero atom such as an oxygen atom, a sulfur atom or a nitrogen atom, and heteroarylalkyl groups in which a portion of the carbon atoms constituting the aromatic ring within an aforementioned arylalkyl group have been substituted with an aforementioned hetero atom.

In the latter example, examples of the substituent for the aromatic group include an alkyl group, an alkoxy group, a halogen atom, a halogenated alkyl group, a hydroxyl group, an oxygen atom (=O), —COOR", —OC(=O)R", a hydroxyalkyl group or a cyano group or the like.

The alkyl group for the substituent is preferably an alkyl group of 1 to 6 carbon atoms. Further, the alkyl group is preferably a linear alkyl group or a branched alkyl group. Specific examples include a methyl group, ethyl group, propyl group, isopropyl group, n-butyl group, isobutyl group, tert-butyl group, pentyl group, isopentyl group, neopentyl group and hexyl group. Among these, a methyl group or ethyl group is preferable, and a methyl group is particularly desirable.

As the alkoxy group for the substituent, an alkoxy group of 1 to 6 carbon atoms is preferable. Further, the alkoxy group is preferably a linear alkoxy group or a branched alkyl group. Specific examples of the alkoxy groups include groups in which an aforementioned alkyl group substituent has an oxygen atom (—O—) bonded thereto.

Examples of halogen atoms for the substituent include a fluorine atom, a chlorine atom, a bromine atom and an iodine atom.

Examples of halogenated alkyl groups for the substituent include groups in which part or all of the hydrogen atoms within an aforementioned alkyl group have been substituted with the aforementioned halogen atoms.

Examples of the halogenated alkyl group for the substituent include groups in which part or all of the hydrogen atoms of an aforementioned alkyl group for the substituent have been substituted with the aforementioned halogen atoms.

In the —COOR" group and the —OC(=O)R" group, R" represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. Examples of the cycloalkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

The hydroxyalkyl group for the substituent preferably has 1 to 6 carbon atoms, and specific examples thereof include the aforementioned alkyl groups for the substituent in which at least one hydrogen atom has been substituted with a hydroxyl group.

Further, the aromatic group may be bonded directly to the main chain of the polymeric compound (A1), or may be bonded to the main chain via a divalent linking group. Examples of the divalent linking group include the same divalent linking groups as those exemplified above in relation to $R^2$.

More specifically, the structural unit (a0) is preferably a structural unit represented by general formulas (a0-1) shown below.

[Chemical Formula 9]

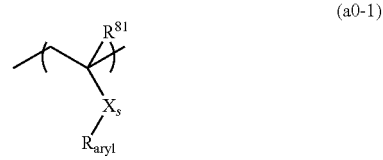

(a0-1)

In the formula, $R^{81}$ represents a hydrogen atom, an alkyl group of 1 to 5 carbon atoms or a halogenated alkyl group of 1 to 5 carbon atoms, $X_S$ represents a single bond or a divalent linking group, and $R_{aryl}$ represents an aromatic group which may have a substituent.

The alkyl group of 1 to 5 carbon atoms for $R^{81}$ is preferably a linear or branched alkyl group, and specific examples include a methyl group, ethyl group, propyl group, isopropyl group, n-butyl group, isobutyl group, tert-butyl group, pentyl group, isopentyl group or neopentyl group.

The halogenated alkyl group of 1 to 5 carbon atoms for $R^{81}$ is preferably a group in which part or all of the hydrogen atoms of an alkyl group of 1 to 5 carbon atoms have been substituted with halogen atoms. Examples of the halogen atoms include a fluorine atom, chlorine atom, bromine atom or iodine atom. A fluorine atom is preferred.

$R^{81}$ is preferably a hydrogen atom, an alkyl group of 1 to 5 carbon atoms, or a fluorinated alkyl group of 1 to 5 carbon atoms, and from the viewpoint of industrial availability, is most preferably a hydrogen atom or a methyl group.

Examples of the divalent linking group for $X_S$ include the same divalent linking groups as those exemplified above for $R^2$. Of these groups, divalent linking groups containing a hetero atom are preferred, —O—, —C(=O)—O—, —C(=O)—, —O—C(=O)—O—, —C(=O)—NH—, —NH— (wherein H may be replaced with a substituent such as an alkyl group or acyl group or the like), groups represented by the formula -A-O—B—, and groups represented by the formula —[A"—C(=O)—O]$_m$—B"— are more preferable, and groups represented by the formula —[A"—C(=O)—O]$_m$—B"— are the most desirable. In the above formulas, A, B and m are the same as defined above, and each of A" and B" is either a single bond or a divalent hydrocarbon group which may have a substituent.

Examples of the divalent hydrocarbon group which may have a substituent for A" and B" include the same groups as those listed above as the "divalent hydrocarbon group which may have a substituent" for $R^2$.

A" is preferably a single bond or a linear alkylene group, is more preferably a single bond or a linear alkylene group of 1 to 5 carbon atoms, and is most preferably a single bond, a methylene group or an ethylene group.

B" is preferably a single bond or a linear alkylene group, is more preferably a linear alkylene group of 1 to 5 carbon atoms, and is most preferably a methylene group or an ethylene group.

Further, in the group represented by the formula —[A"—C(=O)—O]$_m$—B"—, m represents an integer of 1 to 3, is preferably an integer of 1 or 2, and is most preferably 1.

Examples of the aromatic group for $R_{aryl}$ which may have a substituent include the same aromatic groups as those listed above for the "aromatic group within the structural unit (a0)". Of these groups, a phenyl group and a naphthyl group are particularly desirable as they enable synthesis of the structural unit to be conducted cheaply, and yield improvements in the lithography properties (such as the heat resistance, suppression of pattern collapse, the sensitivity, and the resist pattern shape) of a resist film formed using a positive resist composition that contains the polymeric compound (A1).

Examples of the substituent which may exist on the aromatic group of $R_{aryl}$ include the same substituents as those described above for the substituent of the aromatic group within the structural unit (a0). Of these substituents, an alkyl group, alkoxy group, hydroxyl group, oxygen atom (=O), —COOR", —OC(=O)R" or hydroxyalkyl group is preferable, an alkoxy group, hydroxyl group, —OC(=O)R" or hydroxyalkyl group of 1 to 5 carbon atoms is more preferable, a hydroxyl group or —OC(=O)R" is still more preferable, and in terms of improving various lithography properties such as the developing rate, the heat resistance, the adhesion to the substrate and the sensitivity of a resist film formed using a positive resist composition containing the polymeric compound (A1), —OC(=O)CH$_3$ or —OC(=O)CH$_2$CH$_3$ is particularly desirable.

Examples of the structural unit represented by the above general formula (a0-1) include structural units represented by general formula (a0-1-0) shown below, and structural units of the general formula (a0-1-0) shown below in which $n_8$=1 and the hydroxyl group has been substituted with an acetoxy group.

[Chemical Formula 10]

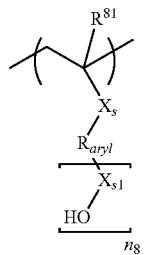

(a0-1-0)

In the formula, $R^{81}$ represents a hydrogen atom, an alkyl group of 1 to 5 carbon atoms or a halogenated alkyl group of 1 to 5 carbon atoms, $X_S$ represents a single bond or a divalent linking group, $X_{S1}$ represents a single bond or a divalent linking group, $R_{aryl}$ represents an aromatic group which may have a substituent, and $n_8$ represents an integer of 0 to 3.

$X_S$ is the same as defined above.

$X_{S1}$ is as defined above, and is preferably a carbonyl group or an alkylene group of 1 to 4 carbon atoms. $n_8$ is preferably an integer of 0 to 2, and is most preferably 0 or 1.

Specific examples of the structural unit (a0-1) include structural units derived from styrene, α-methylstyrene, 4-hydroxystyrene, 4-carboxystyrene, 4-acetoxystyrene, 4-methoxystyrene, phenyl (meth)acrylate, 4-hydroxyphenyl (meth)acrylate, 1-vinylnaphthalene, 2-vinylnaphthalene, acenaphthylene, 1-naphthyl (meth)acrylate, 2-naphthyl (meth)acrylate, 1-naphthylmethyl (meth)acrylate, 1-anthryl (meth)acrylate, 2-anthryl (meth)acrylate, 9-anthryl (meth)acrylate, 9-anthrylmethyl (meth)acrylate and 1-vinylpyrene, and structural units (a0-1-1) to (a0-1-27) shown below.

[Chemical Formula 11]

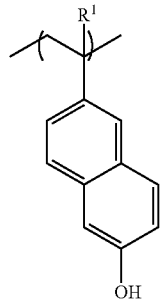

(a0-1-1)

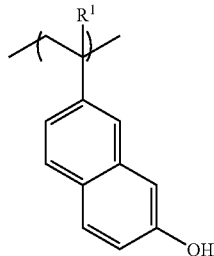

(a0-1-2)

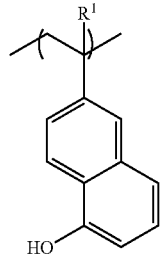

(a0-1-3)

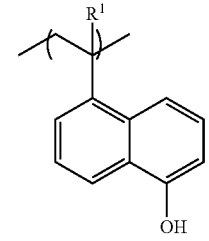

(a0-1-4)

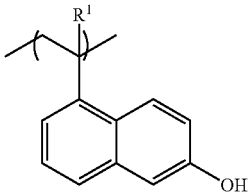

(a0-1-5)

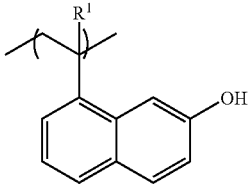

(a0-1-6)

(a0-1-7)
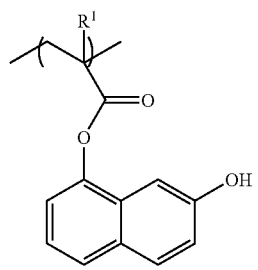
(a0-1-8)
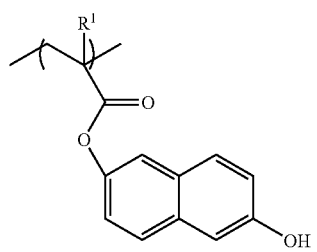
(a0-1-9)
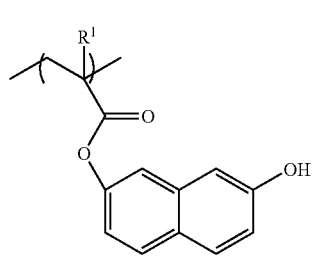
(a0-1-10)
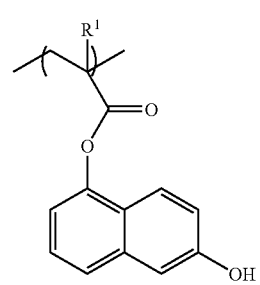
(a0-1-11)
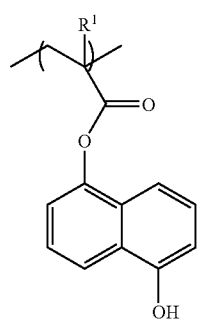
(a0-1-12)
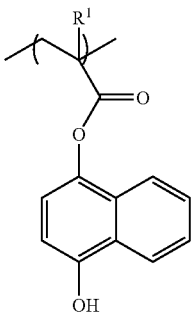
(a0-1-13)
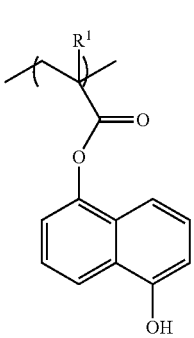
(a0-1-14)
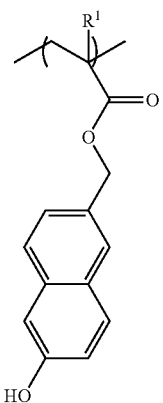
(a0-1-15)
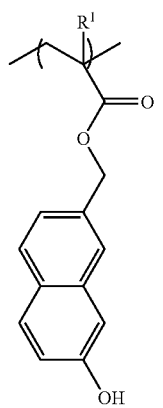

(a0-1-16)
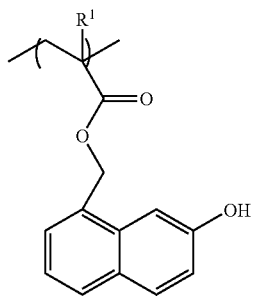
(a0-1-17)
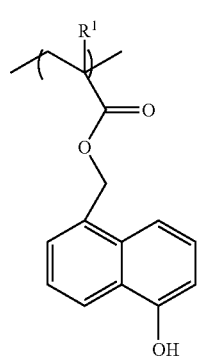
(a0-1-18)
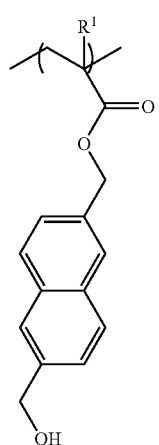
(a0-1-19)
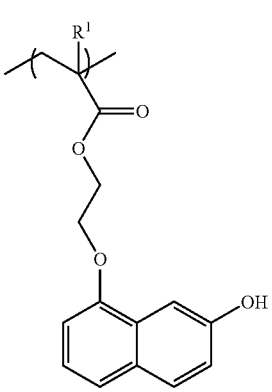
(a0-1-20)
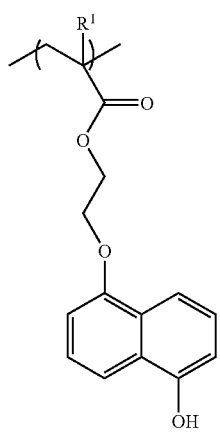
(a0-1-21)
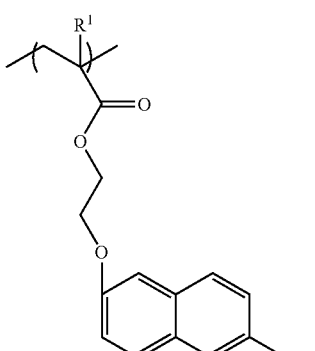
(a0-1-22)
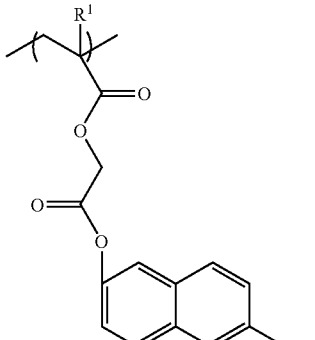
(a0-1-23)
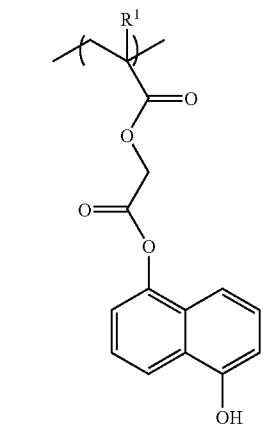

(a0-1-24)
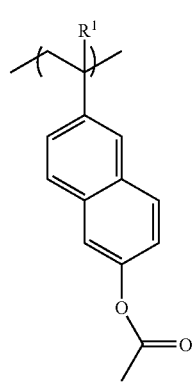

(a0-1-25)
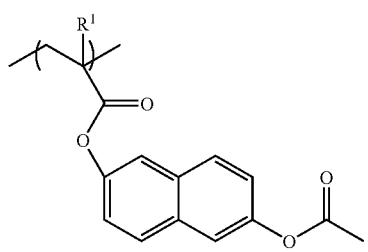

(a0-1-26)
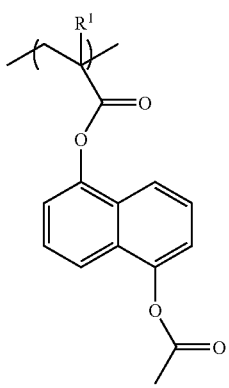

(a0-1-27)
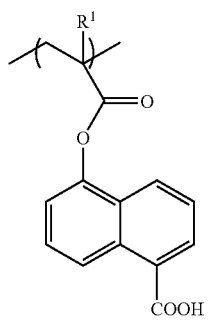

As the structural unit (a0), one type of structural unit may be used alone, or two or more types of structural units may be used in combination.

Because the structural unit (a0) within the component (A1) contains an aromatic group, a resist film formed using the positive resist composition of the present invention (1) exhibits a higher hydrocarbon density within the component (A1) and therefore has improved etching resistance, (2) exhibits more powerful interactions between molecules and therefore has improved resistance to pattern collapse, and (3) is able to offer improved lithography properties such as improved sensitivity to exposure sources such as EUV and EB. Moreover, in those cases where the aromatic group of the structural unit (a0) within the component (A1) is substituted with a hydroxyl group or an alkylcarbonyloxy group, the resist film exhibits improved adhesion to substrates, an improved dissolution rate (developing rate), improved heat resistance, and improved sensitivity.

In terms of achieving favorable improvements in the above lithography properties during formation of a resist pattern using a positive resist composition containing the component (A1), the amount of the structural unit (a0) within the component (A1), based on the combined total of all the structural units that constitute the component (A1), is preferably within a range from 1 to 80 mol %, more preferably from 5 to 70 mol %, still more preferably 5 to 60 mol %, and most preferably from 5 to 45 mol %.

<Structural Unit (a1)>

The structural unit (a1) is a structural unit containing an acid-dissociable, dissolution-inhibiting group which does not fall under the categories of the aforementioned structural units (a0) and (a5). The expression that the structural unit (a1) "does not fall under the categories of the aforementioned structural units (a0) and (a5)" means that the structural unit (a1) does not include structural units which fall under either of the categories described above for the structural unit (a0) or the structural unit (a5) and also contain an acid-dissociable, dissolution-inhibiting group within the unit structure.

As the acid-dissociable, dissolution-inhibiting group in the structural unit (a1), any of the groups that have been proposed as acid-dissociable, dissolution-inhibiting groups for the base resins of chemically amplified resists can be used. Generally, groups that form either a cyclic or chain-like tertiary alkyl ester with the carboxyl group of the (meth)acrylic acid, acetal-type acid-dissociable, dissolution-inhibiting groups such as alkoxyalkyl groups, and structural units such as those exemplified above for the structural unit (a0) in which the hydroxyl group or carboxyl group is protected with an acid-dissociable group are widely known. Here, the term "(meth) acrylate ester" is a generic term that includes either or both of the acrylate ester having a hydrogen atom bonded to the α-position and the methacrylate ester having a methyl group bonded to the α-position.

Here, a "tertiary alkyl ester" describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid generally causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid-dissociable, dissolution-inhibiting groups".

Examples of tertiary alkyl ester-type acid-dissociable, dissolution-inhibiting groups include aliphatic branched, acid-dissociable, dissolution-inhibiting groups and aliphatic cyclic group-containing acid-dissociable, dissolution-inhibiting groups. The term "aliphatic branched" refers to a branched structure having no aromaticity. The "aliphatic branched, acid-dissociable, dissolution-inhibiting group" is not limited to groups constituted solely of carbon atoms and hydrogen atoms (not limited to hydrocarbon groups), but is preferably a hydrocarbon group. Further, the "hydrocarbon group" may be either saturated or unsaturated, but is preferably saturated.

Examples of the aliphatic branched, acid-dissociable, dissolution-inhibiting group include groups represented by the formula —C($R^{71}$)($R^{72}$)($R^{73}$). In this formula, each of $R^{71}$ to $R^{73}$ independently represents a linear alkyl group of 1 to 5 carbon atoms. The group represented by the formula —C($R^{71}$)($R^{72}$)($R^{73}$) preferably has 4 to 8 carbon atoms, and specific examples include a tert-butyl group, 2-methyl-2-butyl group, 2-methyl-2-pentyl group and 3-methyl-3-pentyl group. Among these, a tert-butyl group is particularly desirable.

The term "aliphatic cyclic group" refers to a monocyclic group or polycyclic group that has no aromaticity.

The "aliphatic cyclic group" within the structural unit (a1) may or may not have a substituent. Examples of substituents include alkyl groups of 1 to 5 carbon atoms, alkoxy groups of 1 to 5 carbon atoms, a fluorine atom, fluorinated alkyl groups of 1 to 5 carbon atoms, and an oxygen atom (=O).

The basic ring of the "aliphatic cyclic group" exclusive of substituents is not limited to groups constituted solely from carbon and hydrogen (not limited to hydrocarbon groups), but is preferably a hydrocarbon group. Further, the "hydrocarbon group" may be either saturated or unsaturated, but is preferably saturated. Furthermore, the "aliphatic cyclic group" is preferably a polycyclic group.

Examples of such aliphatic cyclic groups include groups in which one or more hydrogen atoms have been removed from a monocycloalkane or a polycycloalkane such as a bicycloalkane, tricycloalkane or tetracycloalkane which may or may not be substituted with an alkyl group of 1 to 5 carbon atoms, a fluorine atom or a fluorinated lower alkyl group. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane. Further, these groups in which one or more hydrogen atoms have been removed from a monocycloalkane and groups in which one or more hydrogen atoms have been removed from a polycycloalkane may have a portion of the carbon atoms that constitute the ring replaced with an ethereal oxygen atom (—O—).

Examples of acid-dissociable, dissolution-inhibiting groups containing an aliphatic cyclic group include (i) groups which have a tertiary carbon atom on the ring structure of a monovalent aliphatic cyclic group, and (ii) groups which have a branched alkylene group containing a tertiary carbon atom, and a monovalent aliphatic cyclic group to which the tertiary carbon atom is bonded.

Specific examples of (i) groups which have a tertiary carbon atom on the ring structure of a monovalent aliphatic cyclic group include groups represented by general formulas (1-1) to (1-9) shown below.

Specific examples of (ii) groups which have a branched alkylene group containing a tertiary carbon atom, and a monovalent aliphatic cyclic group to which the tertiary carbon atom is bonded include groups represented by general formulas (2-1) to (2-6) shown below.

[Chemical Formula 12]

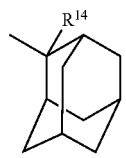

(1-1)

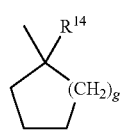

(1-2)

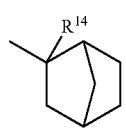

(1-3)

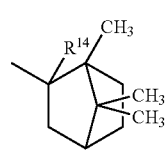

(1-4)

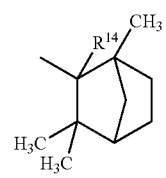

(1-5)

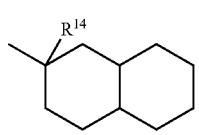

(1-6)

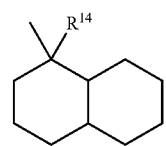

(1-7)

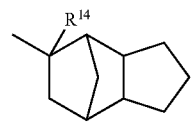

(1-8)

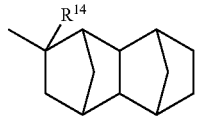

(1-9)

In the formulas, $R^{14}$ represents an alkyl group, and g represents an integer of 0 to 8.

[Chemical Formula 13]

(2-1) 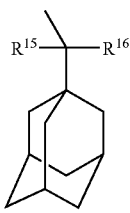

(2-2) 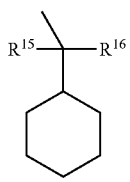

(2-3) 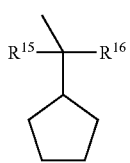

(2-4) 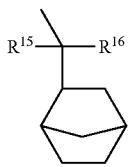

(2-5) 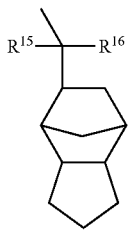

(2-6) 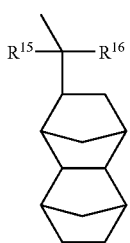

In the formulas, each of $R^{15}$ and $R^{16}$ represents an alkyl group.

As the alkyl group for $R^{14}$, a linear or branched alkyl group is preferable.

The linear alkyl group preferably has 1 to 5 carbon atoms, more preferably 1 to 4 carbon atoms, and still more preferably 1 or 2 carbon atoms. Specific examples include a methyl group, ethyl group, n-propyl group, n-butyl group or n-pentyl group. Among these, a methyl group, ethyl group or n-butyl group is preferable, and a methyl group or ethyl group is more preferable.

The branched alkyl group preferably has 3 to 10 carbon atoms, and more preferably 3 to 5 carbon atoms. Specific examples of such branched alkyl groups include an isopropyl group, isobutyl group, tert-butyl group, isopentyl group or neopentyl group, and an isopropyl group is particularly desirable.

g is preferably an integer of 0 to 3, more preferably an integer of 1 to 3, and still more preferably 1 or 2.

Examples of the alkyl group for $R^{15}$ and $R^{16}$ include the same alkyl groups as those listed for $R^{14}$.

In formulas (1-1) to (1-9) and (2-1) to (2-6), part of the carbon atoms that constitute the ring may be replaced with an ethereal oxygen atom (—O—).

Further, in formulas (1-1) to (1-9) and (2-1) to (2-6), one or more of the hydrogen atoms bonded to the carbon atoms constituting the ring may be substituted with a substituent. Examples of this substituent include a lower alkyl group of 1 to 5 carbon atoms, a fluorine atom and a fluorinated alkyl group.

An "acetal-type acid-dissociable, dissolution-inhibiting group" generally substitutes a hydrogen atom at the terminal of an alkali-soluble group such as a carboxyl group or hydroxyl group, so as to be bonded with an oxygen atom. When acid is generated upon exposure, the generated acid acts to break the bond between the acetal-type acid-dissociable, dissolution-inhibiting group and the oxygen atom to which the acetal-type, acid-dissociable, dissolution-inhibiting group is bonded.

Examples of acetal-type acid-dissociable, dissolution-inhibiting groups include groups represented by general formula (p1) shown below.

[Chemical Formula 14]

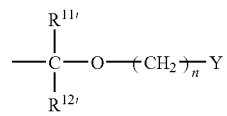

(p1)

In the formula, each of $R^{11'}$ and $R^{12'}$ represents a hydrogen atom or an alkyl group of 1 to 5 carbon atoms, n represents an integer of 0 to 3, and Y represents an alkyl group of 1 to 5 carbon atoms or an aliphatic cyclic group.

In general formula (p1) above, n is preferably an integer of 0 to 2, more preferably 0 or 1, and most preferably 0.

Examples of the alkyl groups of 1 to 5 carbon atoms for $R^{11'}$ and $R^{12'}$ include the same alkyl groups of 1 to 5 carbon atoms as those described above for $R^1$, although a methyl group or ethyl group is preferable, and a methyl group is particularly desirable.

In the present invention, it is preferable that at least one of $R^{11'}$ and $R^{12'}$ is a hydrogen atom. That is, it is preferable that the acid-dissociable, dissolution-inhibiting group (p1) is a group represented by general formula (p1-1) shown below.

[Chemical Formula 15]

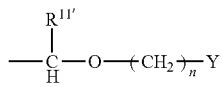

(p1-1)

In the formula, $R^{11'}$, n and Y are the same as defined above.

Examples of the alkyl group of 1 to 5 carbon atoms for Y include the same alkyl groups of 1 to 5 carbon atoms described above for $R^1$.

As the aliphatic cyclic group for Y, any of the aliphatic monocyclic or polycyclic groups which have been proposed for conventional ArF resists or the like can be appropriately selected for use. For example, the same groups as those described above in connection with the "aliphatic cyclic group" may be used.

Further, as the acetal-type, acid-dissociable, dissolution-inhibiting group, groups represented by general formula (p2) shown below may also be used.

[Chemical Formula 16]

$$\begin{array}{c} R^{17} \\ | \\ -C-O-R^{19} \\ | \\ R^{18} \end{array} \quad (p2)$$

In the formula, each of $R^{17}$ and $R^{18}$ represents a linear or branched alkyl group or a hydrogen atom, and $R^{19}$ represents a linear, branched or cyclic alkyl group. Alternatively, $R^{17}$ and $R^{19}$ may each independently represent a linear or branched alkylene group, wherein $R^{17}$ is bonded to $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable. It is particularly desirable that one of $R^{17}$ and $R^{18}$ is a hydrogen atom and the other is a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. Examples of the cycloalkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane and cyclohexane, and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

In formula (p2) above, each of $R^{17}$ and $R^{19}$ may represent a linear or branched alkylene group (and preferably an alkylene group of 1 to 5 carbon atoms), wherein $R^{19}$ is bonded to $R^{17}$.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of this cyclic group include a tetrahydropyranyl group and a tetrahydrofuranyl group.

Specific examples of acetal-type acid-dissociable, dissolution-inhibiting groups include groups represented by formulas (p3-1) to (p3-12) shown below.

[Chemical Formula 17]

-continued

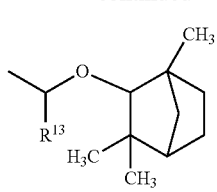
(p3-12)

In the formulas above, $R^{13}$ represents a hydrogen atom or a methyl group, and g is the same as defined above.

Specific examples of the structural unit (a1) include structural units represented by general formula (a1-1-1) shown below, structural units represented by general formula (a1-0-2) shown below, and structural units represented by general formula (a1-0-3) shown below in which the —OH group has been protected with an acid-dissociable, dissolution-inhibiting group.

[Chemical Formula 18]

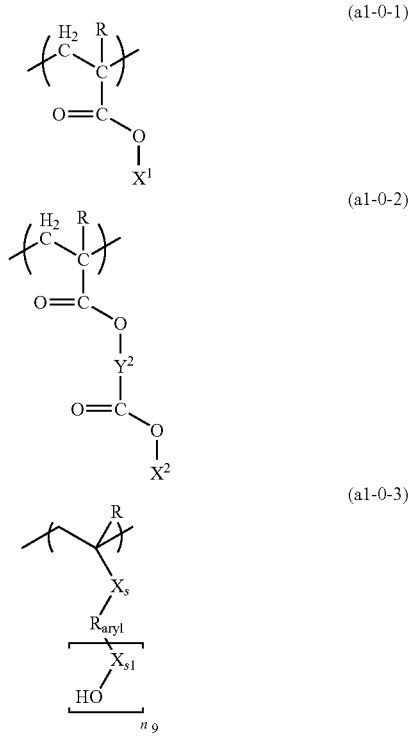

In the formulas, R represents a hydrogen atom, an alkyl group of 1 to 5 carbon atoms or a halogenated alkyl group of 1 to 5 carbon atoms, $X^1$ represents an acid-dissociable, dissolution-inhibiting group, $Y^2$ represents a divalent linking group, $X^2$ represents an acid-dissociable, dissolution-inhibiting group, $X_S$, $X_{S1}$ and $R_{aryl}$ are the same as defined above, and $n_9$ is an integer of 1 to 3.

In general formula (a1-1-1). The alkyl group of 1 to 5 carbon atoms for R is the same as the alkyl group of 1 to 5 carbon atoms defined above for $R^1$ in formula (a5-1).

$X^1$ is not particularly limited as long as it is an acid-dissociable, dissolution-inhibiting group. Examples thereof include the aforementioned tertiary alkyl ester-type acid-dissociable, dissolution-inhibiting groups and acetal-type acid-dissociable, dissolution-inhibiting groups, and tertiary alkyl ester-type acid-dissociable, dissolution-inhibiting groups are preferable.

In general formula (a1-0-2), R is the same as defined above.

$X^2$ is the same as defined for $X^1$ in general formula (a1-0-1).

Examples of the divalent linking group for $Y^2$ include the same groups as those described above for $R^2$ in formula (a5-1).

As $Y^2$, an aforementioned alkylene group, divalent aliphatic cyclic group or divalent linking group containing a hetero atom is preferable. Among these, a divalent linking group containing a hetero atom is preferable, and a linear group containing an oxygen atom as the hetero atom, such as a group containing an ester bond, is particularly desirable.

More specifically, a group represented by the aforementioned formula -A-O—B— or -A-C(=O)—O—B— is preferable, and a group represented by the formula —$(CH_2)_{a'}$—C(=O)—O—$(CH_2)_{b'}$— is particularly desirable.

a' represents an integer of 1 to 5, preferably 1 or 2, and most preferably 1.

b' represents an integer of 1 to 5, preferably 1 or 2, and most preferably 1.

In general formula (a1-0-3), R, $X_S$, $X_{S1}$ and $R_{aryl}$ are the same as defined above. $n_9$ is preferably 1 or 2, and is most preferably 1.

Specific examples of the structural unit (a1) include structural units represented by general formulas (a1-1) to (a1-4) shown below.

[Chemical Formula 19]

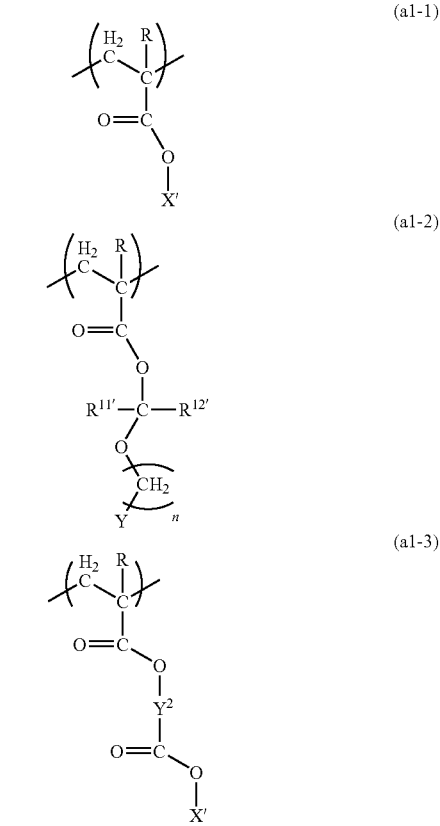

(a1-4)

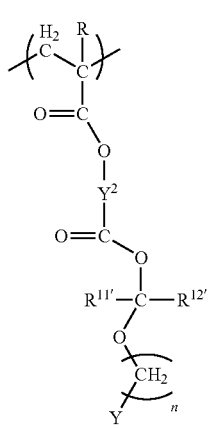

In the formulas, X' represents a tertiary alkyl ester-type acid-dissociable, dissolution-inhibiting group, Y represents an alkyl group of 1 to 5 carbon atoms or an aliphatic cyclic group, n represents an integer of 0 to 3, $Y^2$ represents a divalent linking group, R is the same as defined above, and each of $R^{11\prime}$ and $R^{12\prime}$ represents a hydrogen atom or an alkyl group of 1 to 5 carbon atoms.

In the above formulas, examples of X' include the same tertiary alkyl ester-type acid-dissociable, dissolution-inhibiting groups as those described above for $X^1$.

Each of $R^{11\prime}$, $R^{12\prime}$, n and Y is respectively the same as that defined for $R^{11\prime}$, $R^{12\prime}$, n and Y in general formula (p1) described above in connection with the "acetal-type acid-dissociable, dissolution-inhibiting group".

Examples of $Y^2$ include the same groups as those described above for $Y^2$ in general formula (a1-0-2).

Specific examples of structural units represented by general formula (a1-1) to (a1-4) are shown below.

In the formulas shown below, $R^\alpha$ represents a hydrogen atom, a methyl group or a trifluoromethyl group.

[Chemical Formula 20]

(a1-1-1)

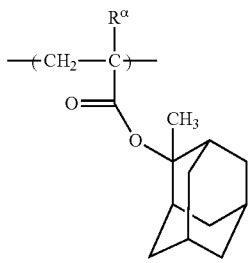

(a1-1-2)

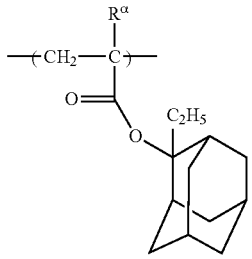

(a1-1-3)

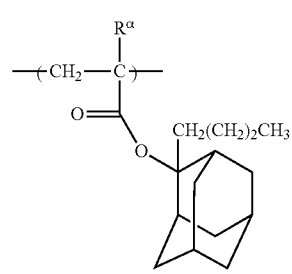

(a1-1-4)

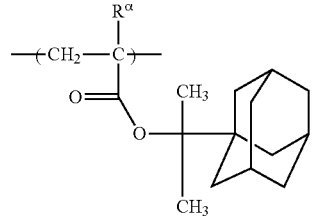

(a1-1-5)

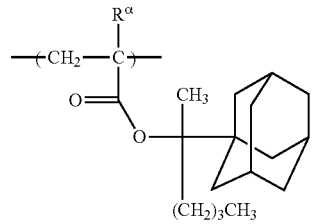

(a1-1-6)

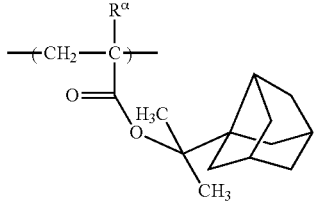

(a1-1-7)

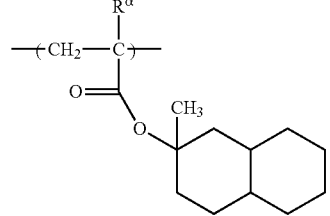

(a1-1-8)

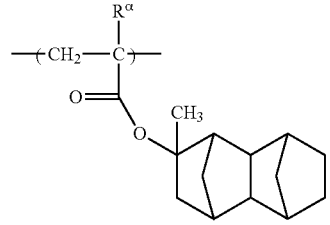

(a1-1-9)

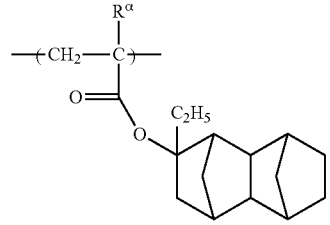

(a1-1-10) 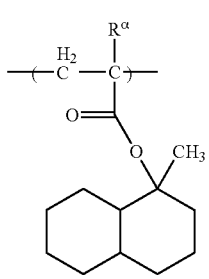
(a1-1-11) 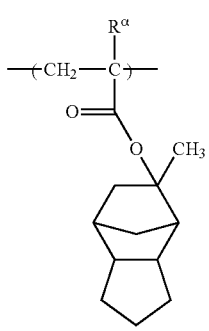
(a1-1-12) 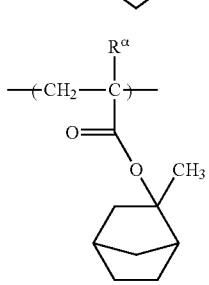
(a1-1-13) 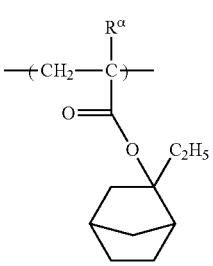
(a1-1-14) 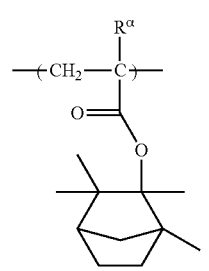
(a1-1-15) 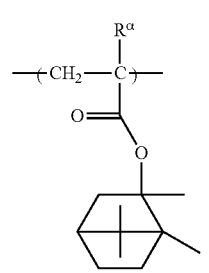
(a1-1-16) 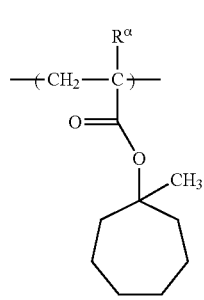
(a1-1-17) 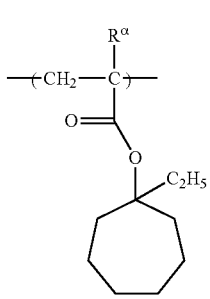
(a1-1-18) 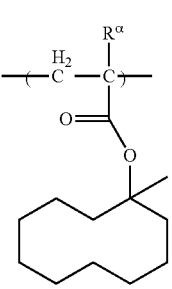
(a1-1-19) 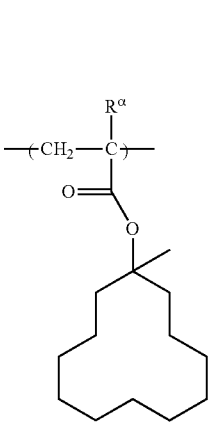
(a1-1-20) 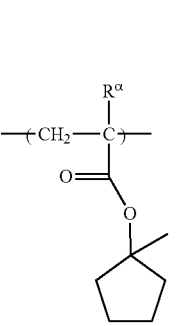

[Chemical Formula 21]
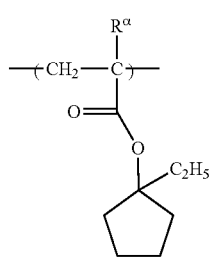
(a1-1-21)
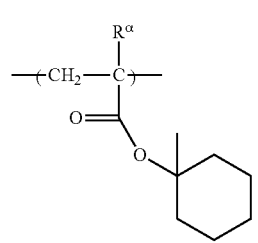
(a1-1-22)
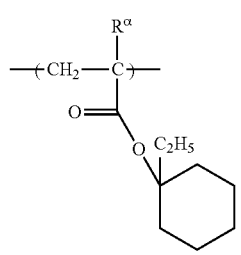
(a1-1-23)
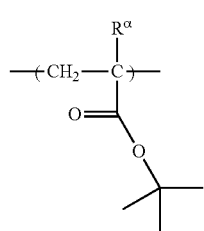
(a1-1-24)
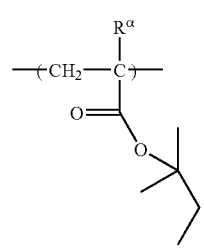
(a1-1-25)
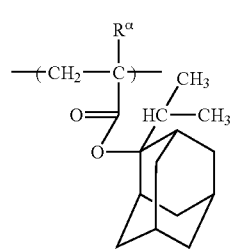
(a1-1-26)
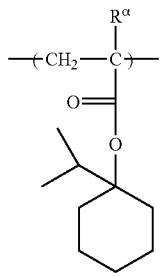
(a1-1-27)
(a1-1-28)
(a1-1-29)
(a1-1-30)
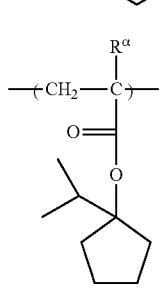
(a1-1-31)

[Chemical Formula 22]
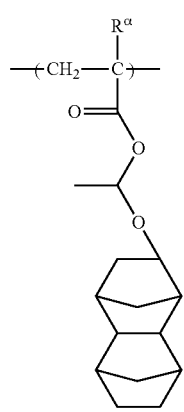 (a1-2-1)
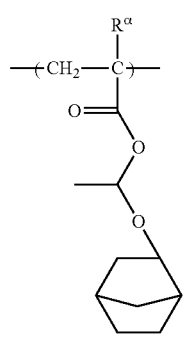 (a1-2-2)
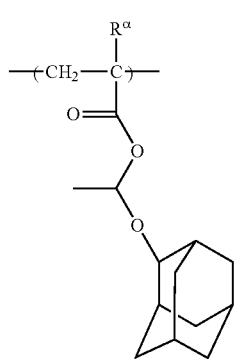 (a1-2-3)
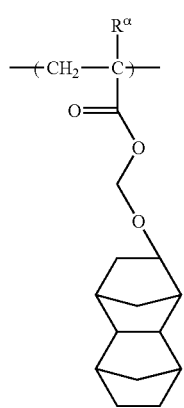 (a1-2-4)
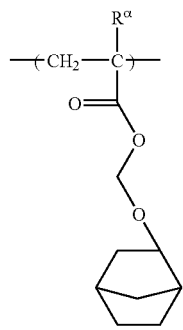 (a1-2-5)
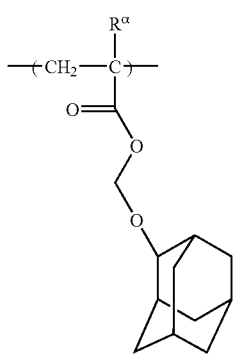 (a1-2-6)
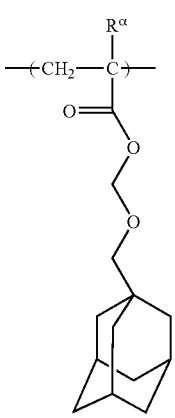 (a1-2-7)
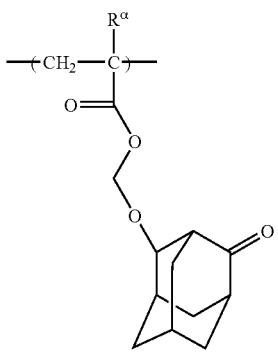 (a1-2-8)

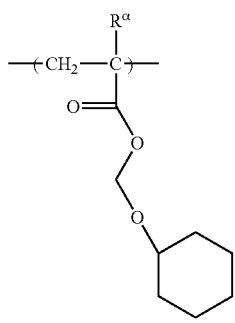
(a1-2-9)
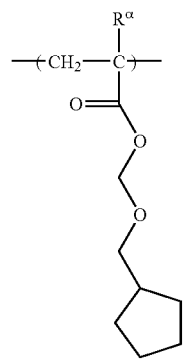
(a1-2-13)
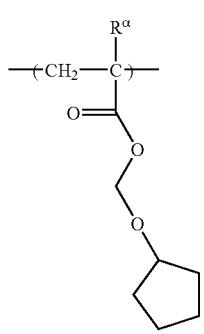
(a1-2-10)
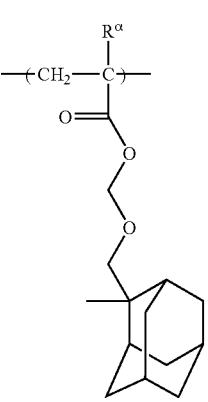
(a1-2-14)
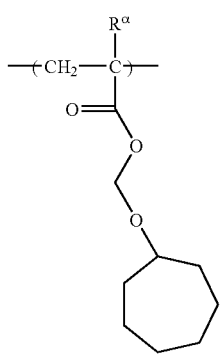
(a1-2-11)
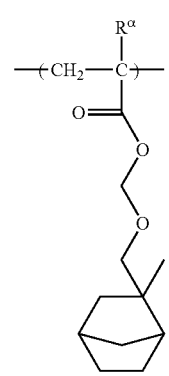
(a1-2-15)
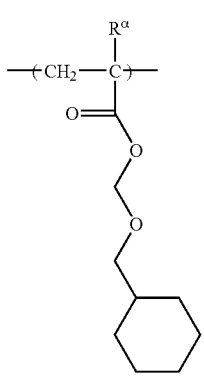
(a1-2-12)
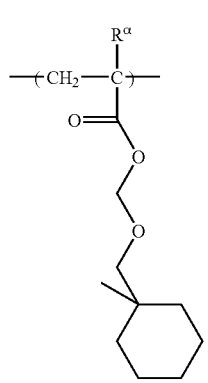
(a1-2-16)

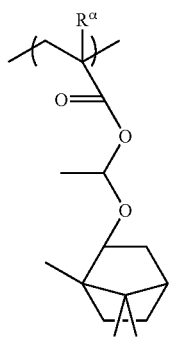 (a1-2-17)
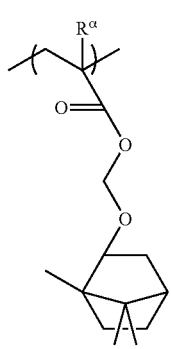 (a1-2-18)
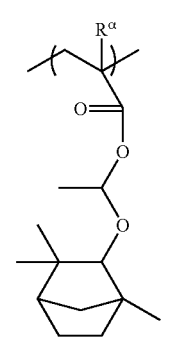 (a1-2-19)
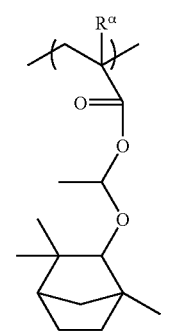 (a1-2-20)
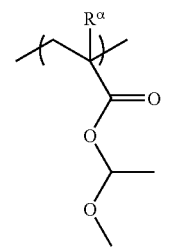 (a1-2-21)
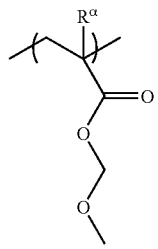 (a1-2-22)
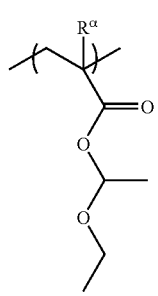 (a1-2-23)
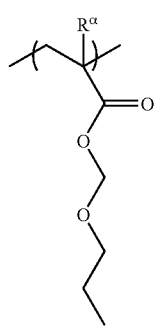 (a1-2-24)
[Chemical Formula 23]
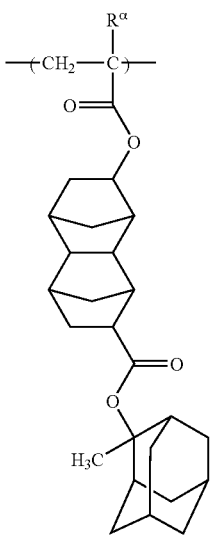 (a1-3-1)

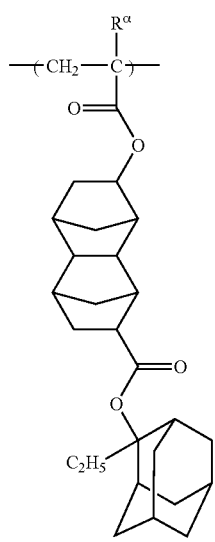
(a1-3-2)
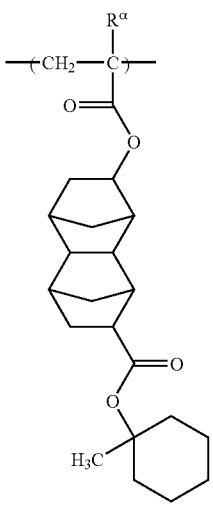
(a1-3-5)
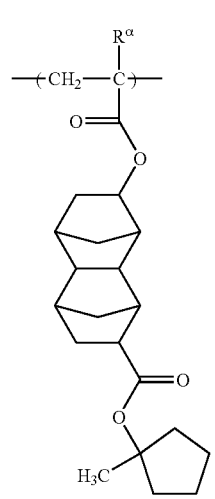
(a1-3-3)
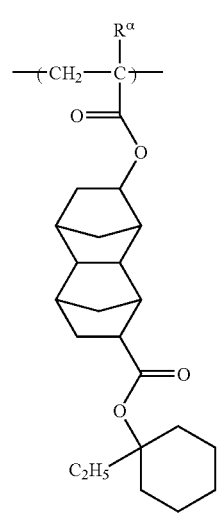
(a1-3-6)
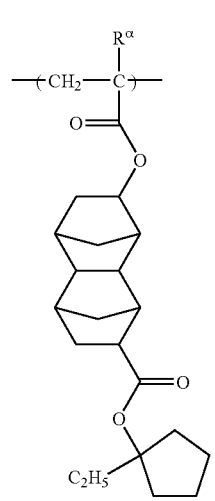
(a1-3-4)
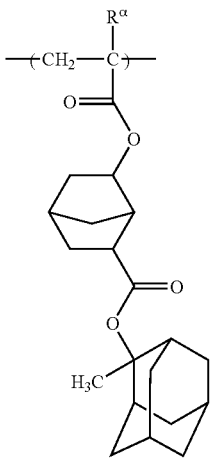
(a1-3-7)

(a1-3-8)
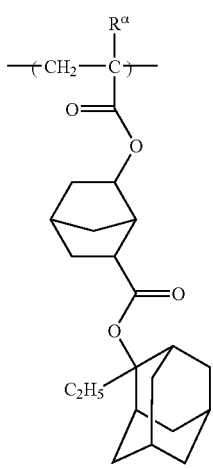
(a1-3-9)
(a1-3-10)
(a1-3-11)
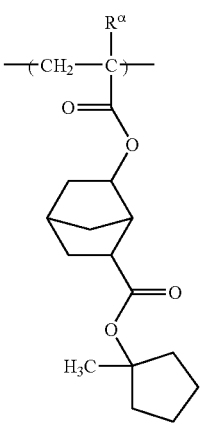
(a1-3-12)
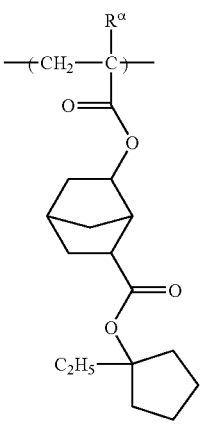
(a1-3-13)
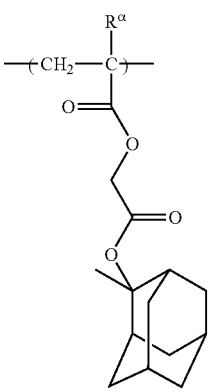
(a1-3-14)
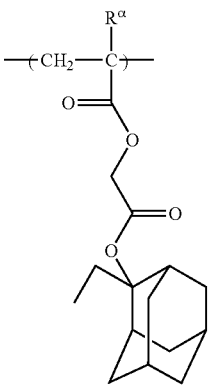

(a1-3-15)
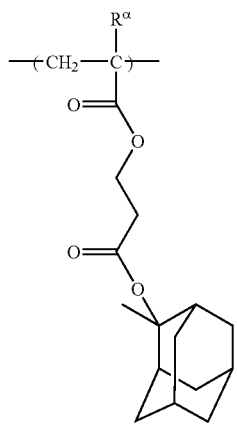
(a1-3-16)
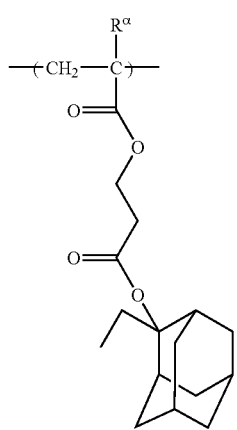
(a1-3-17)
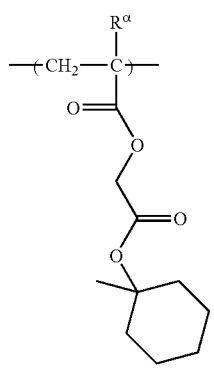
(a1-3-18)
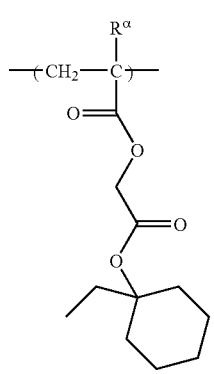
[Chemical Formula 24]
(a1-3-19)
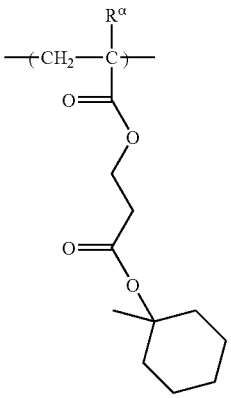
(a1-3-20)
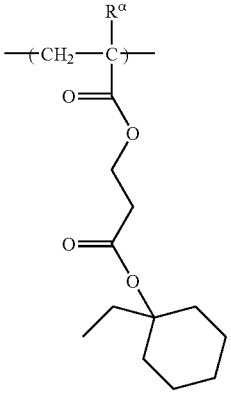
(a1-3-21)
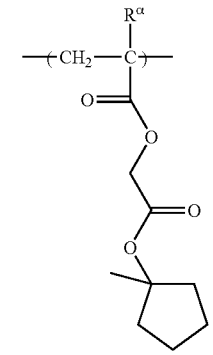
(a1-3-22)
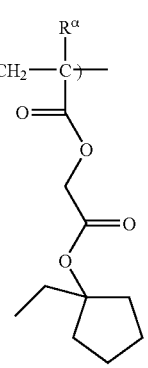

-continued
(a1-3-23)
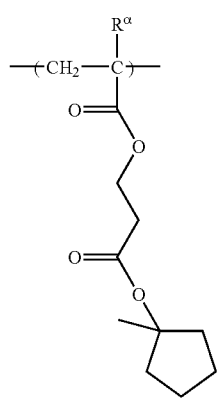
(a1-3-24)
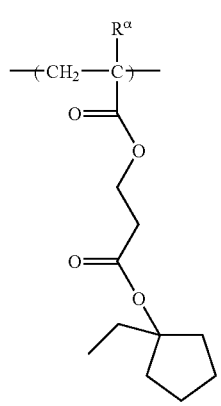
[Chemical Formula 25]
(a1-3-25)
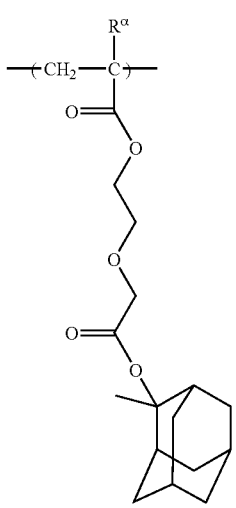
-continued
(a1-3-26)
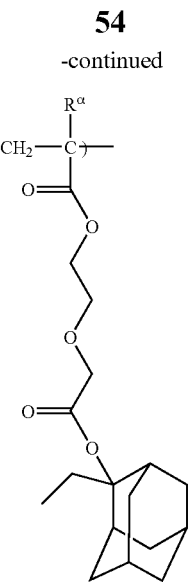
(a1-3-27)
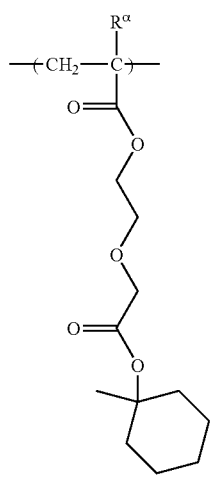
(a1-3-28)
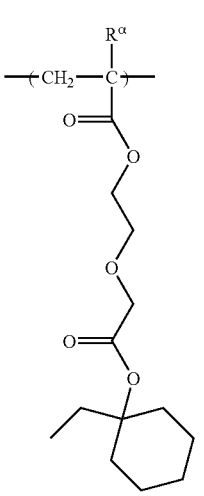

(a1-3-29)
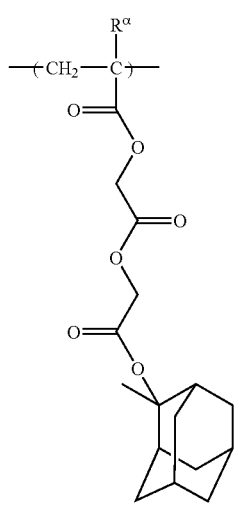
(a1-3-30)
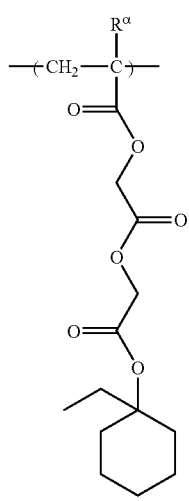
(a1-3-31)
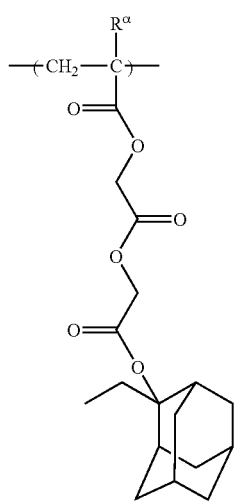
(a1-3-32)
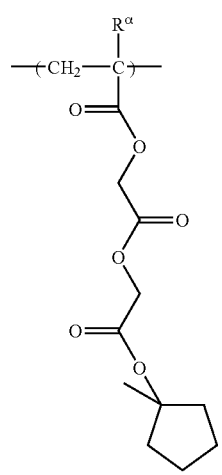
[Chemical Formula 26]
(a1-4-1)
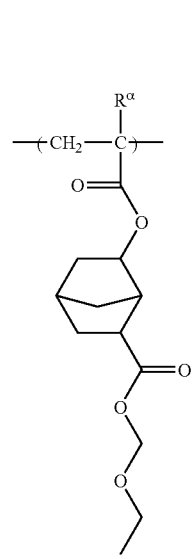
(a1-4-2)

(a1-4-3)
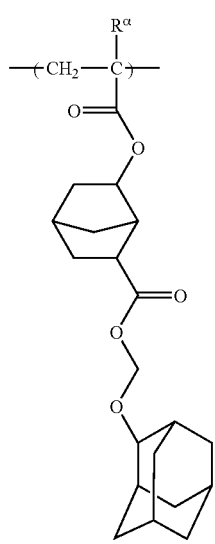
(a1-4-4)
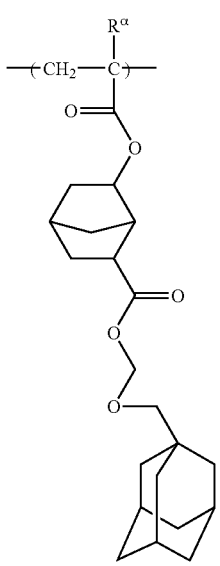
(a1-4-5)
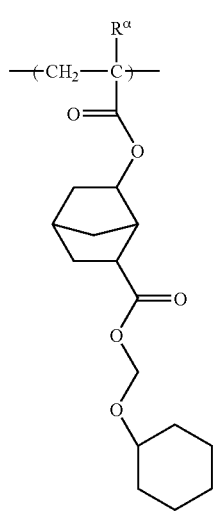
(a1-4-6)
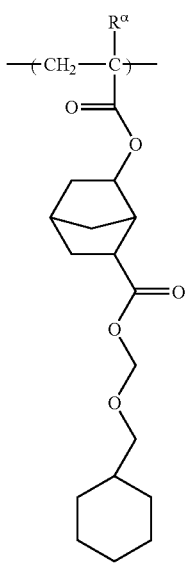
(a1-4-7)
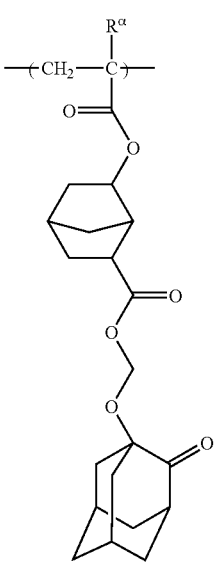
(a1-4-8)
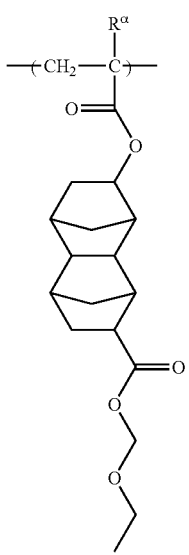

(a1-4-9)
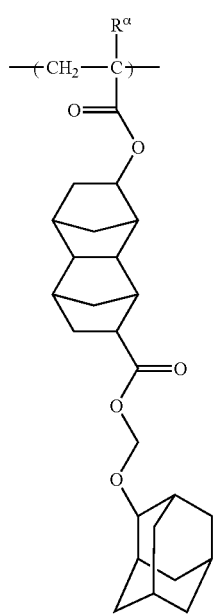
(a1-4-10)
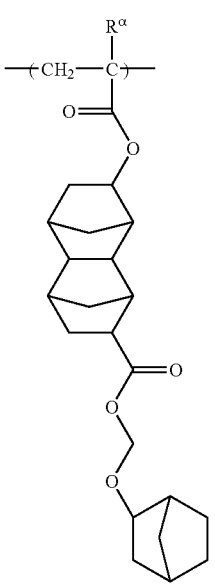
(a1-4-11)
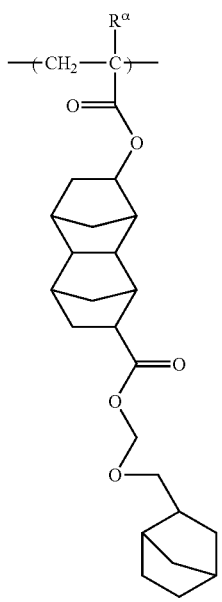
(a1-4-12)
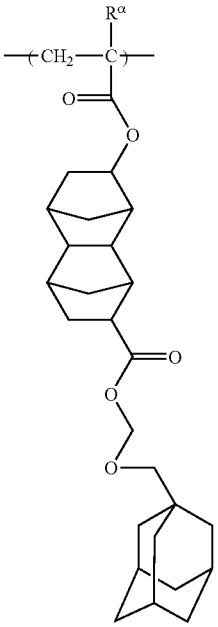

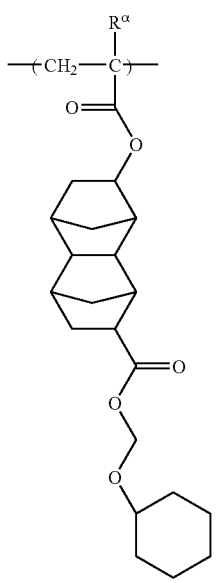
(a1-4-13)

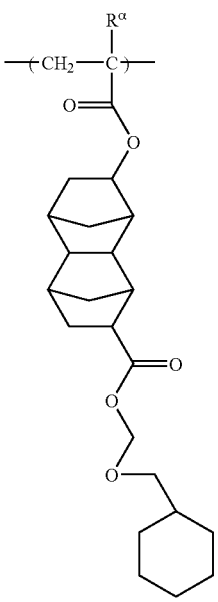
(a1-4-14)

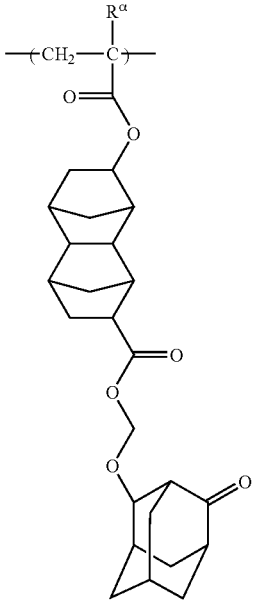
(a1-4-15)

As the structural unit (a1), one type of structural unit may be used alone, or two or more types may be used in combination.

In the present invention, in terms of achieving excellent lithography properties such as the PEB margin, it is preferable that the structural unit (a1) includes at least one structural unit, and more preferably two or more structural units, selected from the group consisting of structural units represented by general formula (a1-0-11) shown below.

Here, the PEB margin describes a property wherein, even if there is a slight variation in the temperature during the PEB treatment performed during formation of the resist pattern, the targeted resist pattern size is able to formed with good stability independently of that slight temperature variation.

[Chemical Formula 27]

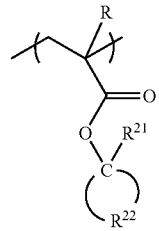
(a1-0-11)

In the formula, R represents a hydrogen atom, an alkyl group of 1 to 5 carbon atoms or a halogenated alkyl group of 1 to 5 carbon atoms, $R^{21}$ represents an alkyl group, and $R^{22}$ represents a group which forms an aliphatic monocyclic group in combination with the carbon atom to which $R^{22}$ is bonded.

In the above formula, R is the same as defined above.

In general formula (a1-0-11), examples of the alkyl group for $R^{21}$ include the same alkyl groups as those described above for $R^{14}$ in formulas (1-1) to (1-9), although a methyl group or ethyl group is preferred.

Examples of the aliphatic monocyclic group formed by $R^{22}$ and the carbon atom to which $R^{22}$ is bonded include the monocyclic groups among those aliphatic cyclic groups described above for the aforementioned tertiary alkyl ester-type acid-dissociable, dissolution-inhibiting group. Specific examples include groups in which one or more hydrogen atoms have been removed from a monocycloalkane. The monocycloalkane is preferably a 3- to 11-membered ring, more preferably a 3- to 8-membered ring, still more preferably a 4- to 8-membered ring, and most preferably a 5- or 6-membered ring.

The monocycloalkane may or may not have a portion of the carbon atoms that constitute the ring replaced with an ethereal oxygen atom (—O—).

Further, the monocycloalkane may have a substituent such as an alkyl group of 1 to 5 carbon atoms, a fluorine atom or a fluorinated alkyl group.

An example of $R^{22}$ constituting such an aliphatic cyclic group is a linear alkylene group which may have an ethereal oxygen atom (—O—) interposed between the carbon atoms.

Specific examples of structural units represented by general formula (a1-0-11) include structural units represented by the aforementioned formulas (a1-1-16) to (a1-1-23), and (a1-1-27) and (a1-1-31). Among these, structural units represented by general formula (a1-1-02) shown below, which includes the structural units represented by the aforementioned formulas (a1-1-16), (a1-1-17) and (a1-1-20) to (a1-1-23) is preferable.

In the formulas shown below, h is preferably 1 or 2.

[Chemical Formula 28]

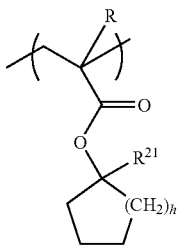

(a1-1-02)

In the formula, R and $R^{21}$ are the same as defined above, and h represents an integer of 1 to 3.

Examples of structural units represented by general formula (a1-0-2) include structural units represented by the aforementioned formulas (a1-3) and (a1-4). Of these, in terms of factors such as the resolution obtainable, a structural unit represented by formula (a1-3) is particularly desirable.

Of the structural units represented by general formula (a1-0-2), those in which $Y^2$ is a group represented by the aforementioned formula -A-O—B— or -A-C(=O)—O—B— are particularly desirable.

Preferred examples of such structural units include structural units represented by general formulas (a1-3-01) to (a1-3-03) shown below.

[Chemical Formula 29]

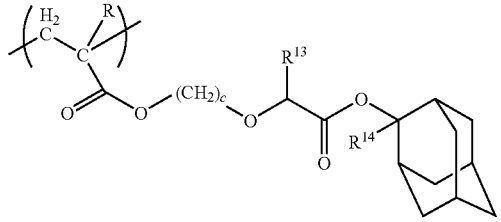

(a1-3-01)

In the formula, R and $R^{14}$ are the same as defined above, $R^{13}$ represents a hydrogen atom or a methyl group, and a represents an integer of 1 to 10.

[Chemical Formula 30]

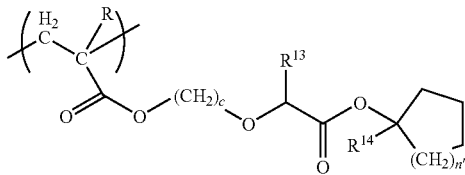

(a1-3-02)

In the formula, R and $R^{14}$ are the same as defined above, $R^{13}$ represents a hydrogen atom or a methyl group, c represents an integer of 1 to 10, and n' represents an integer of 0 to 3.

[Chemical Formula 31]

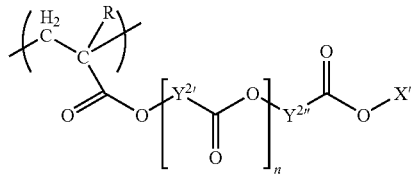

(a1-3-03)

In the formula, R is the same as defined above, each of $Y^{2'}$ and $Y^{2''}$ represents a divalent linking group, X' represents an acid-dissociable, dissolution-inhibiting group, and n represents an integer of 0 to 3.

In formulas (a1-3-01) and (a1-3-02), $R^{13}$ is preferably a hydrogen atom.

c is preferably an integer of 1 to 8, more preferably an integer of 1 to 5, and most preferably 1 or 2.

n' is preferably 1 or 2, and most preferably 2.

Specific examples of structural units represented by formula (a1-3-01) include structural units represented by the aforementioned formulas (a1-3-25) and (a1-3-26).

Specific examples of structural units represented by formula (a1-3-02) include structural units represented by the aforementioned formulas (a1-3-27) and (a1-3-28).

In formula (a1-3-03), examples of the divalent linking group for $Y^{2'}$ and $Y^{2''}$ include the same groups as those described above for $Y^2$ in general formula (a1-3).

As $Y^{2'}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As $Y^{2''}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As the acid-dissociable, dissolution-inhibiting group for X', the same groups as those described above can be used. X' is preferably a tertiary alkyl ester-type acid-dissociable, dissolution-inhibiting group, and is more preferably an aforementioned group (i) which has a tertiary carbon atom on the ring structure of a monovalent aliphatic cyclic group. Among the aforementioned groups (i), a group represented by general formula (I-1) above is preferable.

n represents an integer of 0 to 3, preferably an integer of 0 to 2, more preferably 0 or 1, and most preferably 1.

As the structural unit represented by general formula (a1-3-03), a structural unit represented by general formula (a1-3-03-1) or (a1-3-03-2) shown below is preferable. Among these, a structural unit represented by general formula (a1-3-03-1) is preferable, and a structural unit represented by the aforementioned formula (a1-3-29) or (a1-3-30) is particularly desirable.

[Chemical Formula 32]

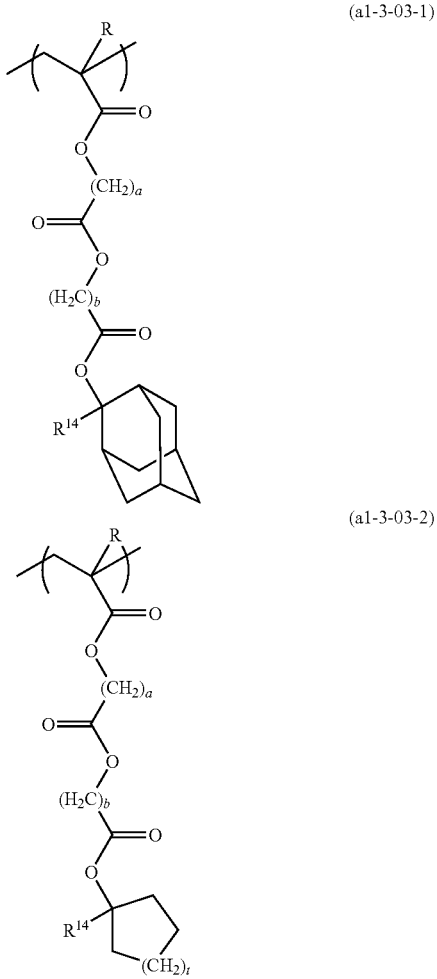

(a1-3-03-1)

(a1-3-03-2)

In the formulas, R and $R^{14}$ are the same as defined above, $R^{20}$ represents a hydrogen atom or a methyl group, a represents an integer of 1 to 10, b represents an integer of 1 to 10, and t represents an integer of 0 to 3.

a is preferably an integer of 1 to 5, and most preferably 1 or 2.

b is preferably an integer of 1 to 5, and most preferably 1 or 2.

t is preferably an integer of 1 to 3, and most preferably 1 or 2.

Specific examples of structural units represented by the above general formula (a1-0-3) include those units among the structural units described as specific examples of general formula (a0-1) which include a hydroxyl group or carboxyl group that has been protected by an acid-dissociable, dissolution-inhibiting group.

In the present invention, it is particularly desirable to include at least two types of structural units as the structural unit (a1). By including at least two types of structural units, the lithography properties such as the resolution can be further improved during formation of a resist pattern containing the component (A1). Furthermore, including at least two types of structural units is also able to widen the PEB margin.

In such a case, it is preferable that at least one of the at least two structural units is a structural unit selected from the group consisting of structural units represented by general formula (a1-0-11).

In this case, the structural unit (a1) including at least two types of structural units may consist solely of structural units selected from the group consisting of structural units represented by general formula (a1-0-11), or alternatively, the structural unit (a1) may be a combination of at least one structural unit selected from the aforementioned group and a structural unit which does not fall under the category of the aforementioned group.

In the component (A1), the amount of the structural unit (a1), based on the combined total of all the structural units that constitute the component (A1), is preferably within a range from 10 to 80 mol %, more preferably from 20 to 70 mol %, and still more preferably from 25 to 65 mol %. By ensuring that the amount of the structural unit (a1) is at least as large as the lower limit of the above-mentioned range, a pattern can be formed easily using a resist composition prepared from the component (A1). On the other hand, by ensuring that the amount of the structural unit (a1) is not more than the upper limit of the above-mentioned range, a good balance can be achieved with the other structural units. By using an amount of the structural unit (a1) that satisfies the above range, lithography properties such as the LWR and resist pattern shape can be further improved.

<Structural Unit (a2)>

In the present invention, the component (A1) may include a structural unit (a2) derived from an acrylate ester containing a lactone-containing cyclic group in addition to the structural unit (a0), structural unit (a5) and structural unit (a1) described above.

The term "lactone-containing cyclic group" refers to a cyclic group including one ring containing a —O—C(O)— structure (the lactone ring). This "lactone ring" is counted as the first ring, so that a lactone-containing cyclic group in which the only ring structure is the lactone ring is referred to as a monocyclic group, and groups containing other ring structures are described as polycyclic groups regardless of the structure of the other rings.

When the component (A1) is used for forming a resist film, the lactone-containing cyclic group of the structural unit (a2) is effective in improving the adhesion between the resist film and the substrate, and increasing the compatibility with the developing solution containing water.

There are no particular limitations on the structural unit (a2), and an arbitrary structural unit may be used.

Specific examples of lactone-containing monocyclic groups include groups in which one hydrogen atom has been removed from a 4- to 6-membered lactone ring, including a group in which one hydrogen atom has been removed from β-propiolactone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 33]

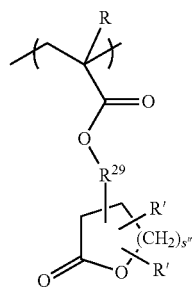
(a2-1)

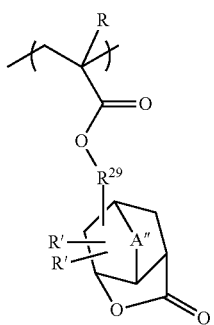
(a2-2)

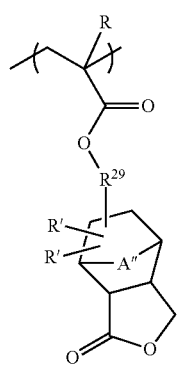
(a2-3)

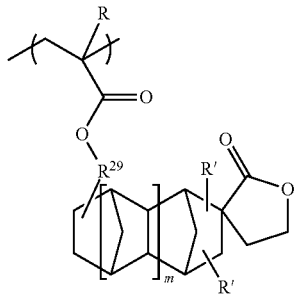
(a2-4)

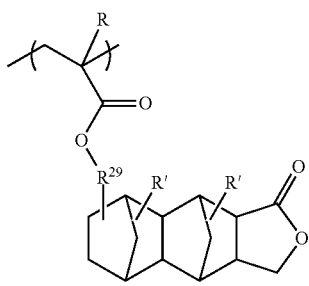
(a2-5)

In the formulas, R represents a hydrogen atom, an alkyl group of 1 to 5 carbon atoms or a halogenated alkyl group of 1 to 5 carbon atoms, each R' independently represents a hydrogen atom, an alkyl group of 1 to 5 carbon atoms, an alkoxy group of 1 to 5 carbon atoms or —COOR", wherein R" represents a hydrogen atom or an alkyl group, $R^{29}$ represents a single bond or a divalent linking group; s" represents 0 or an integer of 1 or 2, A" represents an oxygen atom, a sulfur atom or an alkylene group of 1 to 5 carbon atoms which may contain an oxygen atom or a sulfur atom, and m represents an integer of 0 or 1.

In general formulas (a2-1) to (a2-5), R is the same as defined for R in the structural unit (a1).

Examples of the alkyl group of 1 to 5 carbon atoms for R' include a methyl group, ethyl group, propyl group, n-butyl group and tert-butyl group.

Examples of the alkoxy group of 1 to 5 carbon atoms for R' include a methoxy group, ethoxy group, n-propoxy group, iso-propoxy group, n-butoxy group and tert-butoxy group.

In terms of industrial availability, R' is preferably a hydrogen atom.

When R" represents a linear or branched alkyl group, it is preferably an alkyl group of 1 to 10 carbon atoms, and more preferably an alkyl group of 1 to 5 carbon atoms.

When R" represents a cyclic alkyl group, it preferably contains 3 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

A" is preferably an alkylene group of 1 to 5 carbon atoms or —O—, is more preferably an alkylene group of 1 to 5 carbon atoms, and is most preferably a methylene group.

$R^{29}$ represents a single bond or a divalent linking group. Examples of the divalent linking group include the same divalent linking groups as those described above for $Y^2$ in general formula (a1-0-2), and of these groups, an alkylene group, an ester linkage (—C(=O)—O—) or a combination thereof is preferred. The alkylene group for the divalent linking group for $R^{29}$ is preferably a linear or branched alkylene group. Specific examples include the same linear alkylene groups and branched alkylene groups as those listed above for the aliphatic hydrocarbon group for A within the description for $Y^2$.

s" is preferably an integer of 1 or 2.

Specific examples of structural units represented by general formulas (a2-1) to (a2-5) are shown below. In each of the formulas shown below, $R^\alpha$ represents a hydrogen atom, a methyl group or a trifluoromethyl group.

[Chemical Formula 34]

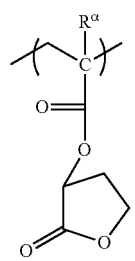
(a2-1-1)

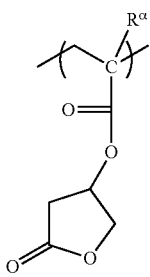
(a2-1-2)

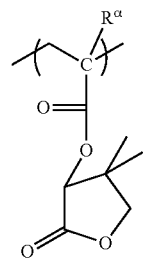
(a2-1-3)

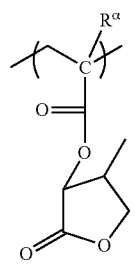
(a2-1-4)

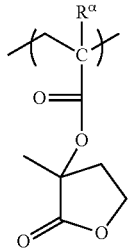
(a2-1-5)

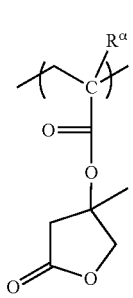
(a2-1-6)

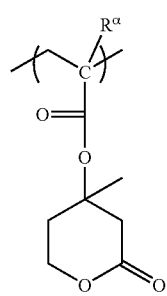
(a2-1-7)

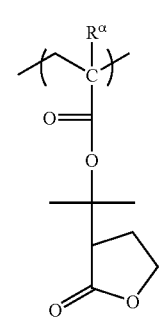
(a2-1-8)

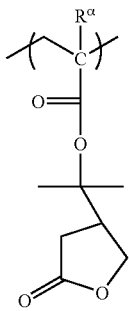
(a2-1-9)

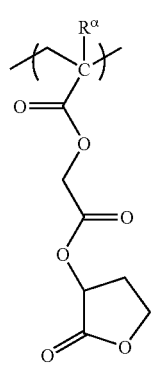 (a2-1-10)
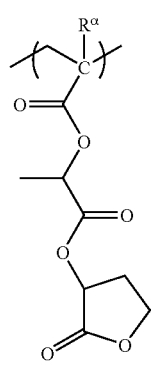 (a2-1-11)
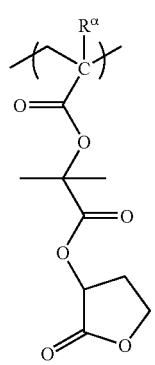 (a2-1-12)
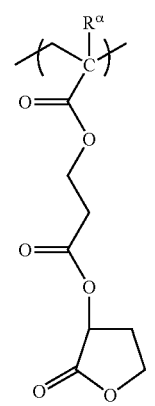 (a2-1-13)
[Chemical Formula 35]
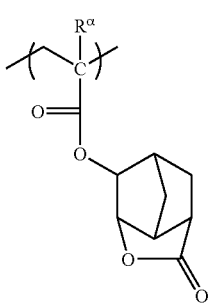 (a2-2-1)
(a2-2-2)
(a2-2-3)
(a2-2-4)
(a2-2-5)

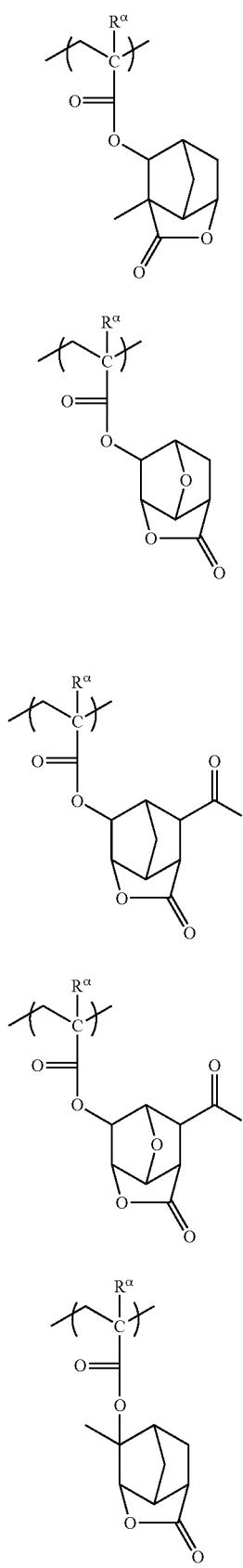
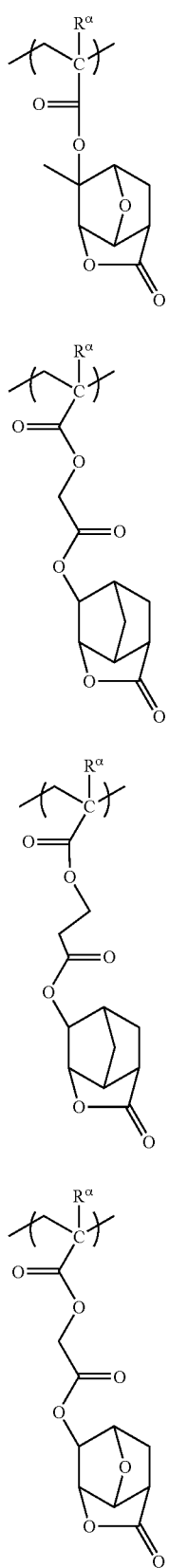

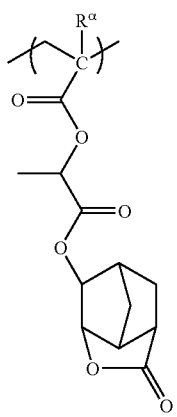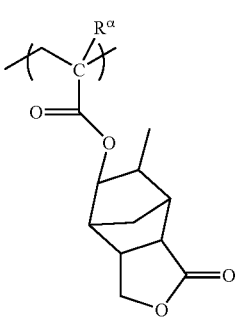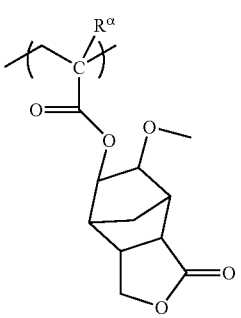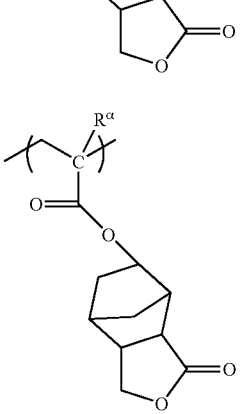

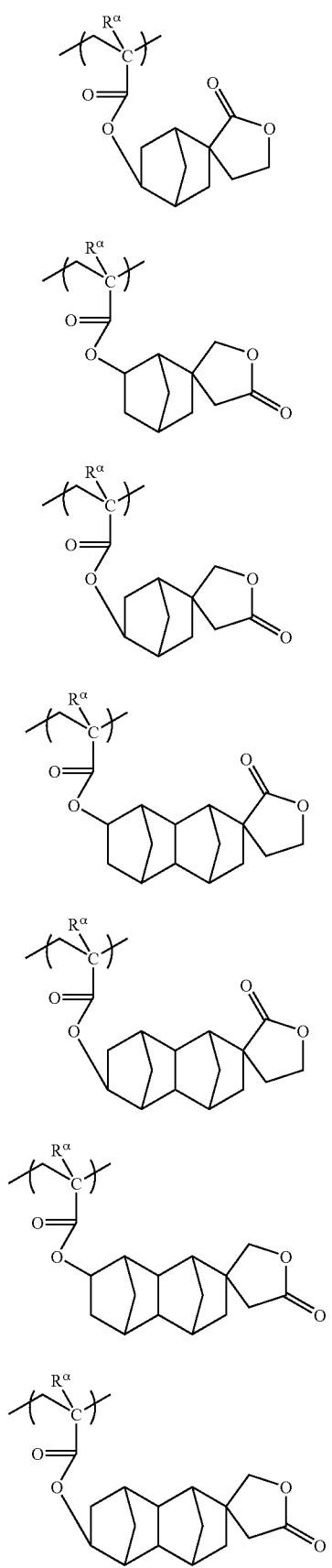
(a2-4-2)
(a2-4-3)
(a2-4-4)
(a2-4-5)
(a2-4-6)
(a2-4-7)
(a2-4-8)
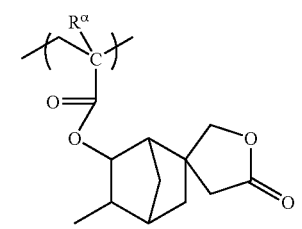
(a2-4-9)
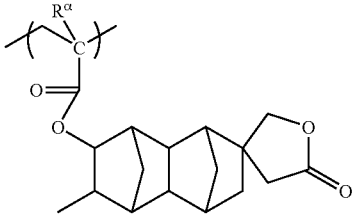
(a2-4-10)
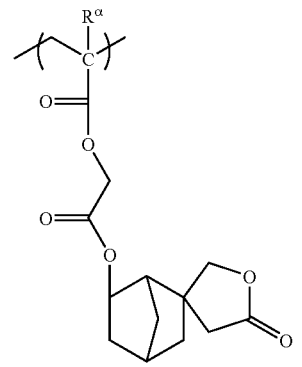
(a2-4-11)
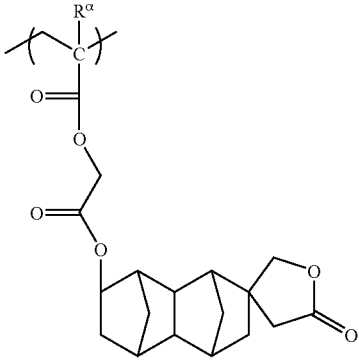
(a2-4-12)
[Chemical Formula 38]
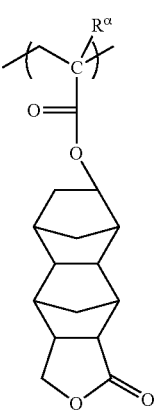
(a2-5-1)

(a2-5-2)

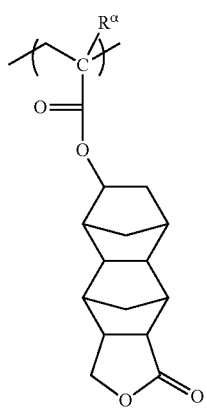

(a2-5-3)

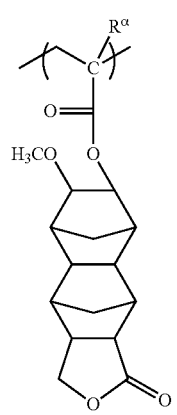

(a2-5-4)

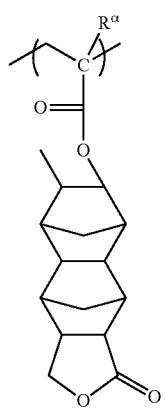

(a2-5-5)

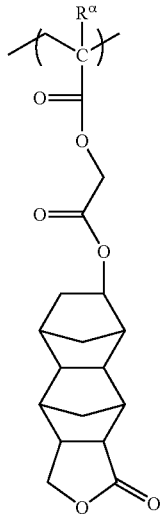

(a2-5-6)

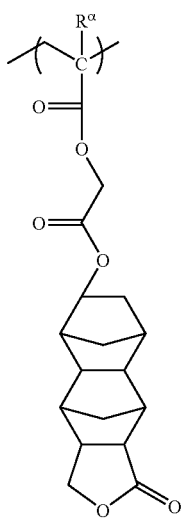

In the component (A1), as the structural unit (a2), one type of structural unit may be used alone, or two or more types of structural units may be used in combination.

In the present invention, in those cases where the component (A1) includes the structural unit (a2), the structural unit (a2) is preferably at least one structural unit selected from the group consisting of structural units represented by general formulas (a2-1) to (a2-5), and is more preferably at least one structural unit selected from the group consisting of structural units represented by general formulas (a2-1) to (a2-3). Of these, it is particularly preferable to use at least one structural unit selected from the group consisting of units represented by chemical formulas (a2-1-1), (a2-2-1), (a2-2-7), (a2-3-1) and (a2-3-5).

If the component (A1) includes the structural unit (a2), then in terms of improving the adhesion between a support such as a substrate and a resist film formed using a positive resist composition containing the component (A1), and increasing the compatibility with a developing solution, the amount of the structural unit (a2) within the component (A1), based on the combined total of all the structural units that constitute the component (A1), is preferably within a range from 5 to 50 mol %, more preferably from 5 to 45 mol %, and most preferably from 10 to 40 mol %. By using an amount of the structural unit (a2) that satisfies the above range, the adhesion of the resist composition to substrates, and lithography properties such as the LWR and resist pattern shape can be further improved.

<Structural Unit (a3)>

In the present invention, the component (A1) preferably also includes a structural unit (a3) derived from an acrylate ester containing a polar group-containing aliphatic hydrocarbon group, either in addition to the structural unit (a0), the structural unit (a5) and the structural unit (a1), or in addition to the structural unit (a0), the structural unit (a5), the structural unit (a1) and the structural unit (a2).

When the component (A1) includes the structural unit (a3), the hydrophilicity of the component (A) is improved, and hence, the compatibility of the component (A) with the developing solution is improved. As a result, the alkali solubility of the exposed portions improves, which contributes to favorable improvements in the resolution.

Examples of the polar group include a hydroxyl group, cyano group, carboxyl group, or hydroxyalkyl group in which some of the hydrogen atoms of the alkyl group have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and monocyclic or polycyclic aliphatic hydrocarbon groups (cyclic groups). These cyclic groups can be selected appropriately from the multitude of groups that have been proposed for the resins of resist compositions designed for use with ArF excimer lasers. The cyclic group preferably has 5 to 30 carbon atoms.

Of the various possibilities, structural units derived from an acrylate ester that includes an aliphatic polycyclic group that contains a hydroxyl group, cyano group, carboxyl group or a hydroxyalkyl group in which some of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 39]

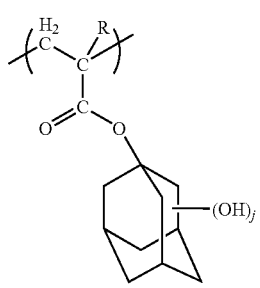

(a3-1)

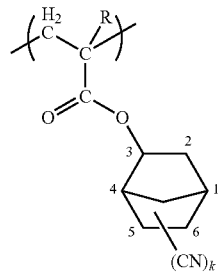

(a3-2)

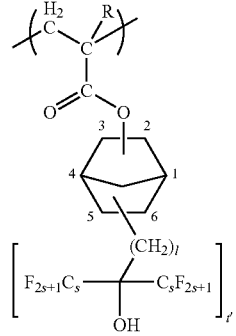

(a3-3)

In the formulas, R is the same as defined above, j is an integer of 1 to 3, k is an integer of 1 to 3, t' is an integer of 1 to 3, l is an integer of 1 to 5, and s is an integer of 1 to 3.

In formula (a3-1), j is preferably 1 or 2, and more preferably 1. When j is 2, it is preferable that the hydroxyl groups are bonded to the 3rd and 5th positions of the adamantyl group. When j is 1, it is preferable that the hydroxyl group is bonded to the 3rd position of the adamantyl group. j is preferably 1, and it is particularly desirable that the hydroxyl group is bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, in formula (a3-3), it is preferable that a 2-norbornyl group or 3-norbornyl group is bonded to the terminal of the carboxyl group of the acrylic acid. The fluorinated alkyl alcohol is preferably bonded to the 5th or 6th position of the norbornyl group.

As the structural unit (a3), one type of structural unit may be used alone, or two or more types may be used in combination.

The amount of the structural unit (a3), based on the combined total of all the structural units that constitute the component (A1), is preferably within a range from 5 to 50 mol %, more preferably from 5 to 40 mol %, and still more preferably from 5 to 25 mol %.

<Structural Unit (a4)>

In the present invention, the component (A1) may also include a structural unit (a4) described below, in addition to the structural unit (a0), the structural unit (a5) and the structural unit (a1). Including the structural unit (a4) within the component (A1) improves the heat resistance, resulting in a more favorable PEB margin. Further, the combination of the structural unit (a4) with the structural unit (a0) of comparatively high hydrophilicity imparts the component (A1) with a dissolution-inhibiting effect during the developing step, thereby preventing thickness loss of the resist pattern and contributing to an improvement in the pattern shape.

The structural unit (a4) is a structural unit represented by general formula (a4) shown below.

[Chemical Formula 40]

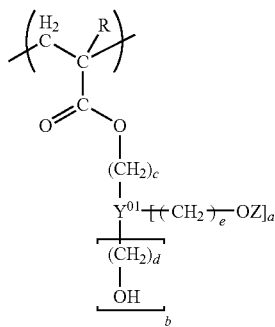

(a4)

In formula (a4), R represents a hydrogen atom, an alkyl group of 1 to 5 carbon atoms or a halogenated alkyl group of 1 to 5 carbon atoms, $Y^{01}$ represents an aliphatic cyclic group, Z represents a tertiary alkyl group-containing group or an alkoxyalkyl group, a represents an integer of 1 to 3 and b represents an integer of 0 to 2, provided that a+b=1 to 3, and each of c, d and e represents an integer of 0 to 3.

In general formula (a4), R is the same as defined above.

In general formula (a4), $Y^{01}$ represents an aliphatic cyclic group.

The "aliphatic cyclic group" in the structural unit (a4) may or may not have a substituent. Examples of this substituent include an alkyl group of 1 to 5 carbon atoms, a fluorine atom, a fluorinated alkyl group of 1 to 5 carbon atoms, and an oxygen atom (=O).

The structure of the basic ring of the "aliphatic cyclic group" exclusive of substituents (the aliphatic ring) is not limited to groups constituted solely from carbon and hydrogen (not limited to hydrocarbon groups), but is preferably a hydrocarbon ring. Further, the "hydrocarbon ring" may be either saturated or unsaturated, but is preferably saturated.

The aliphatic cyclic group may be either a polycyclic group or a monocyclic group. Examples of aliphatic cyclic groups include groups in which two or more hydrogen atoms have been removed from a monocycloalkane or a polycycloalkane such as a bicycloalkane, tricycloalkane or tetracycloalkane which may or may not be substituted with an alkyl group of 1 to 5 carbon atoms, a fluorine atom or a fluorinated alkyl group. Specific examples include groups in which two or more hydrogen atoms have been removed from a monocycloalkane such as cyclopentane or cyclohexane, and groups in which two or more hydrogen atoms have been removed from a polycycloalkane such as adamantane, norbornane, isobornane, tricyclodecane or tetracyclododecane.

The aliphatic cyclic group in the structural unit (a4) is preferably a polycyclic group, and is more preferably a group in which two or more hydrogen atoms have been removed from adamantane.

In general formula (a4), Z represents a tertiary alkyl group-containing group or an alkoxyalkyl group.

The "tertiary alkyl group-containing group" describes a group containing a tertiary alkyl group within its structure. The tertiary alkyl group-containing group may be composed solely of the tertiary alkyl group, or may be composed of the tertiary alkyl group and other atom(s) or group(s) besides the tertiary alkyl group.

Examples of these "other atom(s) or group(s) besides the tertiary alkyl group" that may constitute the tertiary alkyl group-containing group together with the tertiary alkyl group include a carbonyloxy group, carbonyl group, alkylene group or oxygen atom.

Examples of the tertiary alkyl group-containing group represented by Z include groups represented by the above formula —C($R^{71}$)($R^{72}$)($R^{73}$). Of such groups, a tert-butyl group or tert-pentyl group or the like is preferred, and a tert-butyl group is particularly desirable.

Examples of tertiary alkyl group-containing groups that do not contain a cyclic structure include the branched-chain tertiary alkyl groups described above, tertiary alkyl group-containing chain-like alkyl groups in which an aforementioned branched-chain tertiary alkyl group is bonded to a linear or branched alkylene group, tertiary alkyloxycarbonyl groups containing an aforementioned branched-chain tertiary alkyl group as the tertiary alkyl group, and tertiary alkyloxycarbonylalkyl groups containing an aforementioned branched-chain tertiary alkyl group as the tertiary alkyl group.

The alkylene group in the tertiary alkyl group-containing chain-like alkyl group is preferably an alkylene group of 1 to 5 carbon atoms, more preferably an alkylene group of 1 to 4 carbon atoms, and still more preferably an alkylene group of 1 or 2 carbon atoms.

Examples of the chain-like tertiary alkyloxycarbonyl groups include groups represented by the formula —C(=O)—O—C($R^{71}$)($R^{72}$)($R^{73}$). $R^{71}$ to $R^{73}$ are the same as defined above. As this chain-like tertiary alkyloxycarbonyl group, a tert-butyloxycarbonyl group (t-boc) or tert-pentyloxycarbonyl group is preferred.

Examples of the chain-like tertiary alkyloxycarbonylalkyl groups include groups represented by the formula —($CH_2$)$_f$—C(=O)—O—C($R^{71}$)($R^{72}$)($R^{73}$). $R^{71}$ to $R^{73}$ are the same as defined above. f represents an integer of 1 to 3, and is preferably 1 or 2. As this chain-like tertiary alkyloxycarbonylalkyl group, a tert-butyloxycarbonylmethyl group or tert-butyloxycarbonylethyl group is preferred.

Of the above groups, the tertiary alkyl group-containing group that does not contain a cyclic structure is preferably a tertiary alkyloxycarbonyl group or a tertiary alkyloxycarbonylalkyl group, is more preferably a tertiary alkyloxycarbonyl group, and is most preferably a tert-butyloxycarbonyl group (t-boc).

A tertiary alkyl group-containing groups containing a cyclic structure describes a group that contains a tertiary carbon atom and a cyclic structure within the group structure.

Examples of tertiary alkyl group-containing groups that contain a cyclic structure include groups represented by the above formulas (1-1) to (1-9) and (2-1) to (2-6).

Examples of the alkoxyalkyl group for Z include groups represented by the above formula (p1) and groups represented by a formula —$R^{74}$—O—$R^{75}$ (wherein $R^{74}$ represents a linear alkylene group of 1 to 5 carbon atoms, and $R^{75}$ is as defined for Y in the above formula p1).

Of the above options, Z is preferably a tertiary alkyl group-containing group, and is most preferably a tert-butyloxycarbonyl group (t-boc).

In general formula (a4), a represents an integer of 1 to 3 and b represents an integer of 0 to 2, provided that a+b=1 to 3.

a is preferably 1.

b is preferably 0.

a+b is preferably 1.

c represents an integer of 0 to 3, is preferably 0 or 1, and is most preferably 0.

d represents an integer of 0 to 3, is preferably 0 or 1, and is most preferably 0.

e represents an integer of 0 to 3, is preferably 0 or 1, and is most preferably 0.

As the structural unit (a4), structural units represented by general formula (a4-1) shown below are preferred.

[Chemical Formula 41]

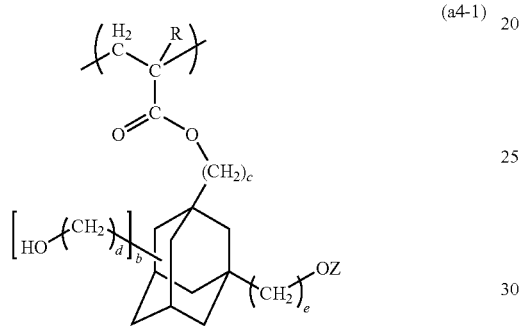

(a4-1)

In the formula, each of R, Z, b, c, d and e is the same as defined above.

<Other Structural Units>

The component (A1) may also include a structural unit (hereafter referred to as "structural unit (a6)") which is other than the above-mentioned structural units (a0) to (a4) and the structural unit (a5), as long as the effects of the present invention are not impaired.

As the structural unit (a6), any other structural unit which cannot be classified as one of the above structural units (a0) to (a4) or (a5) can be used without any particular limitation, and any of the multitude of conventional structural units used within resist resins for ArF excimer lasers or KrF excimer lasers (and particularly for ArF excimer lasers) may be used.

As the structural unit (a6), a structural unit derived from an acrylate ester which contains a non-acid-dissociable aliphatic polycyclic group is preferred. Examples of this polycyclic group include the same groups as those described above in connection with the aforementioned structural unit (a1), and any of the multitude of conventional polycyclic groups used within the resin component of resist compositions for ArF excimer lasers or KrF excimer lasers (and particularly for ArF excimer lasers) may be used.

In consideration of industrial availability and the like, at least one polycyclic group selected from amongst a tricyclodecanyl group, adamantyl group, tetracyclododecanyl group, isobornyl group, and norbornyl group is particularly desirable. These polycyclic groups may be substituted with a linear or branched alkyl group of 1 to 5 carbon atoms.

Specific examples of the structural unit (a6) include units with structures represented by general formulas (a6-1) to (a6-5) shown below.

[Chemical Formula 42]

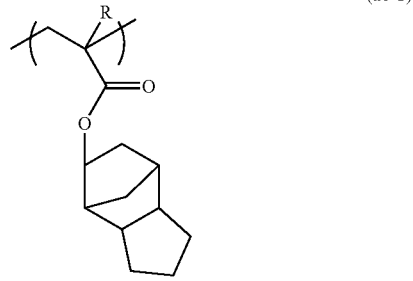

(a6-1)

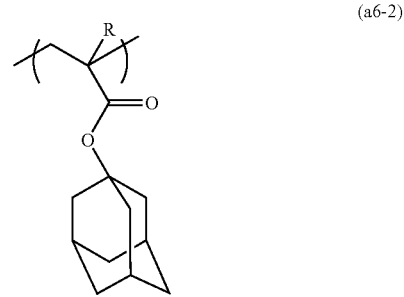

(a6-2)

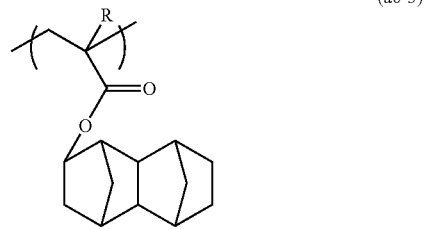

(a6-3)

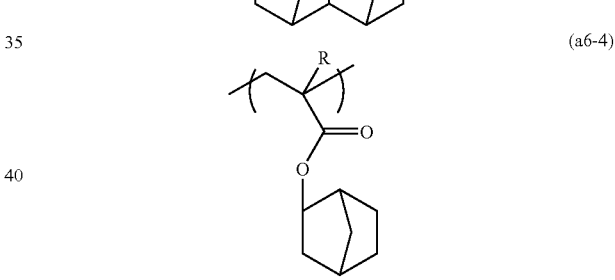

(a6-4)

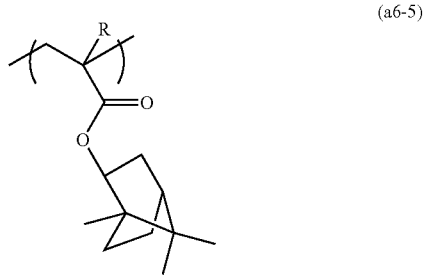

(a6-5)

In the formulas, R is the same as defined above.

When the structural unit (a6) is included in the component (A1), the amount of the structural unit (a6), based on the combined total of all the structural units that constitute the component (A1), is preferably within the range from 1 to 30 mol %, and more preferably from 10 to 20 mol %.

In the present invention, the component (A1) preferably includes the structural unit (a2) in addition to the structural unit (a0), the structural unit (a5) and the structural unit (a1). Further, the component (A1) preferably also includes the structural unit (a3) derived from an acrylate ester containing a polar group-containing aliphatic hydrocarbon group, either in addition to the structural unit (a0), the structural unit (a5) and the structural unit (a1), or in addition to the structural unit (a0), the structural unit (a5), the structural unit (a1) and the structural unit (a2). Furthermore, the component (A1) preferably includes the structural unit (a4) or the structural unit (a6) in addition to the structural unit (a0), the structural unit (a5) and the structural unit (a1).

In the present invention, the copolymers described above preferably include at least one, and preferably two or more, structural units selected from the group consisting of structural units represented by the above general formula (a1-0-11) as the structural unit (a1).

Furthermore, as mentioned above, the copolymer preferably includes at least two types of the structural unit (a1), and of these two types, at least one is preferably a structural unit selected from the group consisting of structural units represented by the above general formula (a1-0-11).

In the component (A), the amount of the component (A1), relative to the total weight of the component (A), is preferably at least 25% by weight, more preferably 50% by weight or more, still more preferably 75% by weight or more, and may even be 100% by weight. Provided the amount of the component (A1) is at least 25% by weight, various lithography properties can be improved.

In the component (A), for the copolymer (A1), either a single type of copolymer may be used alone, or two or more types of copolymers may be used in combination.

In the present invention, copolymers containing combinations of the types of structural units shown below are particularly preferred as the copolymer (A1).

[Chemical Formula 43]

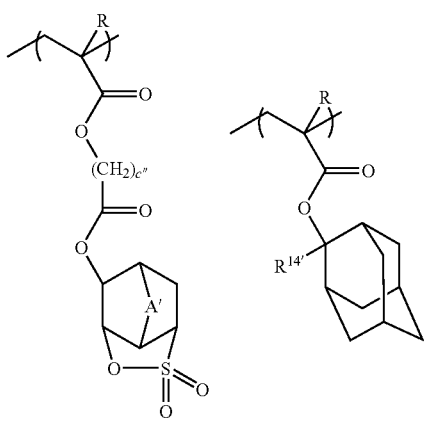

(A1-11)

[Chemical Formula 44]

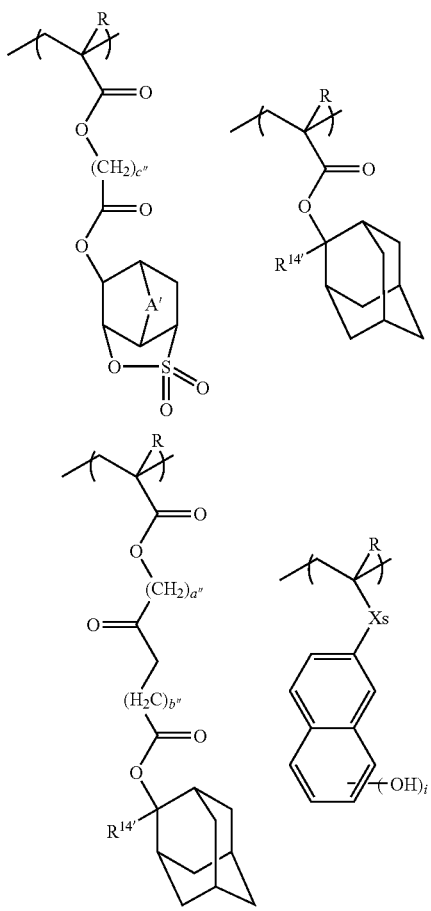

(A1-12)

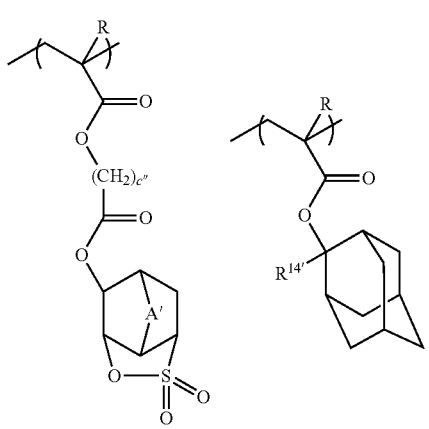

(A1-13)

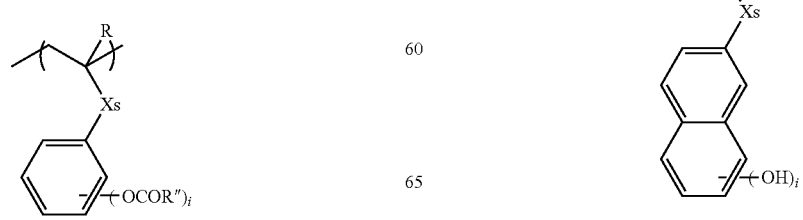

-continued (A1-14)

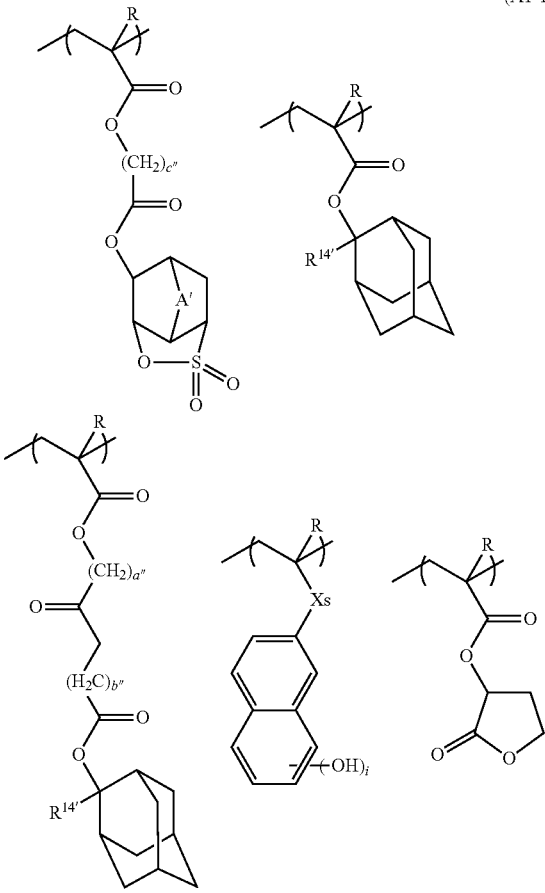

In formulas (A1-11) to (A1-14), R is the same as defined above, the plurality of R groups may be the same or different, and $X_S$ is the same as defined above. Further R" is the same as defined above, $R^{14"}$ represents an alkyl group of 1 to 5 carbon atoms, i represents an integer of 0 to 5, each of a", b" and c" represents an integer of 1 to 3, and A' is the same as defined above.

In formulas (A1-11) to (A1-14), the alkyl group of 1 to 5 carbon atoms for $R^{14"}$ is the same as the alkyl group of 1 to 5 carbon atoms described for R, is preferably a methyl group or ethyl group, and is most preferably a methyl group.

In formulas (A1-11) to (A1-14), A' is the same as defined above for A' in general formula (a5-1-01), and is preferably an oxygen atom, a methylene group or an ethylene group.

The component (A1) can be obtained, for example, by a conventional radical polymerization or the like of the monomers corresponding with each of the structural units, using a radical polymerization initiator such as azobisisobutyronitrile (AIBN).

Furthermore, in the component (A1), by using a chain transfer agent such as HS—$CH_2$—$CH_2$—$CH_2$—$C(CF_3)_2$—OH during the above polymerization, a —$C(CF_3)_2$—OH group can be introduced at the terminals of the component (A1). Such a copolymer having an introduced hydroxyalkyl group in which some of the hydrogen atoms of the alkyl group have been substituted with fluorine atoms is effective in reducing developing defects and LER (line edge roughness: unevenness of the side walls of a line pattern).

In terms of the monomers used for forming each of the structural units, either commercially available monomers may be used, or the monomers may be synthesized using conventional methods.

For example, examples of the monomer for forming the structural unit (a5) include compounds represented by general formula (I) shown below (and hereafter referred to as "compound (I)").

[Chemical Formula 45]

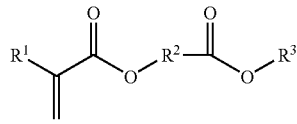

(I)

In formula (I), $R^1$ to $R^3$ are the same as defined above.

The method for producing the compound (I) is not particularly limited, and the compound (I) can be produced using a conventional method. For example, a compound (X-2) represented by general formula (X-2) shown below may be added, in the presence of a base, to a solution obtained by dissolving a compound (X-1) represented by general formula (X-1) shown below in a reaction solvent, and a reaction then performed to obtain the compound (I).

Examples of the base include inorganic bases such as sodium hydride, $K_2CO_3$ and $Cs_2CO_3$, and organic bases such as triethylamine, 4-dimethylaminopyridine (DMAP) and pyridine. Examples of condensing agents that may be used include carbodiimide reagents such as ethyldiisopropylaminocarbodiimide hydrochloride (EDCI), dicyclohexylcarboxylmide (DCC), diisopropylcarbodiimide and carbodiimidazole, as well as tetraethyl pyrophosphate and benzotriazole-N-hydroxytrisdimethylaminophosphonium hexafluorophosphide (Bop reagent).

If desired, an acid may be used. As the acid, any acid generally used for dehydration/condensation reactions may be used. Specific examples include inorganic acids such as hydrochloric acid, sulfuric acid and phosphoric acid, and organic acids such as methanesulfonic acid, trifluoromethanesulfonic acid, benzenesulfonic acid and p-toluenesulfonic acid. These acids may be used individually, or two or more acids may be used in combination.

[Chemical Formula 46]

 (X-1)

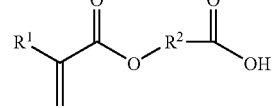 (X-2)

The weight average molecular weight (Mw) (the polystyrene equivalent value determined by gel permeation chromatography) of the component (A1) is not particularly limited, but is preferably within a range from 1,000 to 50,000, more preferably from 3,000 to 30,000, and most preferably from 5,000 to 20,000. By ensuring that the weight average molecular weight is no more than the upper limit of the above-mentioned range, the polymeric compound (A1) exhibits satisfactory solubility in a resist solvent when used as a resist. On the other hand, by ensuring that the weight average molecular weight is at least as large as the lower limit of the above-mentioned range, the dry etching resistance and cross-sectional shape of the resist pattern can be improved.

Further, the dispersity (Mw/Mn) is preferably within a range from 1.0 to 5.0, more preferably from 1.0 to 3.0, and most preferably from 1.0 to 2.5. Here, Mn is the number average molecular weight.

In the resist composition of the present invention, the component (A) may contain "a base component which exhibits increased solubility in an alkali developing solution under action of acid" other than the component (A1) (hereafter, referred to as "component (A2)").

The component (A2) is not particularly limited, and any of the multitude of conventional base components used within chemically amplified resist compositions (such as base resins used within chemically amplified resist compositions for ArF excimer lasers or KrF excimer lasers, and preferably ArF excimer lasers) can be used. For example, as a base resin for use with an ArF excimer laser, a base resin having the aforementioned structural unit (a1) as an essential component, and optionally containing the aforementioned structural units (a2) to (a4), can be used.

As the component (A2), one type of resin may be used alone, or two or more types of resins may be used in combination.

In the resist composition of the present invention, the amount of the component (A) can be adjusted appropriately depending on factors such as the thickness of the resist film that is to be formed.

<Component (B)>

As the component (B), there are no particular limitations, and any of the known acid generators used in conventional chemically amplified resist compositions can be used. Examples of these acid generators are numerous, and include onium salt acid generators such as iodonium salts and sulfonium salts, oxime sulfonate acid generators; diazomethane acid generators such as bisalkyl or bisaryl sulfonyl diazomethanes and poly(bis-sulfonyl)diazomethanes, nitrobenzylsulfonate acid generators, iminosulfonate acid generators, and disulfone acid generators.

As the onium salt acid generator, a compound represented by general formula (b-1) or (b-2) shown below can be used.

[Chemical Formula 47]

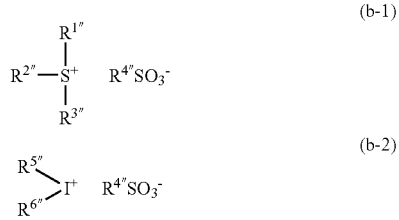

In the formulas above, $R^{1\prime\prime}$ to $R^{3\prime\prime}$, $R^{5\prime\prime}$ and $R^{6\prime\prime}$ each represents an aryl group or alkyl group, wherein two of $R^{1\prime\prime}$ to $R^{3\prime\prime}$ may be bonded to each other to form a ring with the sulfur atom, and $R^{4\prime\prime}$ represents an alkyl group, a halogenated alkyl group, an aryl group or an alkenyl group which may have a substituent, with the provisions that at least one of $R^{1\prime\prime}$ to $R^{3\prime\prime}$ represents an aryl group, and at least one of $R^{5\prime\prime}$ and $R^{6\prime\prime}$ represents an aryl group.

In formula (b-1), each of $R^{1\prime\prime}$ to $R^{3\prime\prime}$ represents an aryl group or an alkyl group. In formula (b-1), two of $R^{1\prime\prime}$ to $R^{3\prime\prime}$ may be bonded to each other to form a ring with the sulfur atom.

Further, among $R^{1\prime\prime}$ to $R^{3\prime\prime}$, at least one group represents an aryl group. Among $R^{1\prime\prime}$ to $R^{3\prime\prime}$, two or more groups are preferably aryl groups, and it is particularly desirable that all of $R^{1\prime\prime}$ to $R^{3\prime\prime}$ are aryl groups.

The aryl group for $R^{1\prime\prime}$ to $R^{3\prime\prime}$ is not particularly limited. For example, an aryl group having 6 to 20 carbon atoms may be used in which part or all of the hydrogen atoms of the aryl group may or may not be substituted with alkyl groups, alkoxy groups, halogen atoms or hydroxyl groups.

The aryl group is preferably an aryl group having 6 to 10 carbon atoms because it can be synthesized at a low cost. Specific examples thereof include a phenyl group and a naphthyl group.

The alkyl group with which hydrogen atoms of the aryl group may be substituted is preferably an alkyl group having 1 to 5 carbon atoms, and is most preferably a methyl group, ethyl group, propyl group, n-butyl group or tert-butyl group.

The alkoxy group with which hydrogen atoms of the aryl group may be substituted is preferably an alkoxy group having 1 to 5 carbon atoms, more preferably a methoxy group, ethoxy group, n-propoxy group, iso-propoxy group, n-butoxy group or tert-butoxy group, and is most preferably a methoxy group or an ethoxy group.

The halogen atom with which hydrogen atoms of the aryl group may be substituted is preferably a fluorine atom.

The alkyl group for $R^{1\prime\prime}$ to $R^{3\prime\prime}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, ethyl group, n-propyl group, isopropyl group, n-butyl group, isobutyl group, n-pentyl group, cyclopentyl group, hexyl group, cyclohexyl group, nonyl group and decanyl group. Of these, a methyl group is most preferable because it yields excellent resolution and can be synthesized at low cost.

When two of $R^{1\prime\prime}$ to $R^{3\prime\prime}$ in formula (b-1) are bonded to each other to form a ring with the sulfur atom, it is preferable that the two of $R^{1\prime\prime}$ to $R^{3\prime\prime}$ form a 3- to 10-membered ring including the sulfur atom, and it is particularly desirable that the two of $R^{1\prime\prime}$ to $R^{3\prime\prime}$ form a 5- to 7-membered ring including the sulfur atom.

When two of $R^{1\prime\prime}$ to $R^{3\prime\prime}$ in formula (b-1) are bonded to each other to form a ring with the sulfur atom, the remaining one of $R^{1\prime\prime}$ to $R^{3\prime\prime}$ is preferably an aryl group. Examples of this aryl group include the same groups as those mentioned above for the aryl groups for $R^{1\prime\prime}$ to $R^{3\prime\prime}$.

Preferred examples of the cation moiety for the compound represented by formula (b-1) include those moieties represented by formulas (I-1-1) to (I-1-10) shown below. Among these, a cation moiety having a triphenylsulfonium skeleton, such as a cation moiety represented by any one of formulas (I-1-1) to (I-1-8) shown below is particularly desirable.

In formulas (I-1-9) and (I-1-10), each of $R^9$ and $R^{10}$ represents a phenyl group or naphthyl group which may have a substituent.

u represents an integer of 1 to 3, and is most preferably 1 or 2.

[Chemical Formula 48]

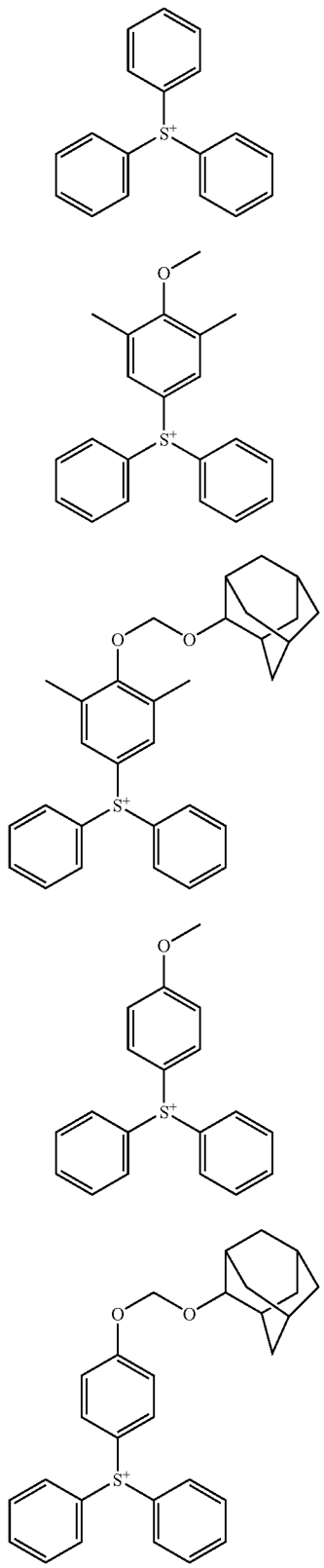

(I-1-1)
(I-1-2)
(I-1-3)
(I-1-4)
(I-1-5)

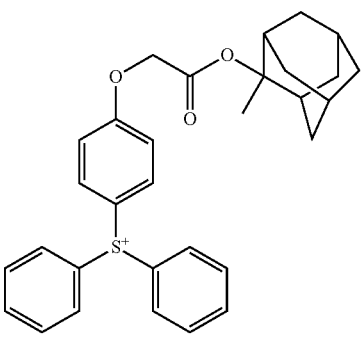

(I-1-6)
(I-1-7)

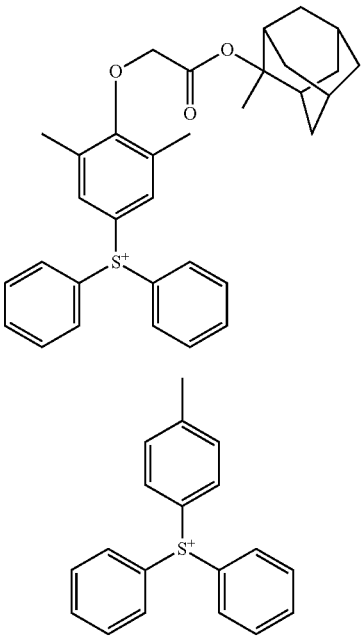

(I-1-8)

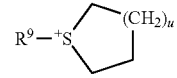

(I-1-9)

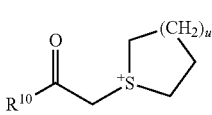

(I-1-10)

$R^{4'''}$ represents an alkyl group, a halogenated alkyl group, an aryl group or an alkenyl group which may have a substituent.

The alkyl group for $R^{4'''}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

Examples of the halogenated alkyl group for $R^{4'''}$ include groups in which part or all of the hydrogen atoms of an aforementioned linear, branched or cyclic alkyl group have been substituted with halogen atoms. Examples of the halogen atoms include a fluorine atom, chlorine atom, bromine atom or iodine atom, and a fluorine atom is preferable.

In the halogenated alkyl group, the percentage of the number of halogen atoms relative to the total number of halogen atoms and hydrogen atoms within the hydroxyalkyl group (namely, the halogenation ratio (%)) is preferably within a range from 10 to 100%, more preferably from 50 to 100%, and most preferably 100%. A higher halogenation ratio is preferable because the acid strength increases.

The aryl group for $R^{4''}$ is preferably an aryl group of 6 to 20 carbon atoms.

The alkenyl group for $R^{4''}$ is preferably an alkenyl group of 2 to 10 carbon atoms.

With respect to $R^{4''}$, the expression "may have a substituent" means that part or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4''}$ may have one substituent, or two or more substituents.

Examples of the substituent include a halogen atom, a hetero atom, an alkyl group, and a group represented by the formula $X-Q^1-$ (wherein $Q^1$ represents a divalent linking group containing an oxygen atom, and X represents a hydrocarbon group of 3 to 30 carbon atoms which may have a substituent).

Examples of the halogen atoms and alkyl groups as substituents for $R^{4''}$ include the same halogen atoms and alkyl groups as those described above with respect to the halogenated alkyl group for $R^{4''}$.

Examples of the hetero atoms include an oxygen atom, a nitrogen atom, and a sulfur atom.

In the group represented by formula $X-Q^1-$, $Q^1$ represents a divalent linking group containing an oxygen atom.

$Q^1$ may contain an atom other than the oxygen atom. Examples of this atom other than the oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond, —O—), an ester bond (—C(=O)—O—), an amido bond (—C(=O)—NH—), a carbonyl group (—C(=O)—), a carbonate linkage (—O—C(=O)—O—), and combinations of the aforementioned non-hydrocarbon, hetero atom-containing linking groups with an alkylene group.

Specific examples of the combinations of the aforementioned non-hydrocarbon, hetero atom-containing linking groups and an alkylene group include —$R^{91}$—O—, —$R^{92}$—O—C(=O)—, and —C(=O)—O—$R^{93}$—O—C(=O)— (wherein each of $R^{91}$ to $R^{93}$ represents an alkylene group).

The alkylene group for $R^{91}$ to $R^{93}$ is preferably a linear or branched alkylene group, and preferably has 1 to 12 carbon atoms, more preferably 1 to 5 carbon atoms, and most preferably 1 to 3 carbon atoms.

Specific examples of the alkylene group include a methylene group [—CH$_2$—], alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—, an ethylene group [—CH$_2$CH$_2$—], alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—, a trimethylene group (n-propylene group) [—CH$_2$CH$_2$CH$_2$—], alkyltrimethylene groups such as —CH(CH$_3$)CH$_2$CH$_2$— and —CH$_2$CH(CH$_3$)CH$_2$—, a tetramethylene group [—CH$_2$CH$_2$CH$_2$CH$_2$—], alkyltetramethylene groups such as —CH(CH$_3$)CH$_2$CH$_2$CH$_2$— and —CH$_2$CH(CH$_3$)CH$_2$CH$_2$—, and a pentamethylene group [—CH$_2$CH$_2$CH$_2$CH$_2$CH$_2$—].

$Q^1$ is preferably a divalent linking group containing an ester linkage or ether linkage, and is more preferably a group represented by —$R^{91}$—O—, —$R^{92}$—O—C(=O)— or —C(=O)—O—$R^{93}$—O—C(=O)—.

In the group represented by the formula $X-Q^1-$, the hydrocarbon group for X may be either an aromatic hydrocarbon group or an aliphatic hydrocarbon group.

The aromatic hydrocarbon group is a hydrocarbon group having an aromatic ring. The aromatic hydrocarbon ring preferably has 3 to 30 carbon atoms, more preferably 5 to 30, still more preferably 5 to 20, still more preferably 6 to 15, and most preferably 6 to 12 carbon atoms. Here, the number of carbon atoms within a substituent(s) is not included in the number of carbon atoms of the aromatic hydrocarbon group.

Specific examples of the aromatic hydrocarbon group include aryl groups, which are aromatic hydrocarbon rings having one hydrogen atom removed therefrom, such as a phenyl group, biphenyl group, fluorenyl group, naphthyl group, anthryl group or phenanthryl group, and alkylaryl groups such as a benzyl group, phenethyl group, 1-naphthylmethyl group, 2-naphthylmethyl group, 1-naphthylethyl group, or 2-naphthylethyl group. The alkyl chain within the arylalkyl group preferably has 1 to 4 carbon atoms, more preferably 1 or 2 carbon atoms, and most preferably 1 carbon atom.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

Examples of the former include heteroaryl groups in which some of the carbon atoms constituting the ring within an aforementioned aryl group have been substituted with a hetero atom such as an oxygen atom, a sulfur atom or a nitrogen atom, and heteroarylalkyl groups in which a portion of the carbon atoms constituting the aromatic hydrocarbon ring within an aforementioned arylalkyl group have been substituted with an aforementioned hetero atom.

In the latter example, examples of the substituent for the aromatic hydrocarbon group include an alkyl group, an alkoxy group, a halogen atom, a halogenated alkyl group, a hydroxyl group or an oxygen atom (=O) or the like.

The alkyl group as the substituent for the aromatic hydrocarbon group is preferably an alkyl group of 1 to 5 carbon atoms, and a methyl group, ethyl group, propyl group, n-butyl group or tert-butyl group is particularly desirable.

The alkoxy group as the substituent for the aromatic hydrocarbon group is preferably an alkoxy group having 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Examples of the halogenated alkyl group as the substituent for the aromatic hydrocarbon group includes a group in which part or all of the hydrogen atoms within the aforementioned alkyl group have been substituted with the aforementioned halogen atoms.

The aliphatic hydrocarbon group for X may be either a saturated aliphatic hydrocarbon group, or an unsaturated aliphatic hydrocarbon group. Further, the aliphatic hydrocarbon group may be linear, branched or cyclic.

In the aliphatic hydrocarbon group for X, a portion of the carbon atoms that constitute the aliphatic hydrocarbon group may be substituted with a substituent group containing a hetero atom, or a part or all of the hydrogen atoms constituting the aliphatic hydrocarbon group may be substituted with a substituent group containing a hetero atom.

As this "hetero atom" within X, there is no particular limitation as long as it is an atom other than a carbon atom and a hydrogen atom. Examples of the hetero atom include a halogen atom, an oxygen atom, a sulfur atom and a nitrogen atom. Examples of the halogen atom include a fluorine atom, a chlorine atom, an iodine atom and a bromine atom.

The substituent group containing a hetero atom may consist solely of the hetero atom, or may be a group containing a group or atom other than the hetero atom.

Specific examples of the substituent group for substituting a portion of the carbon atoms include —O—, —C(=O)—O—, —C(=O)—, —O—C(=O)—O—, —C(=O)—NH—, —NH— (wherein H may be replaced with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituent groups within the ring structure.

Examples of the substituent group for substituting part or all of the hydrogen atoms include an alkoxy group, a halogen atom, a halogenated alkyl group, a hydroxyl group, an oxygen atom (=O) and a cyano group.

The alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom include a fluorine atom, a chlorine atom, a bromine atom and an iodine atom, and a fluorine atom is preferable.

Examples of the halogenated alkyl group include groups in which part or all of the hydrogen atoms within an alkyl group of 1 to 5 carbon atoms (such as a methyl group, ethyl group, propyl group, n-butyl group or tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15 carbon atoms, and most preferably 1 to 10 carbon atoms. Specific examples include a methyl group, ethyl group, propyl group, butyl group, pentyl group, hexyl group, heptyl group, octyl group, nonyl group, decanyl group, undecyl group, dodecyl group, tridecyl group, isotridecyl group, tetradecyl group, pentadecyl group, hexadecyl group, isohexadecyl group, heptadecyl group, octadecyl group, nonadecyl group, eicosyl group, heneicosyl group or docosyl group.

The branched saturated hydrocarbon group (alkyl group) preferably has 3 to 20 carbon atoms, more preferably 3 to 15 carbon atoms, and most preferably 3 to 10 carbon atoms. Specific examples include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group or 4-methylpentyl group.

The unsaturated hydrocarbon group preferably has 2 to 10 carbon atoms, more preferably 2 to 5, still more preferably 2 to 4, and most preferably 3 carbon atoms. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30, still more preferably 5 to 20, still more preferably 6 to 15, and most preferably 6 to 12 carbon atoms.

Examples of the aliphatic cyclic group include groups in which one or more hydrogen atoms have been removed from a monocycloalkane or a polycycloalkane such as a bicycloalkane, tricycloalkane or tetracycloalkane. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and most preferably a group in which one or more hydrogen atoms have been removed from adamantane.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic groups include groups represented by formulas (L1) to (L5) and (S1) to (S4) shown below.

[Chemical Formula 49]

(L1)

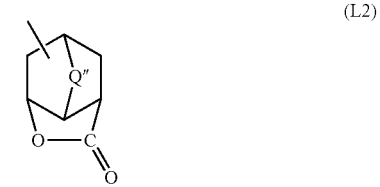

(L2)

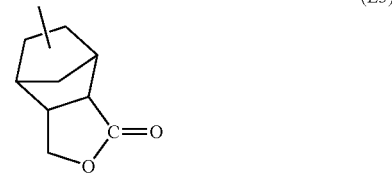

(L3)

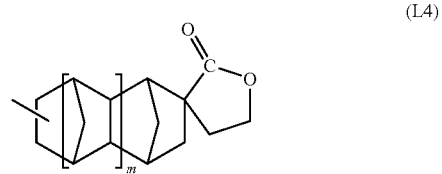

(L4)

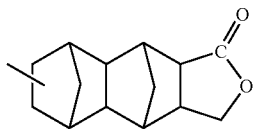
(L5)

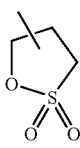
(S1)

(S2)

(S3)

(S4)

In the formulas, Q" represents an alkylene group of 1 to 5 carbon atoms, —O—, —S—, —O—$R^{94}$— or —S—$R^{95}$—, wherein each of $R^{94}$ and $R^{95}$ represents an alkylene group of 1 to 5 carbon atoms, and m represents an integer of 0 or 1.

Examples of the alkylene groups for Q", $R^{94}$ and $R^{95}$ include the same alkylene groups as those described above for $R^{91}$ to $R^{93}$.

In these aliphatic cyclic groups, part of the hydrogen atoms bonded to the carbon atoms that constitute the ring structure may be substituted with a substituent. Examples of this substituent include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, ethyl group, propyl group, n-butyl group or tert-butyl group is particularly desirable.

Examples of the alkoxy group and the halogen atom include the same groups as those exemplified above for the substituent group used for substituting part or all of the hydrogen atoms.

In the present invention, X is preferably a cyclic group which may have a substituent. This cyclic group may be either an aromatic hydrocarbon group which may have a substituent, or an aliphatic cyclic group which may have a substituent, although an aliphatic cyclic group which may have a substituent is preferable.

As the aromatic hydrocarbon group, a naphthyl group which may have a substituent or a phenyl group which may have a substituent is preferable.

As the aliphatic cyclic group which may have a substituent, an aliphatic polycyclic group which may have a substituent is preferable. As this aliphatic polycyclic group, groups in which one or more hydrogen atoms have been removed from an aforementioned polycycloalkane, and groups represented by formulas (L2) to (L5), and (S3) and (S4) above are preferable.

In the present invention, in those cases where $R^{4\prime\prime\prime}$ includes X-$Q^1$- as a substituent, $R^{4\prime\prime\prime}$ is preferably a group represented by the formula X-$Q^1$-$Y^1$— (wherein $Q^1$ and X are the same as defined above, and $Y^1$ represents an alkylene group of 1 to 4 carbon atoms which may have a substituent, or a fluorinated alkylene group of 1 to 4 carbon atoms which may have a substituent).

In the group represented by the formula X-$Q^1$-$Y^1$-, examples of the alkylene group represented by $Y^1$ include those alkylene groups described above for $Q^1$ in which the number of carbon atoms is from 1 to 4.

Examples of the fluorinated alkylene group include groups in which part or all of the hydrogen atoms of an aforementioned alkylene group have been substituted with fluorine atoms.

Specific examples of $Y^1$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_2CF_3)$—, —$C(CF_3)(CF_2CF_3)$—; —CHF—, —$CH_2CF_2$—, —$CH_2CH_2CF_2$—, —$CH_2CF_2CF_2$—, —$CH(CF_3)CH_2$—, —$CH(CF_2CF_3)$—, —$C(CH_3)(CF_3)$—, —$CH_2CH_2CH_2CF_2$—, —$CH_2CH_2CF_2CF_2$—, —$CH(CF_3)CH_2CH_2$—, —$CH_2CH(CF_3)CH_2$—, —$CH(CF_3)CH(CF_3)$—, —$C(CF_3)_2CH_2$—; —$CH_2$—, —$CH_2CH_2$—, —$CH_2CH_2CH_2$—, —$CH(CH_3)CH_2$—, —$CH(CH_2CH_3)$—, —$C(CH_3)_2$—, —$CH_2CH_2CH_2CH_2$—, —$CH(CH_3)CH_2CH_2$—, —$CH_2CH(CH_3)CH_2$—, —$CH(CH_3)CH(CH_3)$—, —$C(CH_3)_2CH_2$—, —$CH(CH_2CH_3)CH_2$—, —CH($CH_2CH_2CH_3$)— and —$C(CH_3)(CH_2CH_3)$—.

$Y^1$ is preferably a fluorinated alkylene group, and particularly preferably a fluorinated alkylene group in which the carbon atom bonded to the adjacent sulfur atom is fluorinated. Examples of such fluorinated alkylene groups include —$CF_2$—, —$CF_2CF_2$—, —$CF_2CF_2CF_2$—, —$CF(CF_3)CF_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—; —$CH_2CF_2$—, —$CH_2CH_2CF_2$—, —$CH_2CF_2CF_2$—; —$CH_2CH_2CH_2CF_2$—, —$CH_2CH_2CF_2CF_2$—, and —$CH_2CF_2CF_2CF_2$—.

Of these, —$CF_2$—, —$CF_2CF_2$—, —$CF_2CF_2CF_2$— or $CH_2CF_2$— is preferable, —$CF_2$—, —$CF_2CF_2$— or —$CH_2CF_2$— is more preferable, and —$CH_2F_2$— is particularly desirable.

The alkylene group or fluorinated alkylene group may have a substituent. The expression that the alkylene group or fluorinated alkylene group "may have a substituent" means that part or all of the hydrogen atoms or fluorine atoms in the alkylene group or fluorinated alkylene group may be substituted, either with atoms other than hydrogen atoms and fluorine atoms, or with groups.

Examples of the substituents which the alkylene group or fluorinated alkylene group may have include alkyl groups of 1 to 4 carbon atoms, alkoxy groups of 1 to 4 carbon atoms, and a hydroxyl group.

In formula (b-2), each of $R^{5\prime\prime\prime}$ and $R^{6\prime\prime\prime}$ represents an aryl group or an alkyl group. At least one of $R^{5\prime\prime\prime}$ and $R^{6\prime\prime\prime}$ represents an aryl group. It is preferable that both of $R^{5\prime\prime\prime}$ and $R^{6\prime\prime\prime}$ represent aryl groups.

Examples of the aryl group for $R^{5\prime\prime\prime}$ and $R^{6\prime\prime\prime}$ include the same aryl groups as those listed above for $R^{1\prime\prime\prime}$ to $R^{3\prime\prime\prime}$.

Examples of the alkyl group for $R^{5''}$ and $R^{6''}$ include the same alkyl groups as those listed above for $R^{1''}$ to $R^{3''}$.

It is particularly desirable that both of $R^{5''}$ and $R^{6''}$ represent phenyl groups.

As $R^{4''}$ in formula (b-2), the same groups as those mentioned above for $R^{4''}$ in formula (b-1) can be used.

Specific examples of onium salt acid generators represented by formula (b-1) or (b-2) include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, tri(4-tert-butyl)phenylsulfonium trifluoromethanesulfonate, heptafluoropropanesulfonate or nonafluorobutanesulfonate, diphenyl(1-(4-methoxy)naphthyl)sulfonium trifluoromethanesulfonate, heptafluoropropanesulfonate or nonafluorobutanesulfonate, di(1-naphthyl)phenylsulfonium trifluoromethanesulfonate, heptafluoropropanesulfonate or nonafluorobutanesulfonate, 1-phenyltetrahydrothiophenium trifluoromethanesulfonate, heptafluoropropanesulfonate or nonafluorobutanesulfonate, 1-(4-methylphenyl)tetrahydrothiophenium trifluoromethanesulfonate, heptafluoropropanesulfonate or nonafluorobutanesulfonate, 1-(3,5-dimethyl-4-hydroxyphenyl)tetrahydrothiophenium trifluoromethanesulfonate, heptafluoropropanesulfonate or nonafluorobutanesulfonate, 1-(4-methoxynaphthalene-1-yl)tetrahydrothiophenium trifluoromethanesulfonate, heptafluoropropanesulfonate or nonafluorobutanesulfonate, 1-(4-ethoxynaphthalene-1-yl)tetrahydrothiophenium trifluoromethanesulfonate, heptafluoropropanesulfonate or nonafluorobutanesulfonate, 1-(4-n-butoxynaphthalene-1-yl)tetrahydrothiophenium trifluoromethanesulfonate, heptafluoropropanesulfonate or nonafluorobutanesulfonate, 1-phenyltetrahydrothiopyranium trifluoromethanesulfonate, heptafluoropropanesulfonate or nonafluorobutanesulfonate, 1-(4-hydroxyphenyl)tetrahydrothiopyranium trifluoromethanesulfonate, heptafluoropropanesulfonate or nonafluorobutanesulfonate, 1-(3,5-dimethyl-4-hydroxyphenyl)tetrahydrothiopyranium trifluoromethanesulfonate, heptafluoropropanesulfonate or nonafluorobutanesulfonate, and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts are replaced by an alkylsulfonate such as methanesulfonate, n-propanesulfonate, n-butanesulfonate or n-octanesulfonate.

Furthermore, onium salts in which the anion moiety of these onium salts are replaced by an anion moiety represented by any one of formulas (b1) to (b8) shown below can also be used.

[Chemical Formula 50]

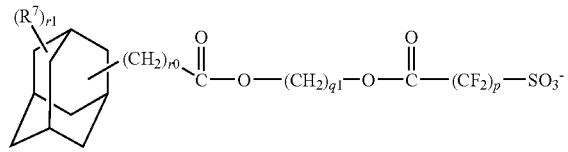

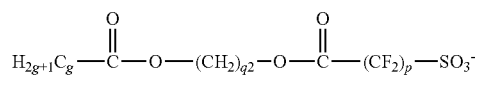

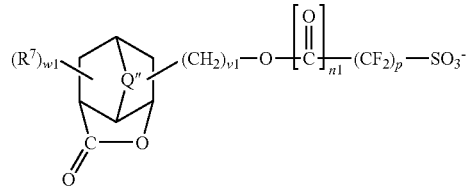

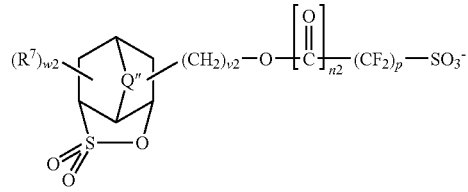

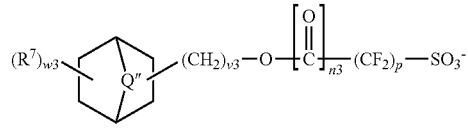

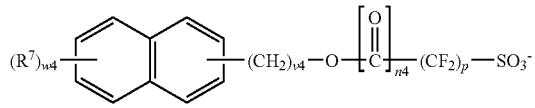

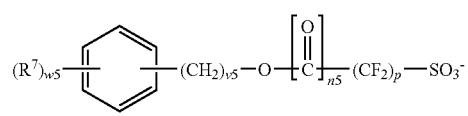

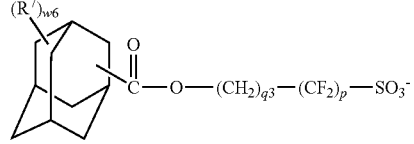

In the formulas, each p independently represents an integer of 1 to 3, each of q1 to q3 represents an integer of 1 to 5, r represents an integer of 0 to 3, g represents an integer of 1 to 20, $R^7$ represents a substituent, each of n1 to n5 represents 0 or 1, each of v1 to v5 represents an integer of 0 to 3, each of w1 to w6 represents an integer of 0 to 3, and Q'' is the same as defined above.

Examples of the substituent for $R^7$ include the same groups as those which the aforementioned aliphatic hydrocarbon group or aromatic hydrocarbon group for X may have as a substituent.

If there are two or more $R^7$ groups, as indicated by the values r1 or w1 to w6, then the plurality of $R^7$ groups within the compound may be the same or different from each other.

Further, onium salt-based acid generators in which the anion moiety in general formula (b-1) or (b-2) is replaced by an anion moiety represented by general formula (b-3) or (b-4) shown below (but the cation moiety is the same as (b-1) or (b-2)) may also be used as the onium salt-based acid generator.

[Chemical Formula 51]

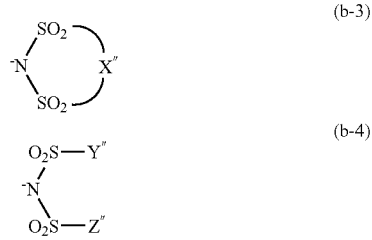

In formulas (b-3) and (b-4) above, X" represents an alkylene group of 2 to 6 carbon atoms in which at least one hydrogen atom has been substituted with a fluorine atom, and each of Y" and Z" represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and this alkylene group has 2 to 6 carbon atoms, preferably 3 to 5 carbon atoms, and most preferably 3 carbon atoms.

Each of Y" and Z" represents a linear or branched alkyl group in which at least one hydrogen atom has been substituted with a fluorine atom, and this alkyl group has 1 to 10 carbon atoms, preferably 1 to 7 carbon atoms, and most preferably 1 to 3 carbon atoms.

The smaller the number of carbon atoms in the alkylene group for X" or the alkyl group for Y" and Z" within the above-mentioned range of the number of carbon atoms, the more the solubility in a resist solvent is improved, and therefore a smaller number is preferred.

Further, in the alkylene group for X" or the alkyl group for Y" and Z", it is preferable that the number of hydrogen atoms substituted with fluorine atoms is as large as possible, because the acid strength increases and the transparency to high energy radiation of 200 nm or less or electron beam is improved. The fluorination ratio, namely the ratio of fluorine atoms within the alkylene group or alkyl group, is preferably within a range from 70 to 100%, more preferably from 90 to 100%, and it is particularly desirable that the alkylene group or alkyl group is a perfluoroalkylene group or perfluoroalkyl group in which all of the hydrogen atoms have been substituted with fluorine atoms.

Furthermore, a sulfonium salt having a cation moiety represented by general formula (b-5) or (b-6) shown below may also be used as an onium salt-based acid generator.

[Chemical Formula 52]

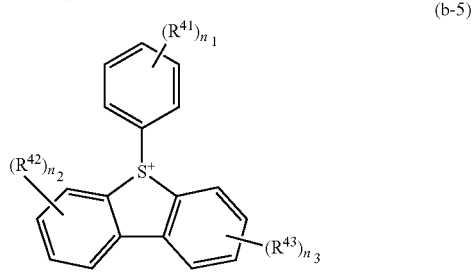

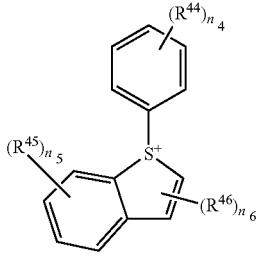

In formulas (b-5) and (b-6) above, each of $R^{41}$ to $R^{46}$ represents an alkyl group, acetyl group, alkoxy group, carboxyl group, hydroxyl group or hydroxyalkyl group, each of $n_1$ to $n_5$ represents an integer of 0 to 3, and $n_6$ represents an integer of 0 to 2.

With respect to $R^{41}$ to $R^{46}$, the alkyl group is preferably an alkyl group of 1 to 5 carbon atoms, more preferably a linear or branched alkyl group, and most preferably a methyl group, ethyl group, propyl group, isopropyl group, n-butyl group or tert butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably an aforementioned alkyl group in which one or more hydrogen atoms have been substituted with hydroxy groups, and examples thereof include a hydroxymethyl group, hydroxyethyl group and hydroxypropyl group.

If there are two or more of an individual $R^{41}$ to $R^{46}$ group, as indicated by the corresponding value of $n_1$ to $n_6$, then the two or more of the individual $R^{41}$ to $R^{46}$ group may be the same or different from each other.

$n_1$ is preferably 0 to 2, more preferably 0 or 1, and still more preferably 0.

It is preferable that $n_2$ and $n_3$ each represents 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

The anion moiety of the sulfonium salt having a cation moiety represented by general formula (b-5) or (b-6) is not particularly limited, and the same anion moieties as those used within the various onium salt-based acid generators that have been proposed may be used. Examples of such anion moieties include fluorinated alkylsulfonate ions such as the anion moieties ($R^{4"}SO_3^-$) for the onium salt-based acid generators represented by general formula (b-1) or (b-2) shown above, and anion moieties represented by general formula (b-3) or (b-4) shown above.

In the present description, an oxime sulfonate-based acid generator is a compound having at least one group represented by general formula (B-1) shown below, and has a feature of generating acid by irradiation. Such oxime sulfonate acid generators are widely used for chemically amplified resist compositions, and can be selected as appropriate.

[Chemical Formula 53]

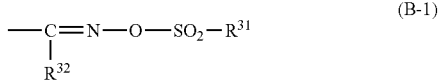

In formula (B-1), each of $R^{31}$ and $R^{32}$ represents an organic group.

The organic groups for $R^{31}$ and $R^{32}$ refer to groups containing a carbon atom, which may also include atoms other than carbon atoms (such as a hydrogen atom, oxygen atom, nitrogen atom, sulfur atom or halogen atom (such as a fluorine atom or chlorine atom) or the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched or cyclic alkyl group having 1 to 6 carbon atoms. The expression that the alkyl group or the aryl group "may have a substituent" means that part or all of the hydrogen atoms of the alkyl group or aryl group may be substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter sometimes referred to as a "halogenated alkyl group") is particularly desirable. A "partially halogenated alkyl group" refers to an alkyl group in which part of the hydrogen atoms are substituted with halogen atoms and a "completely halogenated alkyl group" refers to an alkyl group in which all of the hydrogen atoms are substituted with halogen atoms. Examples of halogen atoms include fluorine atoms, chlorine atoms, bromine atoms and iodine atoms, and fluorine atoms are particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. A "partially halogenated aryl group" refers to an aryl group in which part of the hydrogen atoms are substituted with halogen atoms and a "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched or cyclic alkyl group, an aryl group or a cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent, or a fluorinated alkyl group of 1 to 8 carbon atoms is particularly desirable.

Preferred examples of the oxime sulfonate acid generator include compounds represented by general formula (B-2) or (B-3) shown below.

[Chemical Formula 54]

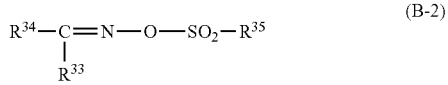

(B-2)

In formula (B-2), $R^{33}$ represents a cyano group, an alkyl group having no substituent or a halogenated alkyl group, $R^{34}$ represents an aryl group, and $R^{35}$ represents an alkyl group having no substituent or a halogenated alkyl group.

[Chemical Formula 55]

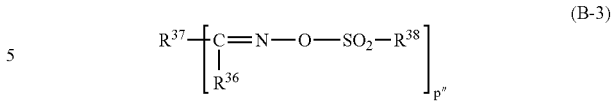

(B-3)

In formula (B-3), $R^{36}$ represents a cyano group, an alkyl group having no substituent or a halogenated alkyl group, $R^{37}$ represents a divalent or trivalent aromatic hydrocarbon group, $R^{38}$ represents an alkyl group having no substituent or a halogenated alkyl group, and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more fluorinated, and most preferably 90% or more fluorinated.

Examples of the aryl group for $R^{34}$ include groups in which one hydrogen atom has been removed from an aromatic hydrocarbon ring, such as a phenyl group, biphenyl group, fluorenyl group, naphthyl group, anthryl group or phenanthryl group, and heteroaryl groups in which a portion of the carbon atoms constituting the ring(s) of these groups are substituted with hetero atoms such as an oxygen atom, a sulfur atom or a nitrogen atom. Of these, a fluorenyl group is preferable.

The aryl group for $R^{34}$ may have a substituent such as an alkyl group of 1 to 10 carbon atoms, a halogenated alkyl group or an alkoxy group. The alkyl group or halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more fluorinated, and still more preferably 90% or more fluorinated. A completely fluorinated alkyl group in which 100% of the hydrogen atoms are substituted with fluorine atoms is particularly desirable.

In general formula (B-3), examples of the alkyl group having no substituent and the halogenated alkyl group for $R^{36}$ include the same groups as those exemplified above for the alkyl group having no substituent and the halogenated alkyl group for $R^{33}$.

Examples of the divalent or trivalent aromatic hydrocarbon group for $R^{37}$ include groups in which one or two hydrogen atoms have been removed from the aforementioned aryl group for $R^{34}$.

Examples of the alkyl group having no substituent or the halogenated alkyl group for $R^{38}$ include the same groups as those exemplified above for the alkyl group having no substituent or the halogenated alkyl group for $R^{35}$.

p" is preferably 2.

Specific examples of suitable oxime sulfonate acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may also be used favorably.

Furthermore, the following compounds may also be used as preferred examples.

[Chemical Formula 56]

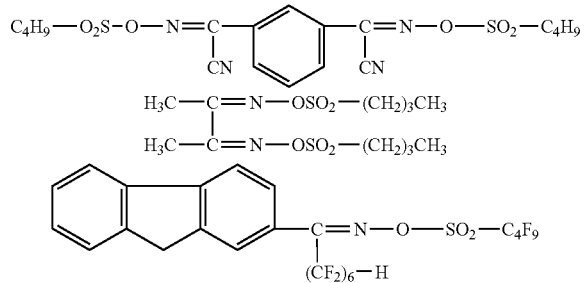

-continued

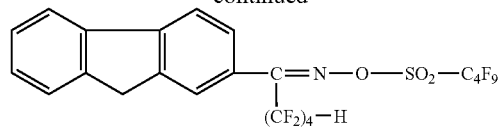

Of the aforementioned diazomethane acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may also be used favorably.

Furthermore, examples of poly(bis-sulfonyl)diazomethanes include those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be given.

As the component (B), one type of acid generator may be used alone, or two or more types of acid generators may be used in combination.

In the present invention, as the component (B), it is preferable to use an onium salt-based acid generator having a fluorinated alkylsulfonate acid ion as the anion moiety.

In the positive resist composition of the present invention, the amount of the component (B) relative to 100 parts by weight of the component (A) is preferably within a range from 0.5 to 50 parts by weight, and more preferably 1 to 40 parts by weight. By ensuring that the amount of the component (B) is within the above-mentioned range, formation of a resist pattern can be performed satisfactorily. Further, by virtue of the above-mentioned range, a uniform solution can be obtained and the storage stability tends to improve.

<Optional Components>

The positive resist composition of the present invention may further contain a nitrogen-containing organic compound (D) (hereafter referred to as "component (D)") as an optional component.

There are no particular limitations on the component (D) as long as it functions as an acid diffusion control agent, namely, a quencher which traps the acid generated from the component (B) upon exposure. A multitude of these components (D) have already been proposed, and any of these known compounds may be used, although an aliphatic amine, and particularly a secondary aliphatic amine or tertiary aliphatic amine is preferable. Here, an "aliphatic amine" describes an amine having one or more aliphatic groups, wherein the aliphatic groups preferably have 1 to 20 carbon atoms.

Examples of these aliphatic amines include amines in which at least one hydrogen atom of ammonia (NH$_3$) has been substituted with an alkyl group or hydroxyalkyl group of not more than 20 carbon atoms (namely, alkylamines or alkyl alcohol amines), and cyclic amines.

Specific examples of alkylamines and alkyl alcohol amines include monoalkylamines such as n-hexylamine, n-heptylamine, n-octylamine, n-nonylamine and n-decylamine dialkylamines such as diethylamine, di-n-propylamine, di-n-heptylamine, di-n-octylamine and dicyclohexylamine, trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine and tri-n-dodecylamine, and alkyl alcohol amines such as diethanolamine, triethanolamine, diisopropanolamine, triisopropanolamine, di-n-octanolamine, tri-n-octanolamine, stearyldiethanolamine and lauryldiethanolamine. Among these, trialkylamines and/or alkyl alcohol amines are preferable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of aromatic amines include aniline, pyridine, 4-dimethylaminopyridine, pyrrole, indole, pyrazole, imidazole and derivatives thereof, as well as diphenylamine, triphenylamine and tribenzylamine.

Examples of other aliphatic amines include tris(2-methoxymethoxyethyl)amine, tris {2-(2-methoxyethoxy) ethyl}amine, tris {2-(2-methoxyethoxymethoxy) ethyl}amine, tris {2-(1-methoxyethoxy)ethyl}amine, tris {2-(1-ethoxyethoxy)ethyl}amine, tris {2-(1-ethoxypropoxy) ethyl}amine and tris[2-{2-(2-hydroxyethoxy)ethoxy}ethyl] amine.

These compounds can be used either alone, or in combinations of two or more different compounds.

The component (D) is typically used in an amount within a range from 0.01 to 5.0 parts by weight relative to 100 parts by weight of the component (A). By ensuring that the amount of the component (D) is within the above-mentioned range, the shape of the resist pattern and the post exposure stability of the latent image formed by the pattern-wise exposure of the resist layer are improved.

Furthermore, in the positive resist composition of the present invention, in order to prevent any deterioration in sensitivity, and improve the resist pattern shape and the post exposure stability of the latent image formed by the pattern-wise exposure of the resist layer, at least one compound (E) (hereafter referred to as "component (E)") selected from the group consisting of an organic carboxylic acids, phosphorus oxo acids and derivatives thereof may be added.

Examples of the organic carboxylic acids include acetic acid, malonic acid, citric acid, malic acid, succinic acid, benzoic acid and salicylic acid.

Examples of the phosphorus oxo acids and derivatives thereof include phosphoric acid, phosphonic acid and phosphinic acid. Among these, phosphonic acid is particularly desirable.

Examples of phosphorus oxo acid derivatives include esters in which a hydrogen atom within an above-mentioned oxo acid is substituted with a hydrocarbon group.

Examples of the hydrocarbon group include alkyl groups of 1 to 5 carbon atoms and aryl groups of 6 to 15 carbon atoms.

Examples of phosphoric acid derivatives include phosphate esters such as di-n-butyl phosphate and diphenyl phosphate.

Examples of phosphonic acid derivatives include phosphonate esters such as dimethyl phosphonate, di-n-butyl phosphonate, diphenyl phosphonate and dibenzyl phosphonate, as well as phenylphosphonic acid.

Examples of phosphinic acid derivatives include phenylphosphinic acid and phosphinate esters.

As the component (E), one type of compound may be used alone, or two or more types may be used in combination.

The component (E) is typically used in an amount within a range from 0.01 to 5.0 parts by weight relative to 100 parts by weight of the component (A).

If desired, other miscible additives can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents and dyes. Further, in those cases where immersion exposure is to be performed, a fluorine-based additive described below may also be added to impart water repellency to the resist film.

<<Fluorine-Containing Polymer Additive: Component (F)>>

A fluorine-containing polymer additive that may be added to the positive resist composition of the present invention is preferably a fluorine-containing polymer compound (F) (hereafter referred to as "component (F)") containing a structural unit (f1) having a base-dissociable group and a structural unit (f2) represented by general formula (f2-1) shown below.

<Component (F)>

[Structural Unit (f1)]

The "base-dissociable group" within the structural unit (f1) describes an organic group that can be dissociated under the action of a base. Examples of the base include the types of alkali developing solutions typically used in the lithography field. In other words, a "base-dissociable group" is a group that dissociates under the action of an alkali developing solution (for example, a 2.38% by weight aqueous solution of tetramethylammonium hydroxide (TMAH) at 23° C.).

The base-dissociable group dissociates as the result of hydrolysis caused by the action of the alkali developing solution. Accordingly, a hydrophilic group is formed at the same time as the dissociation of the base-dissociable group, thereby increasing the hydrophilicity of the component (F) and enhancing the affinity of the component relative to the alkali developing solution.

There are no particular limitations on the base-dissociable group, provided it satisfies the definition outlined above, and the base-dissociable group may or may not include a fluorine atom. In those cases where the portion of the structural unit (f1) other than the base-dissociable group does not include a fluorine atom, the base-dissociable group must include a fluorine atom. On the other hand, if the portion of the structural unit (f1) other than the base-dissociable group does include a fluorine atom, then the base-dissociable group may or may not include a fluorine atom.

A base-dissociable group that includes a fluorine atom is a group in which part or all of the hydrogen atoms within a base-dissociable group have been substituted with fluorine atoms.

In the structural unit (f1), the base-dissociable group preferably includes a fluorine atom. Moreover, it is particularly preferable that the fluorine atom contained within the structural unit (f1) exists only within the base-dissociable group. If the fluorine atom is contained within the base-dissociable group, then when the base-dissociable group dissociates under the action of the alkali developing solution, the fluorine atom also dissociates from the structural unit (f1), thereby further enhancing the affinity of the structural unit relative to the alkali developing solution.

Specific examples of the base-dissociable group containing a fluorine atom include groups represented by general formulas (II-1) to (II-4) shown below. In the present invention, the base-dissociable group is preferably one or more groups selected from the group consisting of groups represented by general formulas (II-1) to (II-4), and in terms of achieving superior water repellency and an easier synthesis, groups represented by general formula (II-1) or (II-4) are particularly preferred.

[Chemical Formula 57]

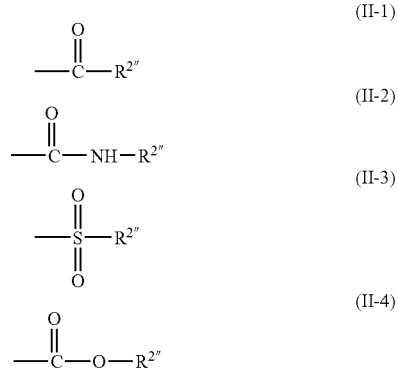

In the formulas, each $R^{2''}$ independently represents an organic group containing a fluorine atom.

In formulas (II-1) to (II-4), $R^{2''}$ represents an organic group that contains a fluorine atom. The term "organic group" describes a group that contains at least one carbon atom.

The structure of $R^{2''}$ may be linear, branched or cyclic, although a linear or branched structure is preferred.

The organic group for $R^{2''}$ preferably contains 1 to 20 carbon atoms, more preferably 1 to 15, still more preferably 1 to 10, and most preferably 1 to 5 carbon atoms.

In terms of enhancing the hydrophobicity of the resist film during immersion exposure, $R^{2''}$ preferably has a fluorination ratio of at least 25%, and this fluorination ratio is more preferably 50% or higher, and still more preferably 60% or higher. The "fluorination ratio" is the ratio (percentage) of (the number of fluorine atoms) relative to (the total number of hydrogen atoms and fluorine atoms) within the organic group.

As $R^{2''}$, fluorinated hydrocarbon groups which may have a substituent are preferred.

The hydrocarbon group may be either an aliphatic hydrocarbon group or an aromatic hydrocarbon group, although an aliphatic hydrocarbon group is preferred.

An aliphatic hydrocarbon group is a hydrocarbon group that has no aromaticity. The aliphatic hydrocarbon group may be either saturated or unsaturated, but is preferably saturated.

In other words, $R^{2''}$ is preferably a fluorinated saturated hydrocarbon group or a fluorinated unsaturated hydrocarbon group, and a fluorinated saturated hydrocarbon group, namely a fluorinated alkyl group, is particularly desirable.

Examples of the fluorinated alkyl group include groups in which part or all of the hydrogen atoms within an unsubstituted alkyl group described below have been substituted with fluorine atoms. The fluorinated alkyl group may be either a group in which a portion of the hydrogen atoms of the unsubstituted alkyl group have been substituted with fluorine atoms, or a group in which all of the hydrogen atoms of the unsubstituted alkyl group have been substituted with fluorine atoms (namely, a perfluoroalkyl group).

The unsubstituted alkyl group may be a linear, branched or cyclic group, or may be a combination of a linear or branched alkyl group and a cyclic alkyl group.

The unsubstituted linear alkyl group preferably contains 1 to 10 carbon atoms, and more preferably 1 to 8 carbon atoms. Specific examples include a methyl group, ethyl group, n-propyl group, n-butyl group, n-pentyl group, n-hexyl group, n-heptyl group, n-octyl group, n-nonyl group and n-decanyl group.

The unsubstituted branched alkyl group preferably contains 3 to 10 carbon atoms, and more preferably 3 to 8 carbon atoms. As the branched alkyl group, tertiary alkyl groups are preferred.

Examples of the unsubstituted cyclic alkyl group include groups in which one hydrogen atom has been removed from a monocycloalkane or a polycycloalkane such as a bicycloalkane, tricycloalkane or tetracycloalkane. Specific examples include monocycloalkyl groups such as a cyclopentyl group or cyclohexyl group, and polycycloalkyl groups such as an adamantyl group, norbornyl group, isobornyl group, tricyclodecanyl group or tetracyclododecanyl group.

Examples of the combination of an unsubstituted linear or branched alkyl group and a cyclic alkyl group include groups in which a cyclic alkyl group is bonded to a linear or branched alkyl group as a substituent, and groups in which a linear or branched alkyl group is bonded to a cyclic alkyl group as a substituent.

Examples of the substituent which the fluorinated hydrocarbon group may have include alkyl groups of 1 to 5 carbon atoms.

In $R^{2''}$, the fluorinated alkyl group is preferably a linear or branched fluorinated alkyl group. Groups represented by general formulas (III-1) and (III-2) shown below are particularly preferred, and of these, groups represented by formula (III-1) are particularly desirable.

[Chemical Formula 58]

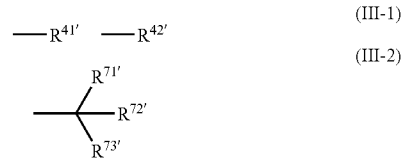

In formula (III-1), $R^{41'}$ represents an unsubstituted alkylene group of 1 to 9 carbon atoms, and $R^{42'}$ represents a fluorinated alkyl group of 1 to 9 carbon atoms, provided that the total number of carbon atoms within the combination of $R^{41'}$ and $R^{42'}$ is not more than 10. Further in formula (III-2), each of $R^{71'}$ to $R^{73'}$ independently represents a linear alkyl group of 1 to 5 carbon atoms, provided that at least one of $R^{71'}$ to $R^{73'}$ is an alkyl group that contains a fluorine atom.

In formula (III-1), the alkylene group of $R^{41'}$ may be a linear, branched or cyclic group, although a linear or branched group is preferred. Further, the alkylene group preferably contains from 1 to 5 carbon atoms.

As $R^{41'}$, a methylene group, ethylene group or propylene group is particularly desirable.

As $R^{42'}$, a linear or branched fluorinated alkyl group of 1 to 5 carbon atoms is preferred, and a perfluoroalkyl group is particularly desirable. Of such groups, a trifluoromethyl group or tetrafluoroethyl group is particularly desirable.

In formula (III-2), each of the alkyl groups for $R^{71'}$ to $R^{73'}$ is preferably an ethyl group or a methyl group, and is most preferably a methyl group. Of the alkyl groups for $R^{71'}$ to $R^{73'}$, at least one group must be a fluorinated alkyl group, although all of the groups may be fluorinated alkyl groups.

Preferred forms of the structural unit (f1) include the structural units represented by general formulas (f1-1) and (f1-2) shown below.

[Chemical Formula 59]

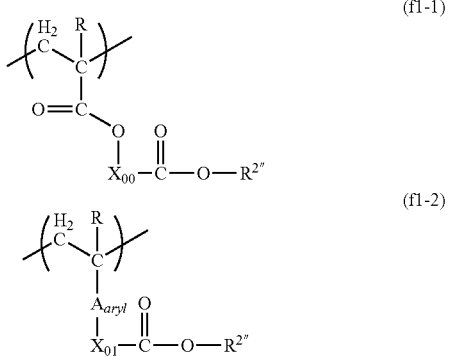

In these formulas, each R independently represents a hydrogen atom, an alkyl group of 1 to 5 carbon atoms or a halogenated alkyl group of 1 to 5 carbon atoms, $X_{00}$ represents a divalent organic group, $A_{aryl}$ represents a divalent aromatic cyclic group which may have a substituent, $X_{01}$ represents a single bond or a divalent linking group, and each $R^{2''}$ independently represents an organic group containing a fluorine atom.

In formulas (f1-1) and (f1-2), $R^{2''}$ is the same as defined above. In formulas (f1-1) and (f1-2), $R^{2''}$ is preferably a fluorinated hydrocarbon group, more preferably a fluorinated alkyl group, still more preferably a fluorinated alkyl group of 1 to 5 carbon atoms, and most preferably —$CH_2$—$CF_3$, —$CH_2$—$CF_2$—$CF_3$, —$CH(CF_3)_2$, —$CH_2$—$CF_2$—$CF_2$—$CF_3$, or —$CH_2$—$CH_2$—$CF_2$—$CF_2$—$CF_2$—$CF_3$.

The alkyl group of 1 to 5 carbon atoms for R is preferably a linear or branched alkyl group, and specific examples thereof include a methyl group, ethyl group, propyl group, isopropyl group, n-butyl group, isobutyl group, tert-butyl group, pentyl group, isopentyl group or neopentyl group.

Further, examples of the halogenated alkyl group of 1 to 5 carbon atoms include groups in which part or all of the hydrogen atoms within an aforementioned "alkyl group of 1 to 5 carbon atoms" have been substituted with halogen atoms. Examples of the halogen atom include a fluorine atom, chlorine atom, bromine atom or iodine atom, although a fluorine atom is preferred.

In the present invention, R is preferably a hydrogen atom, an alkyl group of 1 to 5 carbon atoms or a fluorinated alkyl group of 1 to 5 carbon atoms, and from the viewpoint of industrial availability, is most preferably a hydrogen atom or a methyl group.

In general formula (f1-1), $X_{00}$ is a divalent organic group.

$X_{00}$ may or may not include an acid-dissociable portion. An "acid-dissociable portion" refers to a portion within this organic group that is dissociated from the organic group by action of the acid generated upon exposure. When the $X_{00}$ group has an acid-dissociable portion, it preferably has an acid-dissociable portion containing a tertiary carbon atom.

Preferred examples of $X_{00}$ include hydrocarbon groups which may have a substituent, and groups containing a hetero atom.

The expression that the hydrocarbon group "may have a substituent" means that part or all of the hydrogen atoms within the hydrocarbon group may be substituted with groups or atoms other than hydrogen atoms.

The hydrocarbon group may be either an aliphatic hydrocarbon group or an aromatic hydrocarbon group. An "aliphatic hydrocarbon group" refers to a hydrocarbon group that has no aromaticity.

The aliphatic hydrocarbon group may be saturated or unsaturated. In general, the aliphatic hydrocarbon group is preferably saturated.

Specific examples of the aliphatic hydrocarbon group include linear and branched aliphatic hydrocarbon groups, and aliphatic hydrocarbon groups containing a ring in the structure thereof.

The linear and branched aliphatic hydrocarbon groups preferably contain 1 to 10 carbon atoms, and more preferably 1 to 8, still more preferably 1 to 5, and most preferably 1 or 2 carbon atoms.

As the linear aliphatic hydrocarbon group, a linear alkylene group is preferable, and specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, a branched alkylene group is preferable, and specific examples include alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—, alkylethylene groups such as —$CH(CH_3)CH_2$—, —$CH(CH_3)CH(CH_3)$—, —$C(CH_3)_2CH_2$—, —$CH(CH_2CH_3)CH_2$— and —$C(CH_2CH_3)_2$—$CH_2$—, alkyltrimethylene groups such as —$CH(CH_3)CH_2CH_2$— and —$CH_2CH(CH_3)CH_2$—, and alkyltetramethylene groups such as —$CH(CH_3)CH_2CH_2CH_2$— and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of the substituent include a fluorine atom, a fluorinated alkyl group of 1 to 5 carbon atoms, and an oxygen atom (=O).

Examples of the aliphatic hydrocarbon group containing a ring in the structure thereof include cyclic aliphatic hydrocarbon groups (groups in which two hydrogen atoms have been removed from an aliphatic hydrocarbon ring), and groups in which the cyclic aliphatic hydrocarbon group is bonded to the terminal of an aforementioned chain-like aliphatic hydrocarbon group or interposed within an aforementioned chain-like aliphatic hydrocarbon group.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane. As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

The "hetero atom" within the divalent group containing a hetero atom is an atom other than carbon and hydrogen, and examples thereof include an oxygen atom, a nitrogen atom, a sulfur atom and a halogen atom.

Specific examples of the divalent group containing a hetero atom include —O—, —C(=O)—, —C(=O)—O—, a carbonate bond (—O—C(=O)—O—), —NH—, —NR$^{04}$— (wherein R$^{04}$ represents an alkyl group), —NH—C(=O)—, =N—, and combinations of these groups with a divalent hydrocarbon group. Examples of this divalent hydrocarbon group include the same groups as those described above for the hydrocarbon group which may have a substituent, and a linear or branched aliphatic hydrocarbon group is preferable.

In general formula (f1-2), $A_{aryl}$ represents a divalent aromatic cyclic group which may have a substituent. Specific examples of $A_{aryl}$ include groups in which two hydrogen atoms have been removed from an aromatic hydrocarbon ring which may have a substituent.

The cyclic structure of the aromatic cyclic group of $A_{aryl}$ preferably contains 6 to 15 carbon atoms, and examples thereof include a benzene ring, naphthalene ring, phenanthrene ring and anthracene ring. Of these, a benzene ring and a naphthalene ring are particularly preferred.

In $A_{aryl}$, examples of the substituent which the aromatic cyclic group may have include a halogen atom, alkyl group, alkoxy group, halogenated alkyl group of 1 to 5 carbon atoms, and an oxygen atom (=O). Examples of the halogen atom include a fluorine atom, chlorine atom, iodine atom or bromine atom. The substituent which the aromatic cyclic group of $A_{aryl}$ may have is preferably a fluorine atom.

The aromatic cyclic group of $A_{aryl}$ may or may not have a substituent, and aromatic cyclic groups that do not have a substituent are preferred.

In those cases where the aromatic cyclic group of $A_{aryl}$ does have a substituent, the number of substituents may be 1, or 2 or greater, but is preferably either 1 or 2, and is most preferably 1.

$X_{01}$ represents a single bond or a divalent linking group. Examples of this divalent linking group include alkylene groups of 1 to 10 carbon atoms, —O—, —C(=O)—, —C(=O)—O—, a carbonate bond (—O—C(=O)—O—), —NH—C(=O)— and combinations of these groups. Of these, combinations of —O— and an alkylene group of 1 to 10 carbon atoms are the most desirable.

Examples of the alkylene groups of 1 to 10 carbon atoms include linear, branched and cyclic alkylene groups, and of these, linear or branched alkylene groups of 1 to 5 carbon atoms and cyclic alkylene groups of 4 to 10 carbon atoms are preferred.

Of the structural units represented by general formula (f1-1), particularly preferred units include structural units represented by general formulas (f1-11) to (f1-14) shown below.

Further, of the structural units represented by general formula (f1-2), particularly preferred units include structural units represented by general formulas (f1-21) to (f1-24) shown below.

[Chemical Formula 60]

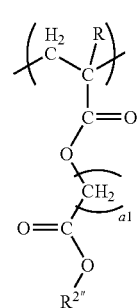

(f1-11)

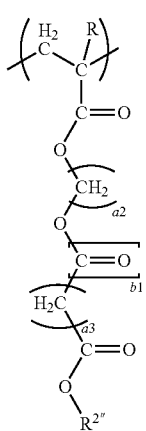

(f1-12)

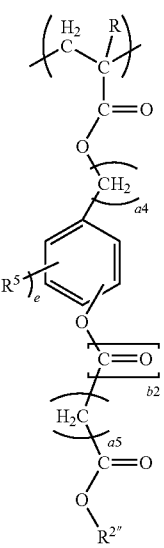

(f1-13)

(f1-14)
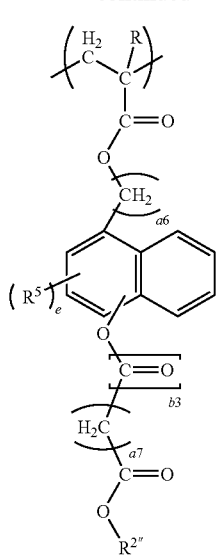
[Chemical Formula 61]
(f1-21)
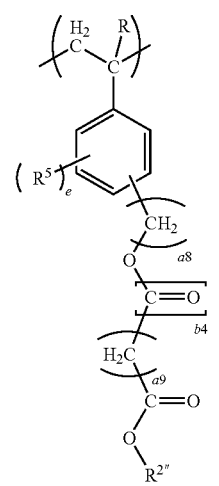
(f1-22)
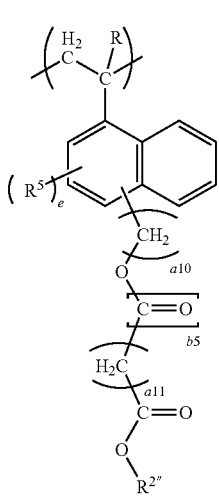
(f1-23)
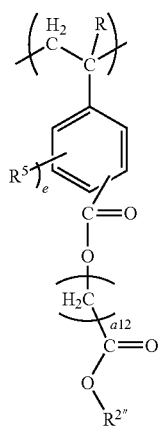
(f1-24)
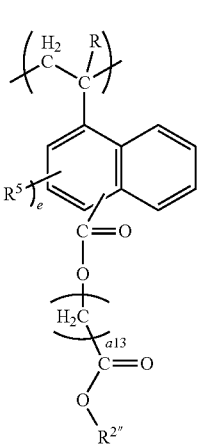
[Chemical Formula 62]
(f1-25)
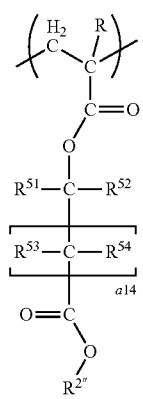

(f1-26)

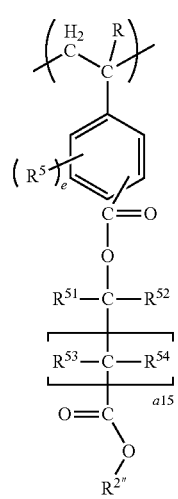

(f1-27)

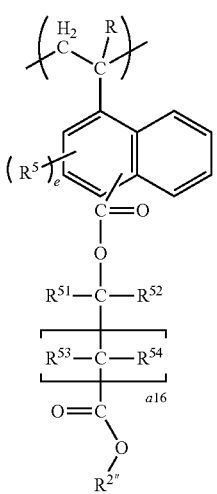

In general formulas (f1-11) to (f1-14), (f1-21) to (f1-24) and (f1-25) to (f1-27), R and $R^{2''}$ are the same as defined above, each of $R^{51}$ and $R^{52}$ represents an alkyl group of 1 to 10 carbon atoms, each of $R^{53}$ and $R^{54}$ represents a hydrogen atom or an alkyl group of 1 to 10 carbon atoms, each of a1, a2, a3, a5, a7, a9 and a11 to a13 represents an integer of 1 to 5, each of a4, a6, a8 and a11) represents an integer of 0 to 5, each of a14 to a16 represents an integer of 0 to 5, each of b1 to b5 represents 0 or 1, $R^5$ represents a substituent, and e represents an integer of 0 to 2.

In formulas (f1-11) to (f1-14), (f1-21) to (f1-24) and (f1-25) to (f1-27), R is preferably a hydrogen atom or a methyl group.

In formula (f1-11), a1 is preferably an integer of 1 to 3, and is more preferably 1 or 2.

In formula (f1-12), each of a2 and a3 is preferably an integer of 1 to 3, and is more preferably 1 or 2.

In formula (f1-13), a4 is preferably an integer of 0 to 3, more preferably an integer of 0 to 2, and most preferably 0 or 1.

a5 is preferably an integer of 1 to 3, and is more preferably 1 or 2.

Examples of the substituent for $R^5$ include a halogen atom, an alkyl group of 1 to 5 carbon atoms, an alkoxy group of 1 to 5 carbon atoms, a halogenated alkyl group of 1 to 5 carbon atoms, and an oxygen atom (=O). Examples of the alkyl group of 1 to 5 carbon atoms include the same alkyl groups of 1 to 5 carbon atoms listed above in relation to R. Examples of the halogen atom include a fluorine atom, chlorine atom, iodine atom or bromine atom. Examples of the halogenated alkyl group of 1 to 5 carbon atoms include the same halogenated alkyl groups of 1 to 5 carbon atoms listed above in relation to R.

e is preferably 0 or 1, and from an industrial viewpoint, is most preferably 0.

b2 is preferably 0.

In formula (f1-14), a6 is preferably an integer of 0 to 3, more preferably an integer of 0 to 2, and most preferably 0 or 1.

a7 is preferably an integer of 1 to 3, and more preferably 1 or 2.

b3 is preferably 0.

$R^5$ and e are the same as defined above.

In formula (f1-21), a8 is preferably an integer of 0 to 3, more preferably an integer of 0 to 2, and most preferably 0 or 1.

a9 is preferably an integer of 1 to 3, and more preferably 1 or 2.

b4 is preferably 0.

$R^5$ and e are the same as defined above.

In formula (f1-22), a10 is preferably an integer of 0 to 3, more preferably an integer of 0 to 2, and most preferably 0 or 1.

a11 is preferably an integer of 1 to 3, and more preferably 1 or 2.

b5 is preferably 0.

$R^5$ and e are the same as defined above.

In formula (f1-23), a12 is preferably an integer of 1 to 3, and is more preferably 1 or 2.

$R^5$ and e are the same as defined above.

In formula (f1-24), a13 is preferably an integer of 1 to 3, and is more preferably 1 or 2.

$R^5$ and e are the same as defined above.

In formulas (f1-25) to (f1-27), each of a14, a15 and a16 is preferably an integer of 0 to 3, more preferably 0 to 2, and most preferably 0 or 1.

Each of $R^{51}$ and $R^{52}$ preferably represents a linear, branched or cyclic alkyl group of 1 to 12 carbon atoms. Examples thereof include a methyl group, ethyl group, n-propyl group, isopropyl group, n-butyl group, isobutyl group, tert-butyl group, tert-amyl group, cyclopentyl group, cyclohexyl group, cyclooctyl group, norbornyl group, isobornyl group, tricyclodecanyl group, adamantyl group or tetracyclododecanyl group, and of these, a group of 1 to 6 carbon atoms is preferred, a group of 1 to 4 carbon atoms is more preferred, and a methyl group or an ethyl group is the most desirable.

Each of $R^{53}$ and $R^{54}$ preferably represents a hydrogen atom, or a linear, branched or cyclic alkyl group of 1 to 12 carbon atoms. The linear, branched or cyclic alkyl group for $R^{53}$ or $R^{54}$ of 1 to 12 carbon atoms is the same as that defined above for $R^{51}$ and $R^{52}$.

In formula (f1-26) and (f1-27), $R^5$ and e are the same as defined above.

Specific examples of the structural units represented by the above general formulas (f1-11) to (f1-14) and (f1-21) to (f1-27) are shown below.

[Chemical Formula 63]
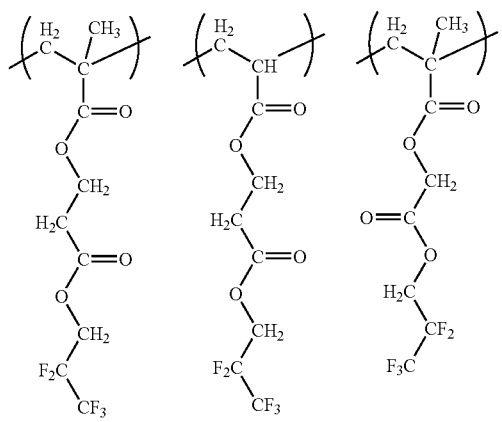
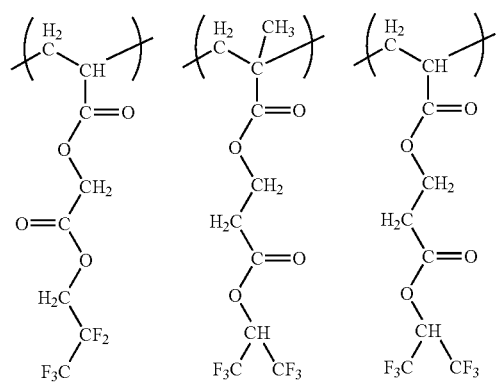
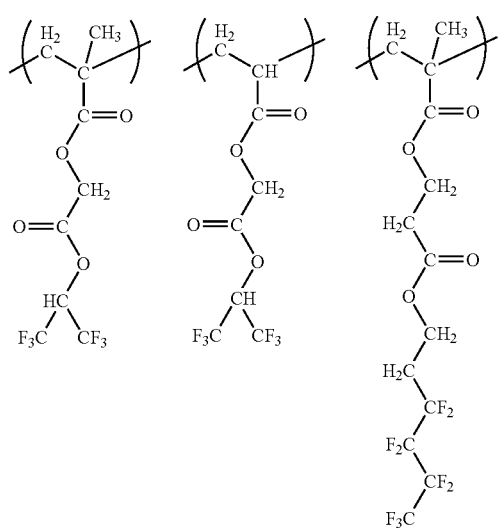
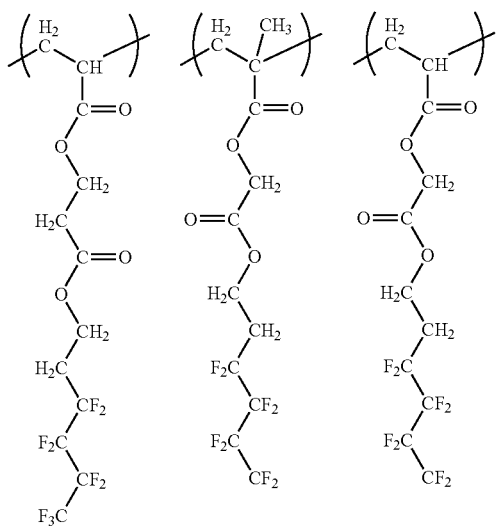
[Chemical Formula 64]
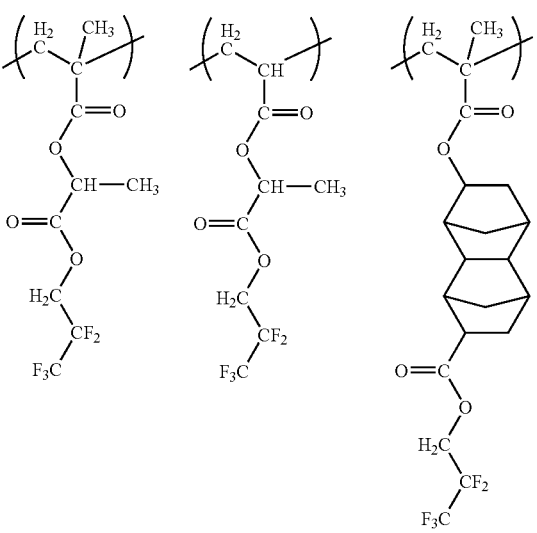
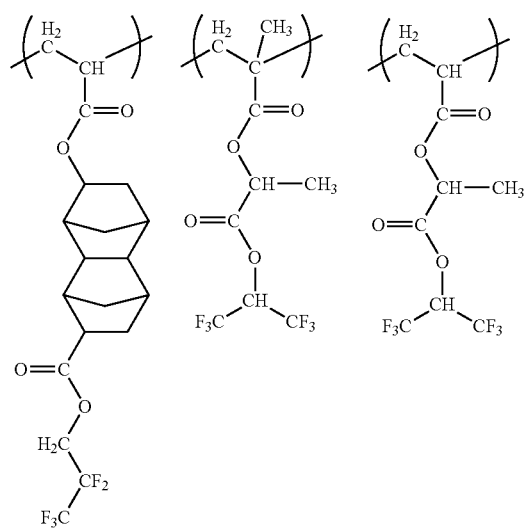

123
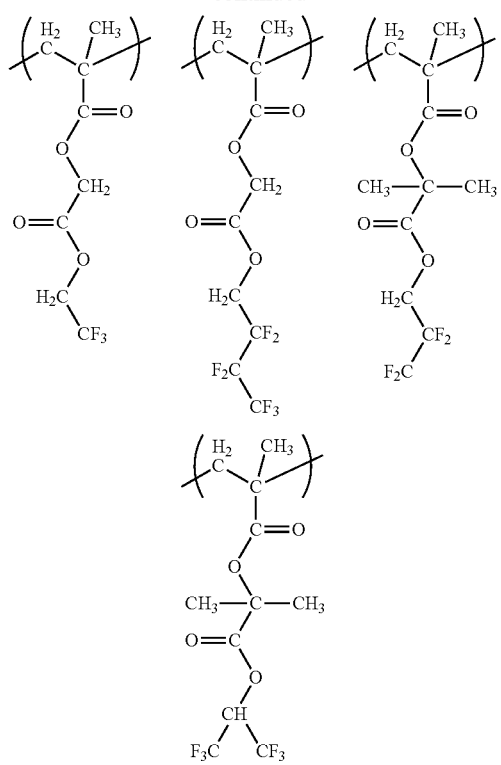
124
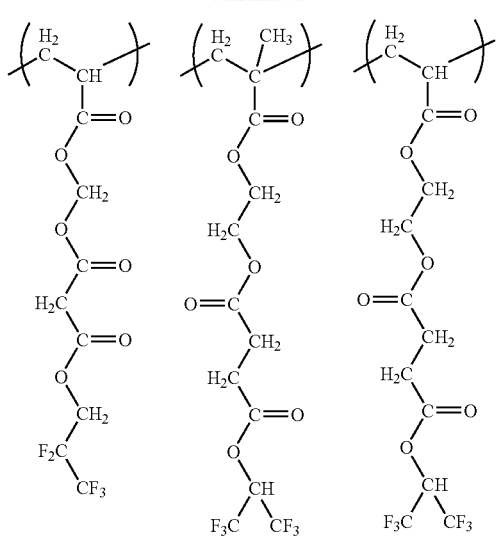
[Chemical Formula 65]
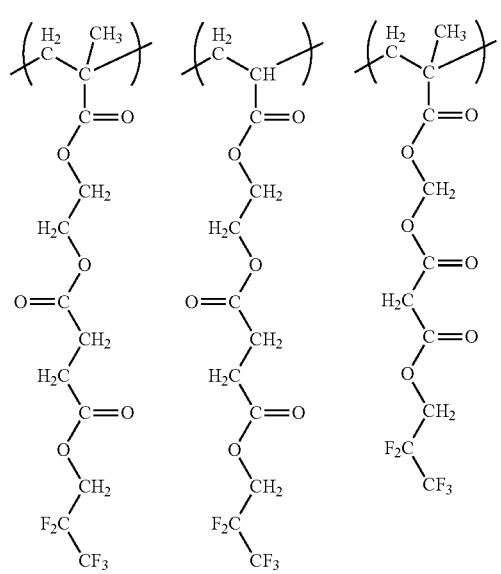
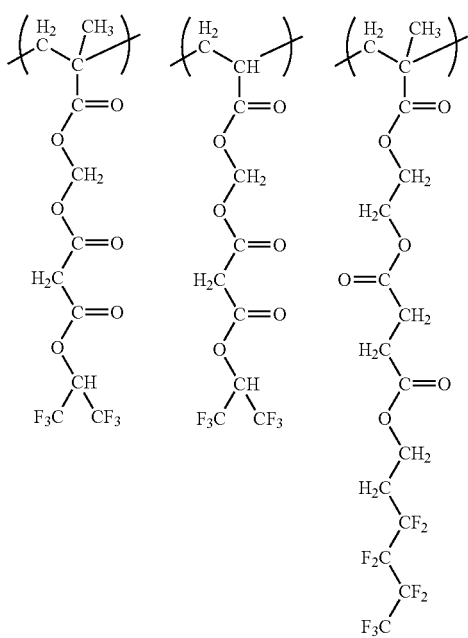

125
-continued
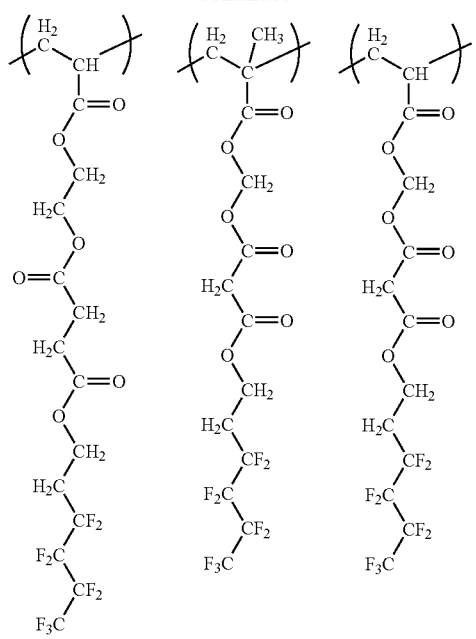
126
-continued
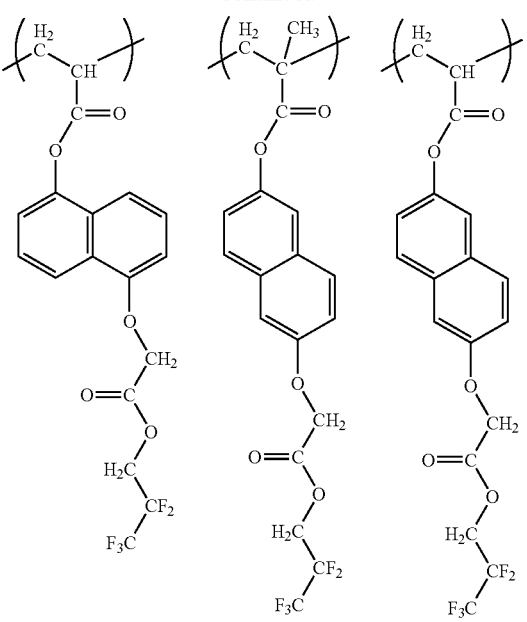
[Chemical Formula 66]
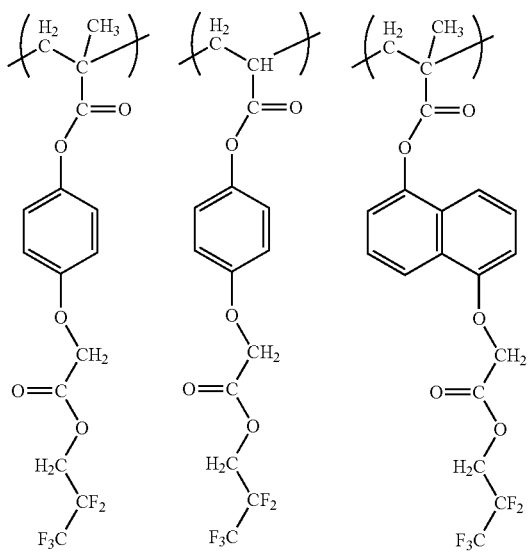
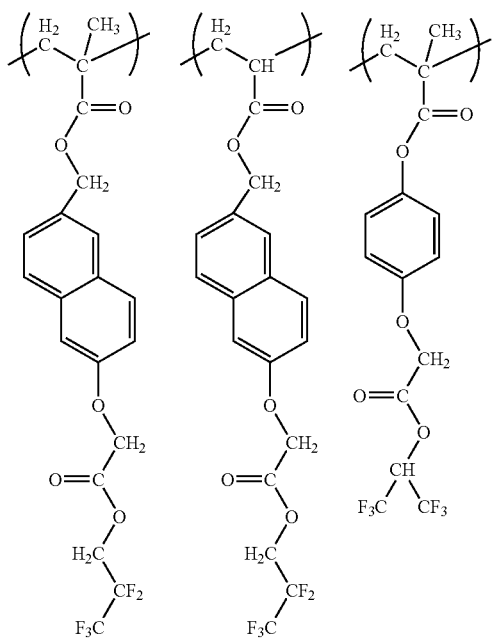

127
-continued
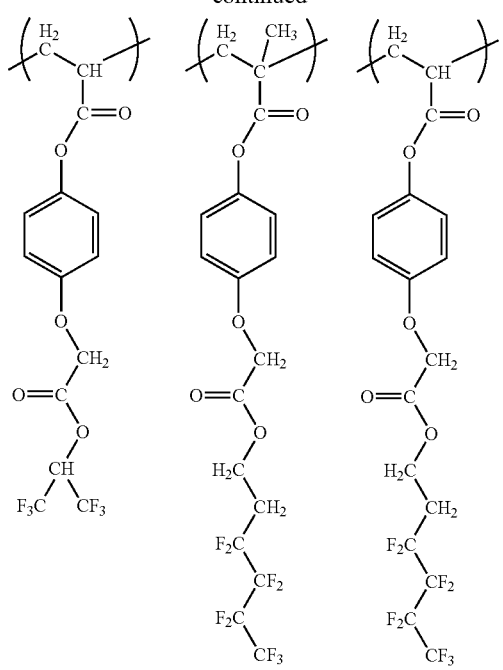
[Chemical Formula 67]
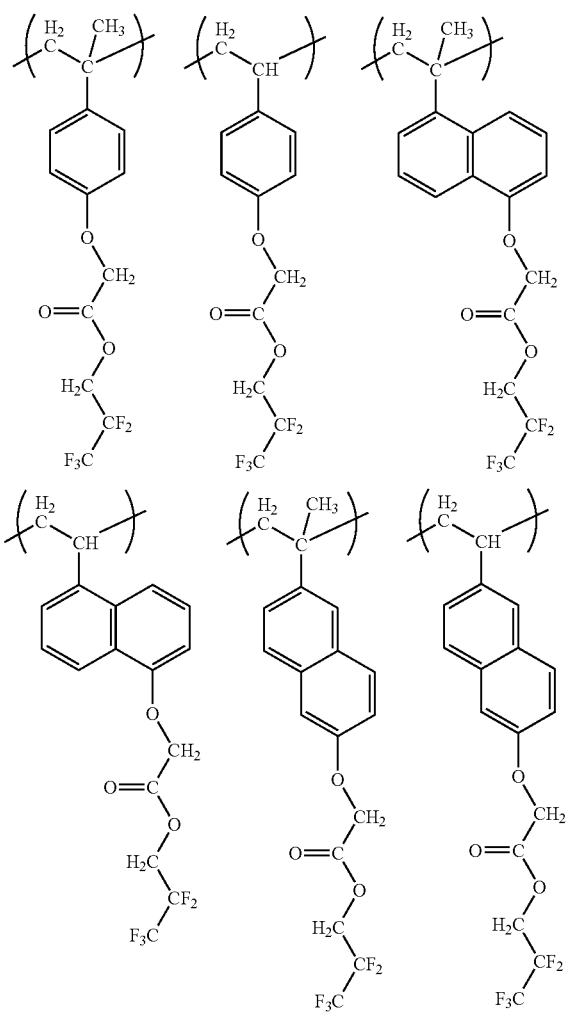
128
-continued
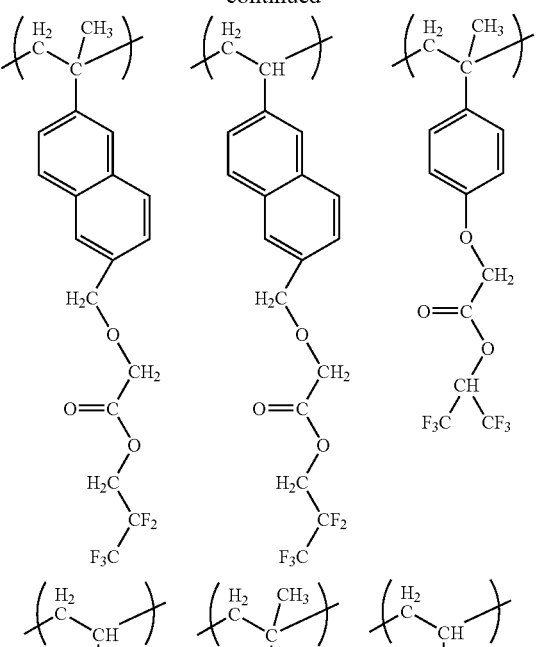
As the structural unit (f1), at least one structural unit selected from the group consisting of structural units represented by general formulas (f1-11) to (f1-14) and (f1-21) to (f1-24) is preferred, at least one structural unit selected from the group consisting of structural units represented by general formulas (f1-11) to (f1-13), (f1-21) and (f1-22) is more preferred, and at least one structural unit selected from the group consisting of structural units represented by general formulas (f1-11) and (f1-22) is particularly desirable.

As the structural unit (f1) within the component (F), either a single structural unit may be used alone, or two or more types of structural units may be used in combination.

The amount of the structural unit (f1) within the component (F), based on the combined total of all the structural units that constitute the component (F), is preferably within a range from 10 to 90 mol %, more preferably from 20 to 80 mol %, still more preferably from 30 to 80 mol %, and most preferably from 40 to 80 mol %. If the amount of the structural unit (f1) is at least as large as the lower limit of the above-mentioned range, then during resist pattern formation, the component (F) is hydrophobic during immersion exposure but then becomes hydrophilic during alkali developing, which reduces the occurrence of re-adhered defects, and improves the scan tracking properties during immersion exposure. On the other hand, by ensuring that the amount of the structural unit (f1) is not more than the upper limit of the above-mentioned range, a good balance can be achieved with the structural unit (f2), and the occurrence of defects during the immersion scanning exposure can be suppressed.

[Structural Unit (f2)]

The structural unit (f2) is represented by general formula (f2-1) shown below.

[Chemical Formula 68]

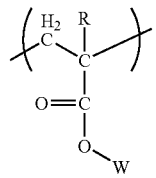
(f2-1)

In the formula, R represents a hydrogen atom, an alkyl group of 1 to 5 carbon atoms or a halogenated alkyl group of 1 to 5 carbon atoms, and W is a group represented by one of general formulas (w-1) to (w-4) shown below.

[Chemical Formula 69]

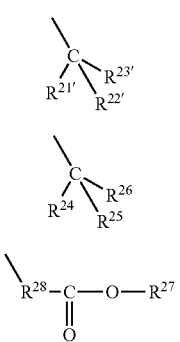

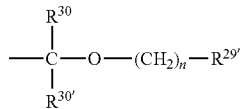

In formula (w-1), $R^{21'}$ represents an alkyl group of 2 or more carbon atoms, and $R^{22'}$ and $R^{23'}$ are bonded together to form a monocyclic aliphatic cyclic group of 7 or more carbon atoms. In formula (w-2), $R^{24}$ represents a branched alkyl group of 3 or more carbon atoms, and $R^{25}$ and $R^{26}$ are bonded together to form an aliphatic cyclic group. In formula (w-3), $R^{27}$ represents an acid-dissociable, dissolution-inhibiting group, and $R^{28}$ represents a divalent linking group. In formula (q-4), $R^{29'}$ represents a linear or branched alkyl group or an aliphatic cyclic group, n represents an integer of 0 to 3, and each of $R^{30}$ and $R^{30'}$ represents a linear or branched alkyl group or a hydrogen atom, although $R^{29'}$ and $R^{30}$ may be bonded together to form an aliphatic cyclic group.

In formula (f2-1), R represents a hydrogen atom, an alkyl group of 1 to 5 carbon atoms or a halogenated alkyl group of 1 to 5 carbon atoms. Examples of R include the same groups as those exemplified above for R within formulas (f1-1) and (f1-2).

W is a group represented by one of general formulas (w-1) to (w-4) shown above.

In formula (w-1), $R^{21'}$ represents an alkyl group of 2 or more carbon atoms, and $R^{22'}$ and $R^{23'}$ are bonded together to form a monocyclic aliphatic cyclic group of 7 or more carbon atoms.

The alkyl group for $R^{21'}$ may be a linear, branched or cyclic group.

When the alkyl group is a linear or branched group, groups of 2 to 5 carbon atoms are preferred, and specific examples thereof include a methyl group, ethyl group, propyl group, isopropyl group, n-butyl group, isobutyl group, tert-butyl group, pentyl group, isopentyl group or neopentyl group. Of these, an ethyl group or propyl group is preferred, and an ethyl group is the most desirable.

When the alkyl group is a cyclic group, it preferably contains 4 to 15 carbon atoms, more preferably 4 to 12 carbon atoms, and most preferably 5 to 10 carbon atoms. Examples of the cyclic alkyl group include groups in which one hydrogen atom has been removed from a monocycloalkane, and groups in which one hydrogen atom has been removed from a polycycloalkane such as a bicycloalkane, tricycloalkane or tetracycloalkane. Specific examples include groups in which one hydrogen atom has been removed from a monocycloalkane such as cyclopentane or cyclohexane, and groups in which one hydrogen atom has been removed from a polycycloalkane such as adamantane, norbornane, isobornane, tricyclodecane or tetracyclododecane.

$R^{21'}$ is preferably a linear or branched alkyl group.

In formula (w-1), $R^{22'}$ and $R^{23'}$ are bonded together, and in combination with the carbon atom to which $R^{22'}$ and $R^{23'}$ are bonded, form a monocyclic aliphatic cyclic group of 7 or more carbon atoms.

The monocyclic aliphatic cyclic group preferably contains 8 or more carbon atoms. Moreover, the monocyclic aliphatic cyclic group preferably contains not more than 12 carbon atoms, more preferably not more than 10 carbon atoms, and most preferably 9 carbon atoms or less.

The aliphatic cyclic group may be saturated or unsaturated, but is preferably saturated. Further, the aliphatic cyclic group may be a hydrocarbon group composed solely of carbon atoms and hydrogen atoms, or may also include other atoms (hetero atoms such as an oxygen atom, nitrogen atom or sulfur atom), although a hydrocarbon group is preferred.

A substituent may be bonded to the aliphatic cyclic group. Examples of the substituent include alkyl groups of 1 to 5 carbon atoms, a fluorine atom, fluorinated alkyl groups of 1 to 5 carbon atoms, and an oxygen atom (=O).

Specific examples of preferred groups represented by formula (w-1) include the groups shown below.

[Chemical Formula 70]

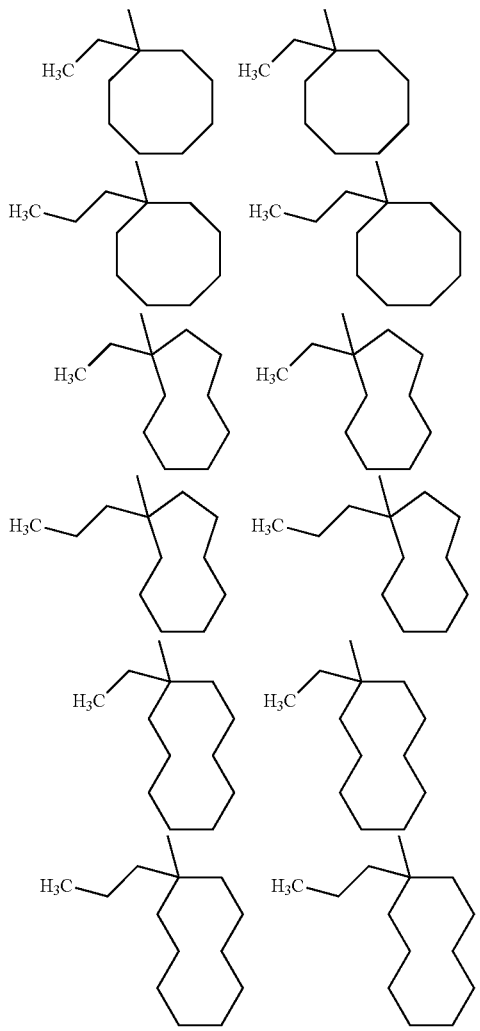

In formula (w-2), $R^{24}$ represents a branched alkyl group of 3 or more carbon atoms, and $R^{25}$ and $R^{26}$ are bonded together to form an aliphatic cyclic group.

The alkyl group for $R^{24}$ preferably contains from 3 to 10 carbon atoms, and more preferably 3 to 5 carbon atoms. Specific examples thereof include an isopropyl group, isobutyl group, tert-butyl group, isopentyl group or neopentyl group, and of these, an isopropyl group is the most desirable.

In formula (w-2), $R^{25}$ and $R^{26}$ are bonded together, and in combination with the carbon atom to which $R^{25}$ and $R^{26}$ are bonded, form an aliphatic cyclic group.

The aliphatic cyclic group may be either monocyclic or polycyclic.

The aliphatic cyclic group may be either saturated or unsaturated, but is preferably saturated. Further, the aliphatic cyclic group may be a hydrocarbon group composed solely of carbon atoms and hydrogen atoms, or may also include other atoms (hetero atoms such as an oxygen atom, nitrogen atom or sulfur atom), although a hydrocarbon group is preferred.

The aliphatic cyclic group preferably contains from 4 to 15 carbon atoms, more preferably 4 to 12 carbon atoms, and most preferably 5 to 10 carbon atoms.

Examples of the cyclic alkyl group include groups in which one hydrogen atom has been removed from a monocycloalkane, and groups in which one hydrogen atom has been removed from a polycycloalkane such as a bicycloalkane, tricycloalkane or tetracycloalkane. Specific examples include groups in which one hydrogen atom has been removed from a monocycloalkane such as cyclopentane or cyclohexane, and groups in which one hydrogen atom has been removed from a polycycloalkane such as adamantane, norbornane, isobornane, tricyclodecane or tetracyclododecane.

A substituent may be bonded to the aliphatic cyclic group. Examples of the substituent include alkyl groups of 1 to 5 carbon atoms, a fluorine atom, fluorinated alkyl groups of 1 to 5 carbon atoms, and an oxygen atom (=O).

Specific examples of preferred groups represented by formula (w-2) include the groups shown below.

[Chemical Formula 71]

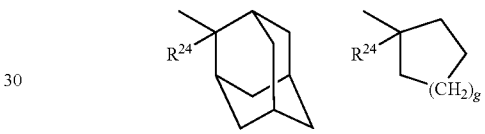

In the formulas, $R^{24}$ is the same as defined above, and g represents an integer of 0 to 3.

g is preferably an integer of 1 to 3, and more preferably 1 or 2.

In formula (w-3), $R^{27}$ represents an acid-dissociable, dissolution-inhibiting group, and $R^{28}$ represents a divalent linking group.

When the component (F) is added to a resist composition together with the component (B), the acid-dissociable, dissolution-inhibiting group of $R^{27}$ exhibits acid dissociability that causes $R^{27}$ to dissociate under the action of the acid generated from the component (B) upon exposure, whereas prior to dissociation, the acid-dissociable, dissolution-inhibiting group of $R^{27}$ has an alkali dissolution inhibiting effect that inhibits the solubility of the component (F) within the alkali developing solution.

There are no particular limitations on the acid-dissociable, dissolution-inhibiting group of $R^{27}$, and any of the groups that have been proposed as acid-dissociable, dissolution-inhibiting groups for the base resins of chemically amplified resists may be used. Specific examples include the same groups as those exemplified above as the acid-dissociable, dissolution-inhibiting group within the structural unit (a1) of component (A).

Examples of the divalent linking group for $R^{28}$ include the same groups as those exemplified above for $X_{00}$ within formula (f1-1).

In the present invention, the divalent linking group for $R^{28}$ is preferably an alkylene group, a divalent aliphatic cyclic group, or a divalent linking group containing a hetero atom.

When $R^{28}$ is an alkylene group, the alkylene group preferably contains from 1 to 10 carbon atoms, more preferably 1 to 6 carbon atoms, still more preferably 1 to 4 carbon atoms, and most preferably 1 to 3 carbon atoms.

When $R^{28}$ is a divalent aliphatic cyclic group, examples of the aliphatic cyclic group include the same groups as those listed above in the description of the "aliphatic cyclic group" within formula (w-2) with the exception that two or more hydrogen atoms have been removed from the cycloalkane. The aliphatic cyclic group is preferably a group in which 2 or more hydrogen atoms have been removed from cyclopentane, cyclohexane, norbornane, isobornane, adamantane, tricyclodecane or tetracyclododecane.

When $R^{28}$ is a divalent linking group containing a hetero atom, examples of the divalent group containing a hetero atom include —O—, —C(=O)—O—, —C(=O)—, —O—C(=O)—O—, —C(=O)—NH—, —NH— (wherein H may be replaced with a substituent such as an alkyl group or acyl group or the like), —S—, —S(=O)$_2$—, —S(=O)$_2$—O—, groups represented by the formula -$A^{01}$-O—$B^{01}$—, and groups represented by the formula -[$A^{01}$-C(=O)—O]$_m$—$B^{01}$—. In these formulas, each of $A^{01}$ and $B^{01}$ represents a divalent hydrocarbon group which may have a substituent, and m represents an integer of 1 to 3.

When $R^{28}$ represents —NH— and H is replaced with a substituent (such as an alkyl group or acyl group or the like), this substituent preferably contains 1 to 10 carbon atoms, more preferably 1 to 8 carbon atoms, and most preferably 1 to 5 carbon atoms.

When $R^{28}$ is a group represented by the formula -$A^{01}$-O—$B^{01}$— or the formula -[$A^{01}$-C(=O)—O]$_m$—$B^{01}$—, each of $A^{01}$ and $B^{01}$ represents a divalent hydrocarbon group which may have a substituent.

m represents an integer of 1 to 3, more preferably an integer of 1 or 2, and most preferably 1.

The hydrocarbon group for $A^{01}$ may be an aliphatic hydrocarbon group or an aromatic hydrocarbon group. An "aliphatic hydrocarbon group" refers to a hydrocarbon group that has no aromaticity.

The aliphatic hydrocarbon group for $A^{01}$ may be saturated or unsaturated, but is preferably saturated.

Specific examples of the aliphatic hydrocarbon group for $A^{01}$ include linear and branched aliphatic hydrocarbon groups, and aliphatic hydrocarbon groups containing a ring in the structure thereof.

The "linear and branched aliphatic hydrocarbon groups" for $A^{01}$ preferably contain 1 to 10 carbon atoms, and more preferably 1 to 8, still more preferably 1 to 5, and most preferably 1 or 2 carbon atoms.

As the linear aliphatic hydrocarbon group, a linear alkylene group is preferable, and specific examples thereof include a methylene group, an ethylene group [—(CH$_2$)$_2$—], a trimethylene group [—(CH$_2$)$_3$—], a tetramethylene group [—(CH$_2$)$_4$—] and a pentamethylene group [—(CH$_2$)$_5$—].

As the branched aliphatic hydrocarbon group, a branched alkylene group is preferable, and specific examples include alkylalkylene groups, including alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—, alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$— and —C(CH$_2$CH$_3$)$_2$—CH$_2$—, alkyltrimethylene groups such as —CH(CH$_3$)CH$_2$CH$_2$— and —CH$_2$CH(CH$_3$)CH$_2$—, and alkyltetramethylene groups such as —CH(CH$_3$)CH$_2$CH$_2$CH$_2$— and —CH$_2$CH(CH$_3$)CH$_2$CH$_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of the substituent include a fluorine atom, a fluorinated alkyl group of 1 to 5 carbon atoms, and an oxygen atom (=O).

Examples of the "aliphatic hydrocarbon group containing a ring in the structure thereof" for $A^{01}$ include cyclic aliphatic hydrocarbon groups (groups in which two hydrogen atoms have been removed from an aliphatic hydrocarbon ring), and groups in which the cyclic aliphatic hydrocarbon group is bonded to the terminal of an aforementioned chain-like aliphatic hydrocarbon group or interposed within an aforementioned chain-like aliphatic hydrocarbon group.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Specific examples of the polycycloalkane include adamantane, norbornane, isobornane, tricyclodecane and tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

As $A^{01}$, a linear aliphatic hydrocarbon group is preferable, a linear alkylene group is more preferable, an alkylene group of 1 to 5 carbon atoms is still more preferable, a methylene group or ethylene group is still more preferable, and an ethylene group is the most desirable.

Examples of the hydrocarbon group for $B^{01}$ include the same divalent hydrocarbon groups as those described above for $A^{01}$.

As $B^{01}$, a linear or branched aliphatic hydrocarbon group is preferable, and a methylene group, an ethylene group or an alkylmethylene group is particularly desirable.

The alkyl group within this alkylmethylene group is preferably a linear alkyl group of 1 to 5 carbon atoms, more preferably a linear alkyl group of 1 to 3 carbon atoms, and most preferably a methyl group.

Further, in the group represented by the formula -[$A^{01}$-C(=O)—O]$_m$—$B^{01}$—, m represents an integer of 1 to 3, preferably an integer of 1 to 2, and most preferably 1.

In the present invention, the divalent linking group for $R^{28}$ is preferably a divalent group containing a hetero atom, and is more preferably a linear group containing an oxygen atom as the hetero atom such as a group containing an ester linkage.

Of such groups, groups represented by the above formulas -$A^{01}$-O—$B^{01}$— and -$A^{01}$—C(=O)—O—$B^{01}$— are preferred, and groups represented by the formula —(CH$_2$)$_a$—C(=O)—O—(CH$_2$)$_b$— are particularly desirable.

a represents an integer of 1 to 5, is preferably 1 or 2, and is most preferably 2.

b represents an integer of 1 to 5, is preferably 1 or 2, and is most preferably 1.

In formula (w-4), $R^{29'}$ represents a linear or branched alkyl group or an aliphatic cyclic group.

When $R^{29'}$ is a linear or branched group, it preferably contains 1 to 15 carbon atoms, and more preferably 1 to 5 carbon atoms. An ethyl group or methyl group is still more preferred, and an ethyl group is the most desirable.

If $R^{29'}$ is an aliphatic cyclic group, then any of the multitude of monocyclic or polycyclic aliphatic cyclic groups proposed for use within conventional ArF resist or the like may be used, and specific examples include the same groups as those listed above in relation to the "aliphatic cyclic group".

The aliphatic cyclic group for $R^{29'}$ preferably contains 4 to 15 carbon atoms, more preferably 4 to 12 carbon atoms, and most preferably 5 to 10 carbon atoms. Examples of the aliphatic cyclic group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane. Of these, groups in which one or more hydrogen atoms have been removed from adamantane are particularly desirable.

In formula (w-4), n represents an integer of 0 to 3, is preferably an integer of 0 to 2, more preferably either 0 or 1, and most preferably 0.

Each of $R^{30}$ and $R^{30'}$ represents a linear or branched alkyl group or a hydrogen atom.

The linear or branched alkyl groups for $R^{30}$ and $R^{30'}$ are preferably alkyl groups of 1 to 5 carbon atoms. Examples of these alkyl groups of 1 to 5 carbon atoms include the same alkyl groups of 1 to 5 carbon atoms as those listed above in relation to R. A methyl group or ethyl group is preferable, and a methyl group is the most desirable.

In the present invention, it is preferable that at least one of $R^{30}$ and $R^{30'}$ is a hydrogen atom.

In the above formula (w-4), $R^{29'}$ and $R^{30}$ may be bonded together to form an aliphatic cyclic group.

In this case, an aliphatic cyclic group is formed from $R^{29'}$, $R^{30}$, the —O—$(CH_2)_n$— group, and the carbon atom to which $R^{30}$ is bonded. This aliphatic cyclic group is preferably a 4- to 7-membered ring, and more preferably a 4- to 6-membered ring. Specific examples of this aliphatic cyclic group include a tetrahydropyranyl group and a tetrahydrofuranyl group.

Specific examples of the group represented by formula (w-4) include the groups represented by formulas (w-4-1) to (w-4-12) shown below.

[Chemical Formula 72]

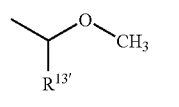
(w-4-1)

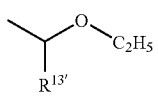
(w-4-2)

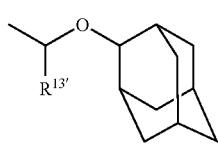
(w-4-3)

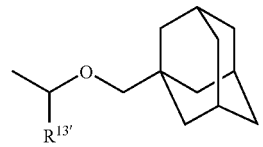
(w-4-4)

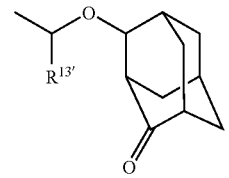
(w-4-5)

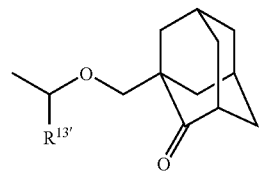
(w-4-6)

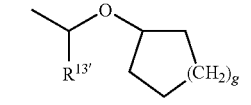
(w-4-7)

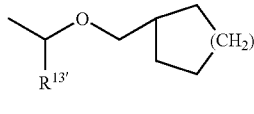
(w-4-8)

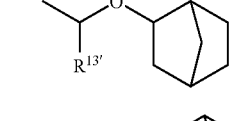
(w-4-9)

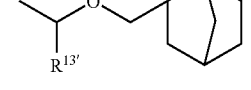
(w-4-10)

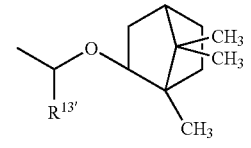
(w-4-11)

(w-4-12)

In the formulas, $R^{13'}$ represents a hydrogen atom or a methyl group, and g is the same as defined above.

As the structural unit (f2) within the component (F), either a single structural unit may be used alone, or two or more types of structural units may be used in combination.

The amount of the structural unit (f2) within the component (F), based on the combined total of all the structural units that constitute the component (F), is preferably within a range from 5 to 80 mol %, more preferably from 10 to 60 mol %, still more preferably from 15 to 50 mol %, and most preferably from 20 to 40 mol %. If the amount of the structural unit (f2) is at least as large as the lower limit of the above-mentioned range, then the property of the component (F) wherein, during resist pattern formation, the component (F) is hydrophobic during immersion exposure but then becomes hydrophilic following exposure and PEB becomes particularly marked. Further, bridge defects within line and space patterns are inhibited, and incomplete hole-opening defects within contact hole patterns can also be inhibited. Furthermore, the proportion of hydrocarbon groups increases, providing improved scan tracking properties. On the other hand, by ensuring that the amount of the structural unit (f2) is not more than the upper limit of the above-mentioned range, a good balance can be achieved with the structural unit (f1), and the water repellency effect is improved.

[Other Structural Units]

The component (F) may also include another structural unit (hereafter referred to as "structural unit (f3)") in addition to the structural units (f1) and (f2), provided the inclusion of this other structural unit does not impair the effects of the present invention.

There are no particular limitations on the structural unit (f3), and any structural unit derived from a compound that is capable of copolymerization with the compound that gives rise to the structural unit (f1) and the compound that gives rise to the structural unit (f2) may be used. Examples of such other structural units include those structural units proposed for the base resins of conventional chemically amplified resists (such as the structural units (a1) to (a3) and (a6) described above).

In the present invention, the component (F) is preferably a copolymer containing the structural unit (f1) and the structural unit (f2). Examples of this copolymer include copolymers composed solely of the structural units (f1) and (f2), and copolymers composed of the structural unit (f1), the structural unit (f2) and the structural unit (f3).

In the present invention, the component (F) is most preferably a copolymer composed solely of the structural unit (f1) and the structural unit (f2).

Although there are no particular limitations on the weight average molecular weight (the polystyrene equivalent value determined by gel permeation chromatography) of the component (F), the molecular weight is preferably within a range from 2,000 to 50,000, more preferably from 3,000 to 30,000, and most preferably from 4,000 to 25,000. By ensuring that the molecular weight is not more than the upper limit of the above-mentioned range, the component (F) exhibits satisfactory solubility in the resist solvent when used within a resist. On the other hand, ensuring that the weight average molecular weight is at least as large as the lower limit of the above range yields more favorable dry etching resistance and a better cross-sectional shape for the resist pattern.

The dispersity (Mw/Mn) is preferably within a range from 1.0 to 5.0, more preferably from 1.0 to 3.0, and most preferably from 1.2 to 2.5. Mn is the number average molecular weight.

The component (F) can be obtained by conducting a conventional radical polymerization or the like of the monomers that give rise to each of the structural units that constitute the component (F), using a radical polymerization initiator such as azobisisobutyronitrile (AIBN) or dimethyl-2,2'-azobis(2-methylpropionate) (product name: V-601).

Examples of the monomer that gives rise to the structural unit (f2) include compounds represented by the formula $CH_2=C(R)-C(=O)-O-W$ (wherein each of R and W is the same as defined above), and commercially available versions of these compounds may be used.

Examples of the monomer that gives rise to the structural unit (f1) include compounds in which a base-dissociable group and a polymerizable group are bonded together via a divalent linking group.

The term "polymerizable group" describes a group that enables a compound containing that polymerizable group to undergo a radical polymerization or the like, and typical examples include groups containing an ethylenic double bond. Examples of such groups containing an ethylenic double bond include groups represented by the formula $CH_2=CR-$ (wherein R is the same as defined above).

Examples of the divalent linking group include groups represented by the formula $-A_{aryl}-X_{01}-$ (wherein $A_{aryl}$ and $X_{01}$ are the same as defined above) and groups represented by the formula $-C(=O)-O-X_{00}-$ (wherein $X_{00}$ is the same as defined above).

Examples of monomers that give rise to the structural unit represented by general formula (f1-1) and monomers that give rise to the structural unit represented by general formula (f1-2) include the fluorine-containing compounds represented by general formula (f0-1) and general formula (f0-2) shown below.

[Chemical Formula 73]

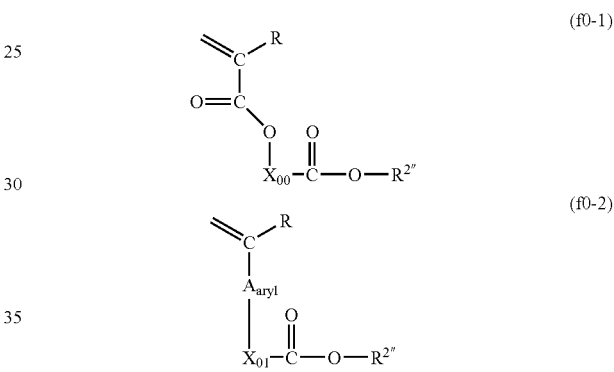

In these formulas, each of R, $X_{00}$, $A_{aryl}$, $X_{01}$ and $R^{2\prime\prime}$ is the same as defined above.

A fluorine-containing compound represented by formula (f0-1) or (f0-2) (hereafter referred to as "the fluorine-containing compound (F0)") can be produced, for example, by introducing an $R^{2\prime\prime}$ group (wherein $R^{2\prime\prime}$ is the same as defined above) at the carboxyl group of a compound represented by general formula (f0-1-0) or general formula (f0-1-0) shown below (hereafter referred to jointly as "compound (V-1)") (namely, by substituting the hydrogen atom at the terminal of the carboxyl group of the compound (V-1) with an $R^{2\prime\prime}$ group).

This introduction of $R^{2\prime\prime}$ can be conducted using conventional methods. For example, the fluorine-containing compound (F0) can be produced by reacting the compound (V-1) with a compound (V-2) represented by general formula (V-2) shown below.

[Chemical Formula 74]

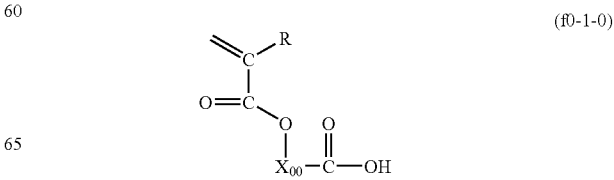

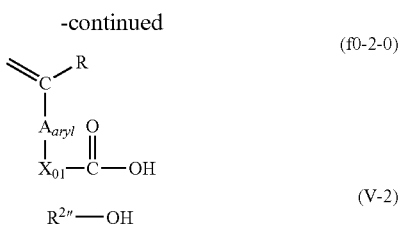

(f0-2-0)

$$R^{2''}-OH \quad (V\text{-}2)$$

In the formulas, each of R, $X_{00}$, $A_{aryl}$, $X_{01}$ and $R^{2''}$ is the same as defined above.

There are no particular limitations on the method used for reacting the compound (V-1) and the compound (V-2), and for example, a method may be used in which the compound (V-1) and the compound (V-2) are brought into contact within a reaction solvent, in the presence of a base.

As the compound (V-1) and the compound (V-2), either commercially available products or synthesized compounds may be used.

Examples of compounds that may be used as the compound (V-1) include low molecular weight compounds derived from acrylate esters such as carboxyalkyl (meth) acrylates and mono((meth)acryloyloxyalkyl) succinates, and polymer compounds having a structural unit derived from an acrylate ester.

As the compound (V-2), fluorinated alkyl alcohols and the like may be used.

As the reaction solvent, any solvent that is capable of dissolving the compound (V-1) and the compound (V-2) that act as the raw materials may be used, and specific examples of the solvent include tetrahydrofuran (THF), acetone, dimethylformamide (DMF), dimethylacetamide, dimethylsulfoxide (DMSO) and acetonitrile.

Examples of the base include organic bases such as triethylamine, 4-dimethylaminopyridine (DMAP) and pyridine, as well as inorganic bases such as sodium hydride, $K_2CO_3$ and $Cs_2CO_3$.

Examples of condensation agents that may be used include carbodiimide reagents such as ethyldiisopropylaminocarbodiimide (EDCI) hydrochloride, dicyclohexylcarbodiimide (DCC), diisopropylcarbodiimide and carbodiimidazole, as well as tetraethyl pyrophosphate and benzotriazole-N-hydroxytrisdimethylaminophosphonium hexafluorophosphate (Bop reagent).

Further, an acid may also be used if necessary. As the acid, those acids typically used within dehydration-condensation reactions and the like can be used, and specific examples include inorganic acids such as hydrochloric acid, sulfuric acid and phosphoric acid, and organic acids such as methanesulfonic acid, trifluoromethanesulfonic acid, benzenesulfonic acid and p-toluenesulfonic acid. These acids may be used alone, or in combinations containing two or more different acids.

The amount added of the compound (V-2) relative to the compound (V-1) is preferably within a range from 1 to 3 equivalents, and more preferably from 1 to 2 equivalents.

The reaction temperature is preferably within a range from −20 to 40° C., and more preferably from 0 to 30° C.

The reaction time varies depending on factors such as the reactivity of the compound (V-1) and compound (V-2) and the reaction temperature, but is preferably within a range from 30 to 480 minutes, and more preferably from 60 to 360 minutes.

The amount of the component (F) used in the present invention is preferably within a range from 0.1 to 50 parts by weight, more preferably from 0.1 to 40 parts by weight, still more preferably from 0.5 to 30 parts by weight, and most preferably from 1 to 15 parts by weight, per 100 parts by weight of the component (A). By ensuring that the amount of the component (F) is at least as large as the lower limit of the above-mentioned range, the hydrophobicity of the resist film formed using a positive resist composition for immersion exposure can be improved, and a level of hydrophobicity that is ideal for immersion exposure can be achieved. On the other hand, ensuring that the amount of the component (F) is not more than the upper limit of the above range improves the lithography properties.

The positive resist composition of the present invention can be prepared by dissolving the materials for the resist composition in an organic solvent (hereafter, frequently referred to as "component (S)").

The component (S) may be any organic solvent which can dissolve the respective components to give a uniform solution, and one or more varieties of organic solvent can be appropriately selected from those which have been conventionally known as solvents for chemically amplified resists.

Specific examples of the organic solvent include lactones such as γ-butyrolactone; ketones such as acetone, methyl ethyl ketone, cyclohexanone, methyl-n-pentyl ketone, methyl isopentyl ketone and 2-heptanone; polyhydric alcohols such as ethylene glycol, diethylene glycol, propylene glycol and dipropylene glycol; polyhydric alcohol derivatives, including compounds having an ester bond such as ethylene glycol monoacetate, diethylene glycol monoacetate, propylene glycol monoacetate and dipropylene glycol monoacetate, and compounds having an ether bond such as a monoalkyl ether (such as a monomethyl ether, monoethyl ether, monopropyl ether or monobutyl ether) or a monophenyl ether of any of the above polyhydric alcohols or compounds having an ester bond [among these derivatives, propylene glycol monomethyl ether acetate (PGMEA) and propylene glycol monomethyl ether (PGME) are preferred]; cyclic ethers such as dioxane; esters such as methyl lactate, ethyl lactate (EL), methyl acetate, ethyl acetate, butyl acetate, methyl pyruvate, ethyl pyruvate, methyl methoxypropionate and ethyl ethoxypropionate; and aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene and mesitylene.

These organic solvents may be used individually, or as mixed solvents containing two or more solvents.

Among these, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of the mixed solvent can be determined appropriately with due consideration of the compatibility of the PGMEA with the polar solvent, but is preferably in the range of 1:9 to 9:1, and more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the organic solvent is not particularly limited, and may be adjusted appropriately to a concentration that enables coating of a coating solution to a substrate in accordance with the thickness of the coating film. In general, the organic solvent is used in an amount that yields a solid content for the resist composition that is within a range from 1 to 20% by weight, and preferably from 2 to 15% by weight.

In the positive resist composition of the present invention described above, as a result of the structural unit (a0) having an aromatic group, (1) the hydrocarbon density within the positive resist composition increases, resulting in more favorable etching resistance, (2) intermolecular interactions are enhanced, thereby improving the resistance to pattern collapse, (3) the light absorption resulting from the introduction of aromatic rings into the component (A) accelerates the acid-generating reaction of the component (B), thus improving the sensitivity of the positive resist composition to EB and EUV. Furthermore in those cases where the aromatic group of the structural unit (a0) is substituted with a hydroxyl group or an alkylcarbonyloxy group, it is thought that additional effects are achieved, including (4) an improvement in adhesion of the composition to substrates as a result of the introduction of the polar substituent, (5) an increase in the dissolution rate (developing rate) as a result of enhanced solubility within the alkali developing solution caused by the introduction of the substituent, and (6) an improvement in the heat resistance and various lithography properties such as the sensitivity as a result of hydrogen bonding effects.

Moreover, it is thought that in those cases where the cyclic group within the structural unit (a5) is a bulky group, further improvements in the etching resistance can be achieved.

Further, by including the structural unit (a1), it is thought that within a resist film formed from the resist composition containing the component (A1), the action of the acid generated within the exposed portions causes the acid-dissociable, dissolution-inhibiting group within the structural unit (a1) to dissociate, yielding a carboxyl group at the terminal of the side chain of the structural unit (a1), and as a result, the contrast in the solubility within the alkali developing solution between the exposed portions and the unexposed portions is magnified, enabling a resist pattern of superior shape to be formed.

<<Method of Forming a Resist Pattern>>

The method of forming a resist pattern according to the present invention includes: applying the positive resist composition of the present invention to a substrate to form a resist film on the substrate, conducting exposure of the resist film, and developing the resist film to form a resist pattern.

More specifically, the method for forming a resist pattern according to the present invention can be performed, for example, in the manner described below.

Firstly, a positive resist composition according to the present invention is applied onto a substrate using a spinner or the like, and a prebake (post applied bake (PAB)) is conducted at a temperature of 80 to 150° C. for 40 to 120 seconds, and preferably 60 to 90 seconds, to form a resist film. Following selective exposure of the resist film, either by exposure through a mask pattern using an exposure apparatus such as an ArF exposure apparatus, an electron beam lithography apparatus or an EUV exposure apparatus, or by patterning via direct irradiation with an electron beam without using a mask pattern, PEB (post exposure baking) is conducted under temperature conditions of 80 to 150° C. for 40 to 120 seconds, and preferably 60 to 90 seconds. Subsequently, developing is conducted using an alkali developing solution such as a 0.1 to 10% by weight aqueous solution of tetramethylammonium hydroxide (TMAH), preferably followed by rinsing with pure water and drying. If desired, a bake treatment (post bake) can be conducted following the developing. In this manner, a resist pattern that is faithful to the mask pattern can be obtained.

The substrate is not specifically limited, and conventionally known substrates can be used. For example, substrates for electronic components, and such substrates having wiring patterns formed thereon can be used. Specific examples of the material of the substrate include metals such as silicon wafer, copper, chromium, iron and aluminum, as well as glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) can be used.

The wavelength to be used for exposure is not particularly limited and the exposure can be conducted using radiation such as an ArF excimer laser, KrF excimer laser, $F_2$ excimer laser, extreme ultraviolet rays (EUV), vacuum ultraviolet rays (VUV), electron beam (EB), X-rays, and soft X-rays. The positive resist composition of the present invention is effective for use with a KrF excimer laser, ArF excimer laser, EB and EUV, and is particularly effective to an ArF excimer laser.

The exposure of the resist film can be either a general exposure (dry exposure) conducted in air or an inert gas such as nitrogen, or an immersion exposure (liquid immersion lithography).

In liquid immersion lithography, the region between the resist film and the lens at the lowermost point of the exposure apparatus is pre-filled with a solvent (an immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, wherein the boiling point of the fluorine-based inert liquid is preferably within a range from 70 to 180° C., and more preferably from 80 to 160° C. A fluorine-based inert liquid having a boiling point within the above-mentioned range is advantageous in that the removal of the immersion medium after the exposure can be conducted by a simple method.

As the fluorine-based inert liquid, a perfluoroalkyl compound in which all of the hydrogen atoms of the alkyl group have been substituted with fluorine atoms is particularly desirable. Examples of these perfluoroalkyl compounds include perfluoroalkyl ether compounds and perfluoroalkyl amine compounds. Specifically, one example of a suitable perfluoroalkyl ether compound is perfluoro(2-butyl-tetrahydrofuran) (boiling point 102° C.), and an example of a suitable perfluoroalkyl amine compound is perfluorotributylamine (boiling point 174° C.).

As the immersion medium, water is preferable in terms of cost, safety, environment and versatility.

<<Polymeric Compound>>

The polymeric compound of the present invention includes a structural unit (a0) having an aromatic group, a structural unit (a5) represented by general formula (a5-1) shown below, and a structural unit (a1) derived from an acrylate ester containing an acid-dissociable, dissolution-inhibiting group.

The explanation of the polymeric compound of the present invention is the same as the explanation of the component (A1) of the positive resist composition of the present invention described above.

[Chemical Formula 75]

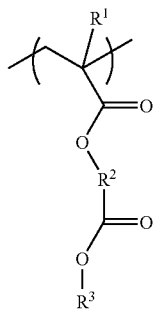

(a5-1)

In the formula, $R^1$ represents a hydrogen atom, an alkyl group of 1 to 5 carbon atoms or a halogenated alkyl group of 1 to 5 carbon atoms, $R^2$ represents a divalent linking group, and $R^3$ represents a cyclic group containing —$SO_2$— within the ring skeleton thereof.

EXAMPLES

A more detailed description of the present invention is presented below based on a series of examples, although the scope of the present invention is in no way limited by these examples.

In the following examples, a unit represented by a chemical formula (1) is designated as "compound (1)", and the same labeling system applies for compounds represented by other formulas.

Monomer Synthesis Example 1

Synthesis of Compound (1)

The compound (1) used in the polymer synthesis examples described below was synthesized using the procedure described below.

A 500 ml three-necked flask was charged, under a nitrogen atmosphere, with 300 ml of a tetrahydrofuran (THF) solution containing 20 g (105.14 mmol) of an alcohol (1), 30.23 g (157.71 mmol) of ethyldiisopropylaminocarbodiimide (EDCI) hydrochloride and 0.6 g (5 mmol) of dimethylaminopyridine (DMAP). Subsequently, 16.67 g (115.66 mmol) of a precursor (1) was added to the flask, and the resulting mixture was stirred at room temperature for 12 hours.

After conducting thin-layer chromatography (TLC) to confirm that the raw materials had been consumed, 50 ml of water was added to stop the reaction. Subsequently, the reaction solvent was concentrated under reduced pressure, and extraction was conducted with ethyl acetate three times. The thus obtained organic phase was washed sequentially with water, saturated sodium hydrogen carbonate and 1N-HClaq. Thereafter, the solvent was distilled off under reduced pressure, and the resulting product was dried, yielding the compound (1).

The results of instrumental analysis of the obtained compound (1) were as follows.

$^1$H-NMR (CDCl$_3$, 400 MHz): δ(ppm)=6.22 (s, 1H, H$^a$), 5.70 (s, 1H, H$^b$), 4.71-4.85 (m, 2H, H$^{c,d}$), 4.67 (s, 2H, H$^k$), 3.40-3.60 (m, 2H, H$^{e,f}$), 2.58-2.70 (m, 1H, H$^g$), 2.11-2.21 (m, 2H, H$^h$), 2.00 (s, 3H, H$^i$), 1.76-2.09 (m, 2H, H$^j$).

[Chemical Formula 76]

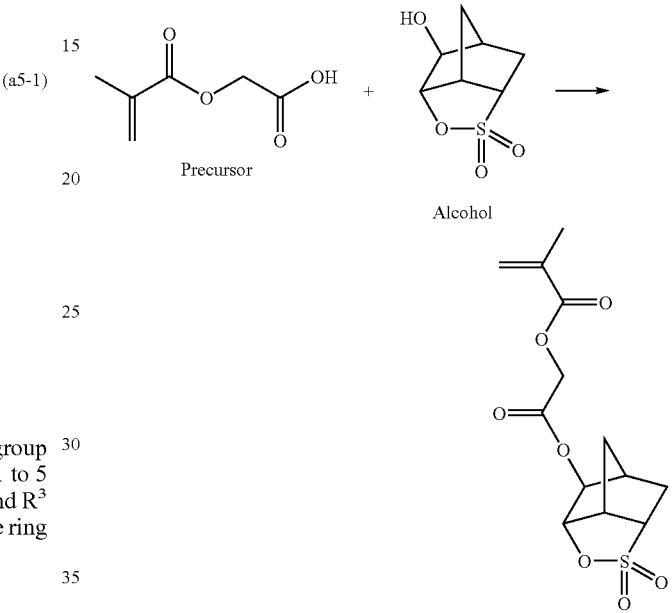

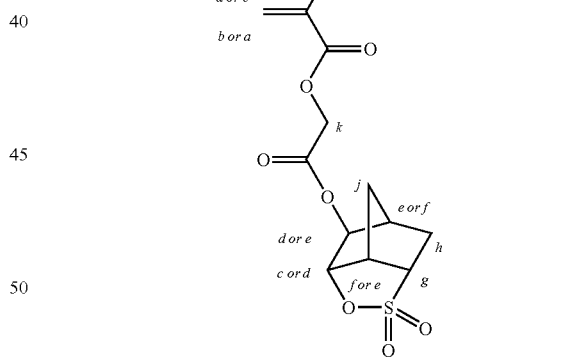

Monomer Synthesis Example 2

Synthesis of Compound (2)

The compound (2) used in the polymer synthesis examples described below was synthesized using the procedure described below.

A 2 L three-necked flask fitted with a thermometer, a cooling tube and a stirrer was charged with 37.6 g (494 mmol) of glycolic acid, 700 ml of DMF, 86.5 g (626 mmol) of potassium carbonate, and 28.3 g (170 mmol) of potassium iodide, and the resulting mixture was stirred at room temperature for 30 minutes. Subsequently, 300 ml of a dimethylformamide solution containing 100 g (412 mmol) of 2-methyl-2-adamantyl chloroacetate was added gradually to the flask. The resulting mixture was then heated to 40° C., and stirred for 4 hours. Following completion of the reaction, 2,000 ml of diethyl ether was added to the reaction mixture, the mixture was filtered, and the resulting solution was washed three times with 500 ml samples of distilled water. Crystallization was then conducted using a mixed solvent containing 300 ml of toluene and 200 ml of heptane, yielding 78 g of the target compound (2-(2-(2-methyl-2-adamantyloxy)-2-oxoethoxy)-2-oxoethanol) in the form of a colorless solid (yield: 67%, GC purity: 99%).

The results of instrumental analysis of the obtained compound were as follows.

$^1$H-NMR: 1.59 (d, 2H, J=12.5 Hz), 1.64 (s, 3H), 1.71-1.99 (m, 10H), 2.29 (m, 2H), 2.63 (t, 1H, J=5.2 Hz), 4.29 (d, 2H, J=5.2 Hz), 4.67 (s, 2H).

$^{13}$C-NMR: 22.35, 26.56, 27.26, 32.97, 34.54, 36.29, 38.05, 60.54, 61.50, 89.87, 165.97, 172.81.

GC-MS: 282 (M+, 0.02%), 165 (0.09%), 149 (40%), 148 (100%), 133 (22%), 117 (2.57%), 89 (0.40%).

From the results above, it was confirmed that the obtained compound was 2-(2-(2-methyl-2-adamantyloxy)-2-oxoethoxy)-2-oxoethanol.

Subsequently, 165 g (584 mmol) of 2-(2-(2-methyl-2-adamantyloxy)-2-oxoethoxy)-2-oxoethanol, 2,000 ml of THF, 105 ml (754 mmol) of triethylamine, and 0.165 g (1,000 ppm) of p-methoxyphenol were added to and dissolved in a 2 L three-necked flask equipped with a thermometer, a cooling pipe, and a stirrer. Following dissolution, 62.7 ml (648 mmol) of methacryloyl chloride was added gradually to the flask while cooling in an ice bath. The temperature of the resulting mixture was then elevated to room temperature, and the resultant was stirred for 3 hours. Following completion of the reaction, 1,000 ml of diethyl ether was added to the flask, and the flask contents were washed 5 times with 200 ml samples of distilled water. The extracted liquid was then concentrated, yielding 198 g of a target compound (compound (2)) in the form of a colorless liquid (yield: 97%, GC purity: 99%).

The results of instrumental analysis of the obtained compound (2) were as follows.

$^1$H-NMR: 1.58 (d, J=12.5 Hz, 2H), 1.63 (s, 3H), 1.71-1.89 (m, 8H), 1.98 (s, 3H), 2.00 (m, 2H), 2.30 (m, 2H), 4.62 (s, 2H), 4.80 (s, 2H), 5.66 (m, 1H), 6.23 (m, 1H).

$^{13}$C-NMR: 18.04, 22.15, 26.42, 27.14, 32.82, 34.38, 36.11, 37.92, 60.44, 61.28, 89.42, 126.79, 135.18, 165.61, 166.30, 167.20.

GC-MS: 350 (M+, 1.4%), 206 (0.13%), 149 (47%), 148 (100%), 133 (20%), 69 (37%).

Polymer Synthesis Example 1

In a separable flask fitted with a thermometer, a reflux tube and a nitrogen inlet tube, 13.00 g (41.14 mmol) of a compound (1) and 3.77 g (23.25 mmol) of a compound (4) were dissolved in 43.91 g of methyl ethyl ketone (MEK) to obtain a solution. Subsequently, 12.52 mmol of dimethyl azobisisobutyrate (V-601) was added and dissolved in the solution as a polymerization initiator. The resulting solution was added dropwise, over a period of three hours and under a nitrogen atmosphere, to a solution obtained by dissolving 29.99 g (114.47 mmol) of a compound (3) in 29.99 g of MEK and heating to 80° C. Following completion of the dropwise addition, the reaction solution was heated for 2 hours under stirring, and was then cooled to room temperature. The thus obtained reaction polymer solution was added dropwise to an excess amount of n-heptane to precipitate the polymer, and the precipitated white powder was separated by filtration, washed sequentially with n-heptane, isopropyl alcohol and methanol, and subsequently dried, yielding 27 g of a polymeric compound 1 as the target compound.

For this polymeric compound 1, the weight average molecular weight (Mw) determined by GPC measurement and referenced against standard polystyrenes was 7,000, and the dispersity (Mw/Mn) was 1.75. Further, analysis of the polymeric compound 1 by carbon-13 nuclear magnetic resonance spectroscopy (600 MHz, $^{13}$C— NMR) revealed that the compositional ratio of the copolymer (namely, the ratio (molar ratio) of each of the respective structural units within the structural formula) was 1/m/n=31.2/51.5/17.3.

[Chemical Formula 77]

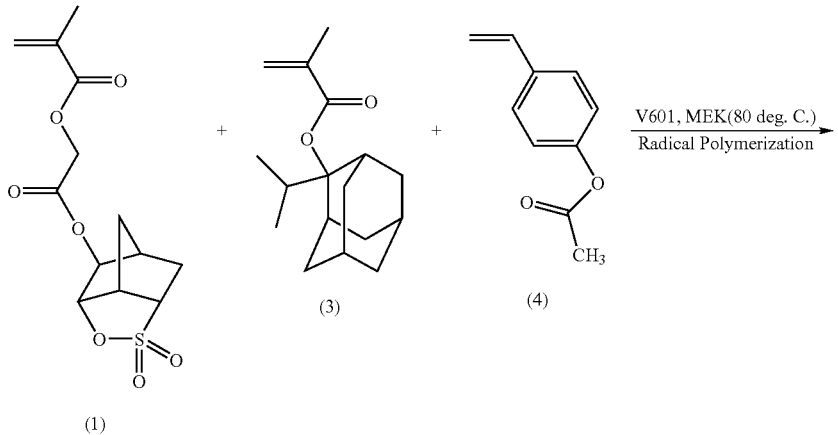

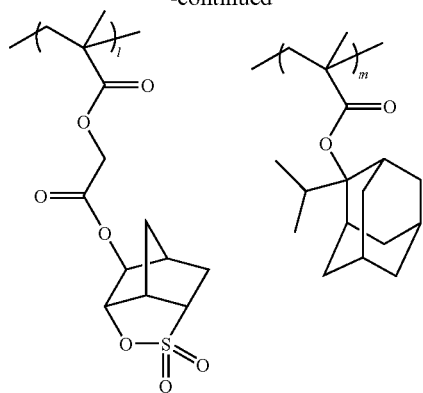
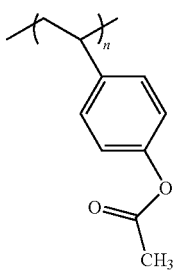

Polymeric compound 1

Polymeric compounds 2 to 8 were synthesized in the same manner as that described above for [Polymer Synthesis Example 1], with the exception that the monomers (1) to (9) described below that give rise to each of the structural units that constitute the polymeric compound were used at predetermined molar ratios. For each polymeric compound, the values for Mw, Mw/Mn, and the compositional ratio of the copolymer are listed in Table 1.

[Chemical Formula 78]

(1)

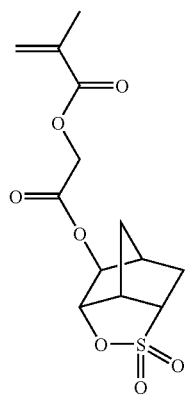

(2)

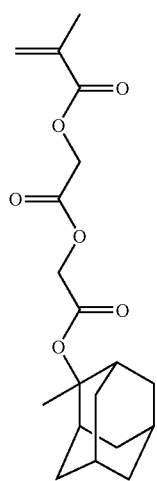

-continued (3)

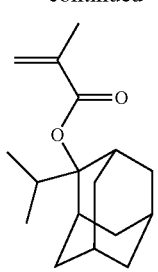

(4)

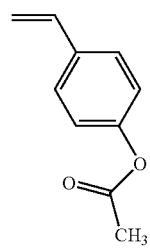

(5)

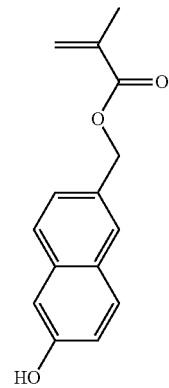

-continued (6)
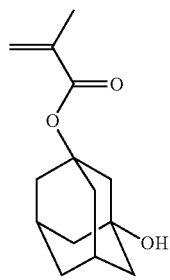

(7)
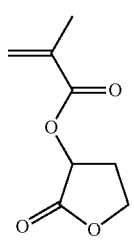

(8)
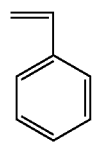

(9)
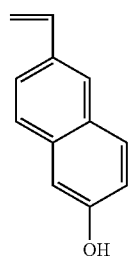

Examples 1 to 7, Reference Example 1

The components shown in Table 2 were mixed together and dissolved to obtain a series of positive resist compositions.

TABLE 2

| | Component (A) | Component (B) | Component (D) | Component (S) | |
|---|---|---|---|---|---|
| Example 1 | (A)-1 [100] | (B)-1 [9.8] | (D)-1 [0.5] | (S)-1 [2700] | (S)-2 [10] |
| Example 2 | (A)-2 [100] | (B)-1 [9.8] | (D)-1 [0.5] | (S)-1 [2700] | (S)-2 [10] |
| Example 3 | (A)-3 [100] | (B)-1 [9.8] | (D)-1 [0.5] | (S)-1 [2700] | (S)-2 [10] |
| Example 4 | (A)-4 [100] | (B)-1 [9.8] | (D)-1 [0.5] | (S)-1 [2700] | (S)-2 [10] |
| Example 5 | (A)-5 [100] | (B)-1 [9.8] | (D)-1 [0.5] | (S)-1 [2700] | (S)-2 [10] |
| Example 6 | (A)-6 [100] | (B)-1 [9.8] | (D)-1 [0.5] | (S)-1 [2700] | (S)-2 [10] |
| Example 7 | (A)-7 [100] | (B)-1 [9.8] | (D)-1 [0.5] | (S)-1 [2700] | (S)-2 [10] |
| Reference example 1 | (A)-8 [100] | (B)-1 [9.8] | (D)-1 [0.5] | (S)-1 [2700] | (S)-2 [10] |

In Table 2, the numerical values in brackets [ ] indicate the amount (in terms of parts by weight) of the component added. Further, the reference characters in Table 2 indicate the following.

(A)-1: the aforementioned polymeric compound 1
(A)-2: the aforementioned polymeric compound 2
(A)-3: the aforementioned polymeric compound 3
(A)-4: the aforementioned polymeric compound 4
(A)-5: the aforementioned polymeric compound 5
(A)-6: the aforementioned polymeric compound 6
(A)-7: the aforementioned polymeric compound 7
(A)-8: the aforementioned polymeric compound 8
(B)-1: a compound represented by chemical formula (B)-1 shown below
(D)-1: tri-n-pentylamine
(S)-1: a mixed solvent of PGMEA/PGME=6/4 (weight ratio)
(S)-2: γ-butyrolactone

TABLE 1

| | (1) | (2) | (3) | (4) | (5) | (6) | (7) | (8) | (9) | Mw | Mw/Mn |
|---|---|---|---|---|---|---|---|---|---|---|---|
| Polymeric compound 1 | 31.2 | — | 51.5 | 17.3 | — | — | — | — | — | 7000 | 1.75 |
| Polymeric compound 2 | 31.4 | — | 50.9 | — | — | — | 17.7 | — | — | 7500 | 1.74 |
| Polymeric compound 3 | 30.2 | 10.1 | 50.1 | — | 10.6 | — | — | — | — | 8600 | 1.76 |
| Polymeric compound 4 | 21.0 | 10.6 | 49.0 | — | 19.4 | — | — | — | — | 7800 | 1.76 |
| Polymeric compound 5 | 20.2 | — | 48.2 | — | 31.6 | — | — | — | — | 7100 | 1.73 |
| Polymeric compound 6 | 30.8 | — | 51.0 | — | — | — | — | — | 18.2 | 8000 | 1.72 |
| Polymeric compound 7 | 15.1 | 10.0 | 50.2 | — | 10.5 | — | 15.2 | — | — | 8500 | 1.78 |
| Polymeric compound 8 | 33.8 | 10.3 | 45.7 | — | — | 10.2 | — | — | — | 8900 | 1.67 |

[Chemical Formula 79]

(B)-1

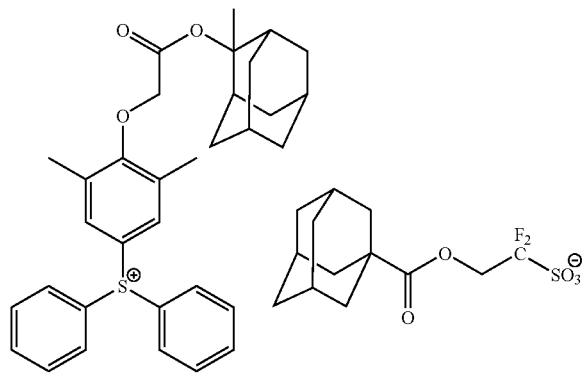

Using the resist composition obtained in example 3, a resist pattern was formed using the method described below, and the lithography properties of the resist film were then evaluated.

[Formation of Resist Pattern 1]

An organic antireflection film composition ARC29A (a product name, manufactured by Brewer Science Ltd.) was applied onto an 8-inch silicon wafer using a spinner, and the composition was then baked and dried on a hotplate at 205° C. for 60 seconds, thereby forming an organic antireflection film having a film thickness of 77 nm. Subsequently, the resist composition obtained in example 1 listed in Table 2 above was applied onto the antireflection film using a spinner, and was then prebaked (PAB) on a hotplate at 80° C. for 60 seconds and dried, thereby forming a resist film having a film thickness of 200 nm.

Subsequently, using an ArF immersion exposure apparatus NSR-5302 (manufactured by Nikon Corporation, NA (numerical aperture)=0.68, ⅔ annular illumination, the resist film was selectively irradiated with an ArF excimer laser (193 nm) through a mask (6% halftone) pattern targeting a hole resist pattern with a hole diameter of 170 nm and a pitch of 340 nm.

Next, a post exposure bake (PEB) treatment was conducted at 85° C. for 60 seconds, followed by development for 60 seconds at 23° C. in a 2.38% by weight aqueous solution of tetramethylammonium hydroxide (TMAH) NMD-3 (a product name, manufactured by Tokyo Ohka Kogyo Co., Ltd.). The resist film was then rinsed for 30 seconds with pure water, and dried by shaking.

As a result, a hole pattern with a hole diameter of 170 nm and a pitch of 340 nm was formed in the resist film.

[Formation of Resist Pattern 2]

Using a spinner, each of the positive resist compositions obtained in examples 1 to 7 and reference example 1 listed in Table 2 was applied onto an 8-inch silicon substrate that had been surface-treated with hexamethyldisilazane (HMDS), and a prebake (PAB) was then conducted on a hot plate at 90° C. for 60 seconds, thereby forming a resist film having a thickness of 100 nm.

This resist film was subjected to direct patterning with an electron beam lithography apparatus (product name: HL-800D, manufactured by Hitachi Ltd., accelerating voltage: 70 kV), and was then subjected to a post exposure bake treatment (PEB) at 85° C. for 60 seconds, followed by alkali development for 60 seconds at 23° C. in a 2.38% by weight aqueous solution of tetramethylammonium hydroxide (TMAH) NMD-3 (a product name, manufactured by Tokyo Ohka Kogyo Co., Ltd.). The resist film was then rinsed for 30 seconds with pure water, and dried by shaking, thus forming a 300 nm line and space (1:1) resist pattern (hereafter referred to as an "L/pattern").

[Sensitivity (Optimum Exposure Dose: Eop) and Resolution]

The optimum exposure dose Eop ($\mu C/cm^2$) at which an L/S pattern having a line width of 300 nm and a pitch of 600 nm was formed was determined, and the critical resolution (nm) at this Eop value was determined. The results are listed in Table 3.

[Pattern Shape]

Moreover, the resist pattern shape was evaluated by inspecting the cross-sectional shape of the L/S pattern using a measuring SEM (product name: S-9220, manufactured by Hitachi Ltd.). The results are shown in Table 3.

TABLE 3

|  | Eop ($\mu C/cm^2$) | Critical resolution (nm) | Resist pattern shape |
| --- | --- | --- | --- |
| Example 1 | 47 | 90 | rectangular |
| Example 2 | 45 | 90 | rectangular |
| Example 3 | 44 | 80 | rectangular |
| Example 4 | 38 | 80 | rectangular |
| Example 5 | 35 | 80 | rectangular |
| Example 6 | 32 | 80 | rectangular |
| Example 7 | 43 | 80 | rectangular |
| Reference example 1 | 62 | 100 | T-top shape |

From the results in Table 3 it was evident that, compared with the positive resist composition of reference example 1, all of the positive resist compositions according to the present invention from examples 1 to 7 were higher sensitivity positive resist compositions. Further, it was also confirmed that the positive resist compositions according to the present invention from examples 1 to 7 were able to form resist patterns having favorable resolution and superior resist pattern shape.

What is claimed is:

1. A positive resist composition, comprising a base component (A) which exhibits increased solubility in an alkali developing solution under action of acid, and an acid-generator component (B) which generates acid upon exposure, wherein said base component (A) comprises a polymeric compound (A1) containing a structural unit (a0) having an aromatic group, a structural unit (a5) represented by general formula (a5-1) shown below, and a structural unit (a1) containing an acid-dissociable, dissolution-inhibiting group:

[Chemical Formula 1]

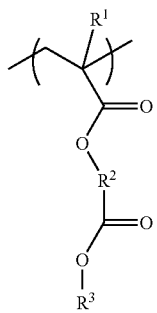

(a5-1)

wherein $R^1$ represents a hydrogen atom, an alkyl group of 1 to 5 carbon atoms or a halogenated alkyl group of 1 to 5 carbon atoms, $R^2$ represents a divalent linking group, and $R^3$ represents a cyclic group containing —$SO_2$— within a ring skeleton thereof.

2. The positive resist composition according to claim 1, wherein
said structural unit (a0) having an aromatic group is a structural unit represented by general formula (a0-1) shown below:

[Chemical Formula 2]

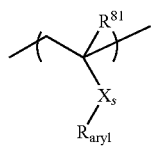

(a0-1)

wherein $R^{81}$ represents a hydrogen atom, an alkyl group of 1 to 5 carbon atoms or a halogenated alkyl group of 1 to 5 carbon atoms, $X_S$ represents a single bond or a divalent linking group, and $R_{aryl}$ represents an aromatic group which may have a substituent.

3. The positive resist composition according to claim 1, wherein $R^3$ represents a cyclic group containing —O—$SO_2$— within a ring skeleton thereof.

4. The positive resist composition according to claim 1, wherein $R^3$ is represented by general formula (5-1) shown below:

[Chemical Formula 3]

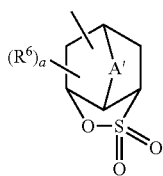

(5-1)

wherein A' represents an oxygen atom, a sulfur atom, or an alkylene group of 1 to 5 carbon atoms which may contain an oxygen atom or a sulfur atom, a represents an integer of 0 to 2, and $R^6$ represents an alkyl group, an alkoxy group, a halogenated alkyl group, a hydroxyl group, —COOR", —OC(=O)R", a hydroxyalkyl group or a cyano group, and R" represents a hydrogen atom or an alkyl group.

5. The positive resist composition according to claim 2, wherein $R_{aryl}$ is an aromatic group in which at least one hydrogen atom is substituted with a hydroxyl group or an alkylcarbonyloxy group.

6. The positive resist composition according to claim 1, further comprising a nitrogen-containing organic compound (D).

7. A method of forming a resist pattern, comprising: applying a positive resist composition according to claim 1 onto a substrate to form a resist film on said substrate, conducting exposure of said resist film, and alkali-developing said resist film to form a resist pattern.

8. A polymeric compound, comprising a structural unit (a0) having an aromatic group, a structural unit represented by general formula (a5-1) shown below, and a structural unit (a1) containing an acid-dissociable, dissolution-inhibiting group:

[Chemical Formula 4]

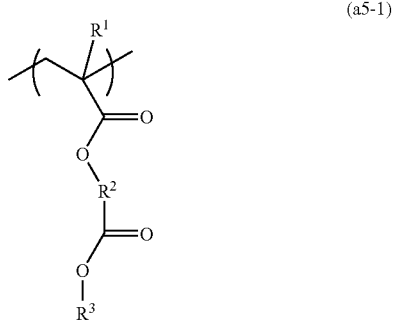

(a5-1)

wherein $R^1$ represents a hydrogen atom, an alkyl group of 1 to 5 carbon atoms or a halogenated alkyl group of 1 to 5 carbon atoms, $R^2$ represents a divalent linking group, and $R^3$ represents a cyclic group containing —$SO_2$— within a ring skeleton thereof.

9. The polymeric compound according to claim 8, wherein said structural unit (a0) having an aromatic group is a structural unit represented by general formula (a0-1) shown below:

[Chemical Formula 5]

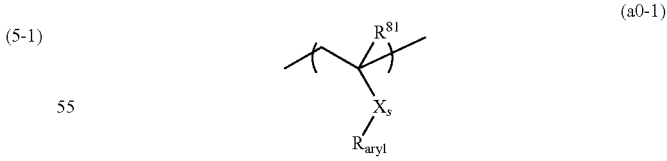

(a0-1)

wherein $R^{81}$ represents a hydrogen atom, an alkyl group of 1 to 5 carbon atoms or a halogenated alkyl group of 1 to 5 carbon atoms, $X_S$ represents a single bond or a divalent linking group, and $R_{aryl}$ represents an aromatic group which may have a substituent.

10. The polymeric compound according to claim 8, wherein $R^3$ represents a cyclic group containing —O—$SO_2$— within a ring skeleton thereof.

11. The polymeric compound according to claim 8, wherein $R^3$ is represented by general formula (5-1) shown below:

[Chemical Formula 6]

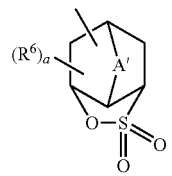

(5-1)

wherein A' represents an oxygen atom, a sulfur atom, or an alkylene group of 1 to 5 carbon atoms which may contain an oxygen atom or a sulfur atom, a represents an integer of 0 to 2, and $R^6$ represents an alkyl group, an alkoxy group, a halogenated alkyl group, a hydroxyl group, —COOR", —OC(=O)R", a hydroxyalkyl group or a cyano group, and R" represents a hydrogen atom or an alkyl group.

12. The polymeric compound according to claim 9, wherein $R_{aryl}$ is an aromatic group in which at least one hydrogen atom is substituted with a hydroxyl group or an alkylcarbonyloxy group.

* * * * *